(12) United States Patent
Iwabuchi et al.

(10) Patent No.: US 11,722,800 B2
(45) Date of Patent: *Aug. 8, 2023

(54) SEMICONDUCTOR IMAGE SENSOR MODULE AND METHOD OF MANUFACTURING THE SAME

(71) Applicant: Sony Group Corporation, Tokyo (JP)

(72) Inventors: Shin Iwabuchi, Kanagawa (JP); Makoto Motoyoshi, Kanagawa (JP)

(73) Assignee: Sony Group Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/545,591

(22) Filed: Dec. 8, 2021

(65) Prior Publication Data

US 2022/0124270 A1 Apr. 21, 2022

Related U.S. Application Data

(63) Continuation of application No. 16/863,383, filed on Apr. 30, 2020, now Pat. No. 11,228,728, which is a
(Continued)

(30) Foreign Application Priority Data

Jun. 2, 2005 (JP) .................................. 2005-163267
Jul. 6, 2005 (JP) .................................. 2005-197730

(51) Int. Cl.
*H04N 5/378* (2011.01)
*H01L 27/146* (2006.01)
(Continued)

(52) U.S. Cl.
CPC ........... *H04N 25/75* (2023.01); *H01L 23/481* (2013.01); *H01L 24/16* (2013.01); *H01L 25/18* (2013.01);
(Continued)

(58) Field of Classification Search
CPC ......... H01L 27/14625; H01L 27/14632; H01L 27/14627; H01L 27/14634; H01L 27/1469;
(Continued)

(56) References Cited

U.S. PATENT DOCUMENTS 4,831,453 A 5/1989 Takemura
5,191,405 A 3/1993 Tomita et al.
(Continued)

FOREIGN PATENT DOCUMENTS

JP H05-021772 A 1/1993
JP H06-282992 A 10/1994
(Continued)

OTHER PUBLICATIONS

Two Japanese Office Action dated Jan. 8, 2013 for related Japanese Application No. 2007-519068.
(Continued)

*Primary Examiner* — John R Lee
(74) *Attorney, Agent, or Firm* — Michael Best & Friedrich LLP

(57) ABSTRACT

A CMOS type semiconductor image sensor module wherein a pixel aperture ratio is improved, chip use efficiency is improved and furthermore, simultaneous shutter operation by all the pixels is made possible, and a method for manufacturing such semiconductor image sensor module are provided. The semiconductor image sensor module is provided by stacking a first semiconductor chip, which has an image sensor wherein a plurality of pixels composed of a photoelectric conversion element and a transistor are arranged, and a second semiconductor chip, which has an A/D converter array. Preferably, the semiconductor image sensor module is provided by stacking a third semiconductor chip having a memory element array. Furthermore, the
(Continued)

semiconductor image sensor module is provided by stacking the first semiconductor chip having the image sensor and a fourth semiconductor chip having an analog nonvolatile memory array.

9 Claims, 45 Drawing Sheets

Related U.S. Application Data continuation of application No. 15/464,959, filed on Mar. 21, 2017, now abandoned, which is a continuation of application No. 15/149,534, filed on May 9, 2016, now Pat. No. 10,594,972, which is a continuation of application No. 14/193,762, filed on Feb. 28, 2014, now Pat. No. 9,955,097, which is a continuation of application No. 11/915,958, filed as application No. PCT/JP2006/311007 on Jun. 1, 2006, now Pat. No. 8,946,610.

(51) Int. Cl.

| | | |
|---|---|---|
| *H01L 23/00* | (2006.01) | |
| *H01L 23/48* | (2006.01) | |
| *H01L 25/18* | (2023.01) | |
| *H04N 5/225* | (2006.01) | |
| *H04N 5/369* | (2011.01) | |
| *H04N 5/374* | (2011.01) | |
| *H04N 25/75* | (2023.01) | |
| *H04N 23/54* | (2023.01) | |
| *H04N 25/76* | (2023.01) | |
| *H04N 25/79* | (2023.01) | |
| H01L 29/788 | (2006.01) | |
| H01L 29/792 | (2006.01) | |
| H10B 69/00 | (2023.01) | |

(52) U.S. Cl.
CPC ...... *H01L 27/1464* (2013.01); *H01L 27/1469* (2013.01); *H01L 27/14607* (2013.01); *H01L 27/14612* (2013.01); *H01L 27/14625* (2013.01); *H01L 27/14627* (2013.01); *H01L 27/14632* (2013.01); *H01L 27/14634* (2013.01); *H01L 27/14636* (2013.01); *H01L 27/14638* (2013.01); *H01L 27/14643* (2013.01); *H01L 27/14689* (2013.01); *H04N 23/54* (2023.01); *H04N 25/76* (2023.01); *H04N 25/79* (2023.01); H01L 29/788 (2013.01); H01L 29/792 (2013.01); H01L 2224/0401 (2013.01); H01L 2224/0557 (2013.01); H01L 2224/05552 (2013.01); H01L 2224/05554 (2013.01); H01L 2224/13 (2013.01); H01L 2224/13025 (2013.01); H01L 2224/16145 (2013.01); H01L 2224/16237 (2013.01); H01L 2924/0002 (2013.01); H01L 2924/00014 (2013.01); H01L 2924/13091 (2013.01); H01L 2924/1425 (2013.01); H01L 2924/1436 (2013.01); H01L 2924/1437 (2013.01); H01L 2924/1443 (2013.01); H10B 69/00 (2023.02)

(58) Field of Classification Search
CPC ... H01L 27/115; H01L 23/481; H01L 29/788; H01L 29/792; H01L 2224/13; H01L 2224/13025; H01L 2224/16237; H01L 2224/16145; H01L 24/16; H01L 24/18; H01L 27/14612; H01L 27/14636; H01L 27/1464; H01L 27/14643; H01L 2924/1425; H01L 2924/1436; H01L 2924/1437; H01L 2924/1443; H01L 27/14607; H01L 27/14638; H01L 27/14664; H01L 27/14689; H01L 2224/0401; H01L 2224/05552; H01L 2224/05554; H01L 2224/0557; H01L 2924/00014; H01L 2924/0002; H01L 2924/13091; H04N 5/374; H04N 5/378; H04N 5/379; H04N 5/2253

See application file for complete search history.

(56) References Cited

U.S. PATENT DOCUMENTS

| | | | |
|---|---|---|---|
| 5,198,888 | A | 3/1993 | Sugano et al. |
| 5,313,096 | A | 5/1994 | Eide |
| 5,438,224 | A | 8/1995 | Papageorge et al. |
| 5,461,425 | A | 10/1995 | Fowler et al. |
| 5,665,959 | A | 9/1997 | Fossum et al. |
| 5,801,657 | A | 9/1998 | Fowler et al. |
| 5,952,646 | A | 9/1999 | Spartiotis et al. |
| 6,057,539 | A | 5/2000 | Zhou et al. |
| 6,172,418 | B1 | 1/2001 | Iwase |
| 6,229,133 | B1 | 5/2001 | Hynecek |
| 6,356,029 | B1 | 3/2002 | Hunter |
| 6,362,767 | B1 | 3/2002 | Yang et al. |
| 6,380,880 | B1 | 4/2002 | Bidermann |
| 6,462,412 | B2 | 10/2002 | Kamei et al. |
| 6,518,909 | B1 | 2/2003 | Yang et al. |
| 6,552,745 | B1 | 4/2003 | Perner |
| 6,618,117 | B2 | 9/2003 | Silverbrook |
| 6,646,363 | B2 | 11/2003 | Kylander et al. |
| 6,693,670 | B1 | 2/2004 | Stark |
| 6,717,251 | B2 | 4/2004 | Matsuo et al. |
| 6,778,212 | B1 | 8/2004 | Deng et al. |
| 6,788,237 | B1 | 9/2004 | Bidermann et al. |
| 6,788,240 | B2 | 9/2004 | Reyneri et al. |
| 6,791,611 | B2 | 9/2004 | Yang |
| 6,809,769 | B1 | 10/2004 | Yang |
| 6,831,684 | B1 | 12/2004 | Ewedemi et al. |
| 6,838,651 | B1 | 1/2005 | Mann |
| 6,847,399 | B1 | 1/2005 | Ang |
| 6,917,090 | B2 | 7/2005 | Moden |
| 6,948,794 | B2 | 9/2005 | Silverbrook |
| 6,970,195 | B1 | 11/2005 | Bidermann et al. |
| 6,975,355 | B1 | 12/2005 | Yang et al. |
| 6,985,169 | B1 | 1/2006 | Deng et al. |
| 6,985,181 | B2 | 1/2006 | Ewedemi et al. |
| 6,989,589 | B2 | 1/2006 | Hammadou et al. |
| 7,027,092 | B2 | 4/2006 | Altree |
| 7,045,835 | B2 | 5/2006 | Layman et al. |
| 7,060,592 | B2 | 6/2006 | Pan et al. |
| 7,095,355 | B1 | 8/2006 | Graham et al. |
| 7,129,978 | B1 | 10/2006 | Brehmer et al. |
| 7,312,845 | B2 | 12/2007 | Silverbrook |
| 7,315,273 | B2 | 1/2008 | Muramatsu et al. |
| 7,336,808 | B2 | 2/2008 | Mizuno et al. |
| 7,361,989 | B1 | 4/2008 | Adkisson et al. |
| 7,551,201 | B2 | 6/2009 | Silverbrook |
| 7,564,433 | B2 | 7/2009 | Hector et al. |
| 7,589,707 | B2 | 9/2009 | Chou |
| 7,623,173 | B2 | 11/2009 | Nitta et al. |
| 7,646,363 | B2 | 1/2010 | Yamashita et al. |
| 7,659,872 | B2 | 2/2010 | Yamashita et al. |
| 7,671,313 | B2 | 3/2010 | Watanabe |
| 7,671,914 | B2 | 3/2010 | Ang |
| 7,688,292 | B2 | 3/2010 | Park et al. |
| 7,868,880 | B2 | 1/2011 | Ozaki et al. |
| 8,144,227 | B2 | 3/2012 | Kobayashi |
| 8,179,296 | B2 | 5/2012 | Kelly et al. |
| 8,217,878 | B2 | 7/2012 | Yamashita et al. |
| 8,946,610 | B2 | 2/2015 | Iwabuchi et al. |
| 9,955,097 | B2 | 4/2018 | Iwabuchi et al. |
| 10,115,649 | B1 | 10/2018 | Motoyoshi |
| 10,115,695 | B1 | 10/2018 | Motoyoshi |
| 10,129,497 | B2 | 11/2018 | Iwabuchi et al. |
| 10,453,885 | B2 | 10/2019 | Iwabuchi et al. |

(56) References Cited

U.S. PATENT DOCUMENTS

| | | | |
|---|---|---|---|
| 10,468,365 B2 | 11/2019 | Kishihara et al. | |
| 10,529,764 B2 | 1/2020 | Kobayashi et al. | |
| 10,594,972 B2 | 3/2020 | Iwabuchi et al. | |
| 10,645,324 B2 | 5/2020 | Iwabuchi et al. | |
| 11,228,728 B2* | 1/2022 | Iwabuchi | H01L 27/14689 |
| 2001/0005059 A1 | 6/2001 | Koyanagi et al. | |
| 2002/0031006 A1 | 3/2002 | Arimoto et al. | |
| 2002/0036338 A1 | 3/2002 | Matsuo et al. | |
| 2002/0074637 A1 | 6/2002 | McFarland | |
| 2003/0049925 A1 | 3/2003 | Layman et al. | |
| 2003/0197238 A1 | 10/2003 | Park | |
| 2004/0000630 A1 | 1/2004 | Spartiotis et al. | |
| 2004/0034457 A1 | 2/2004 | Stam et al. | |
| 2004/0041927 A1 | 3/2004 | Cho et al. | |
| 2004/0095495 A1 | 5/2004 | Inokuma et al. | |
| 2004/0197954 A1 | 10/2004 | Moden | |
| 2004/0246209 A1 | 12/2004 | Sung | |
| 2005/0083270 A1 | 4/2005 | Miyazawa | |
| 2005/0269959 A1 | 12/2005 | Uchino et al. | |
| 2005/0279916 A1 | 12/2005 | Kang et al. | |
| 2005/0280728 A1 | 12/2005 | Ishikawa et al. | |
| 2006/0023109 A1 | 2/2006 | Mabuchi et al. | |
| 2006/0091290 A1 | 5/2006 | Yoshihara et al. | |
| 2006/0243885 A1 | 11/2006 | Watanabe | |
| 2007/0075888 A1 | 4/2007 | Kelly et al. | |
| 2008/0088014 A1 | 4/2008 | Adkisson et al. | |
| 2010/0276572 A1 | 11/2010 | Iwabuchi et al. | |
| 2012/0206329 A1 | 8/2012 | Chen | |
| 2014/0175592 A1 | 6/2014 | Iwabuchi et al. | |
| 2016/0255296 A1 | 9/2016 | Iwabuchi et al. | |
| 2017/0187977 A1 | 6/2017 | Iwabuchi et al. | |
| 2017/0195602 A1 | 7/2017 | Iwabuchi et al. | |
| 2018/0054583 A1 | 2/2018 | Iwabuchi et al. | |
| 2018/0247966 A1 | 8/2018 | Iwabuchi et al. | |
| 2018/0315677 A1 | 11/2018 | Motoyoshi | |
| 2018/0315727 A1 | 11/2018 | Motoyoshi | |
| 2018/0331060 A1 | 11/2018 | Kishihara et al. | |
| 2020/0111830 A1 | 4/2020 | Kobayashi et al. | |
| 2020/0350346 A1 | 11/2020 | Ohura et al. | |
| 2021/0021776 A1 | 1/2021 | Iwabuchi et al. | |
| 2022/0124270 A1* | 4/2022 | Iwabuchi | H01L 23/481 |

FOREIGN PATENT DOCUMENTS

| | | |
|---|---|---|
| JP | H08-340100 A | 12/1996 |
| JP | H09-204796 A | 8/1997 |
| JP | 10-256515 A | 9/1998 |
| JP | 11-066887 | 3/1999 |
| JP | 11-298797 A | 10/1999 |
| JP | 11-341347 A | 12/1999 |
| JP | 2000-032329 A | 1/2000 |
| JP | 2000-149588 A | 5/2000 |
| JP | 2000-513518 A | 10/2000 |
| JP | 2000-315774 A | 11/2000 |
| JP | 2001-045383 A | 2/2001 |
| JP | 2001-309240 A | 11/2001 |
| JP | 2001-339057 A | 12/2001 |
| JP | 2002-043444 A | 2/2002 |
| JP | 2003-023573 A | 1/2003 |
| JP | 2003-031785 A | 1/2003 |
| JP | 2003-255856 A | 9/2003 |
| JP | 2003-271095 A | 9/2003 |
| JP | 2003-338615 A | 11/2003 |
| JP | 2004-029791 A | 1/2004 |
| JP | 2004-064410 A | 2/2004 |
| JP | 2004-093682 A | 3/2004 |
| JP | 2004-133240 A | 4/2004 |
| JP | 2004-355670 A | 12/2004 |
| JP | 2004-357261 A | 12/2004 |
| JP | 2006-191081 A | 7/2006 |

OTHER PUBLICATIONS

Yomemoto Kazuya; Base and application of CCD/CMOS image sensor; pp. 179-180; CD Shuppan Kabushikigaisha; Aug. 10, 2003 published.

International Search Report dated Sep. 5, 2006.

Japanese Office Action dated May 12, 2015, for corresponding Japanese Application No. 2014-110598.

Korean Office Action dated Sep. 26, 2014, for corresponding Korean Application No. 10-2007-7030910.

Korean Office Action dated Mar. 12, 2014, for corresponding Korean Application No. 10-2007-7030910.

Japanese Office Action dated Apr. 1, 2014 for corresponding Japanese Application No. 2013-080077.

Kurino, H., et al., "Intelligent Image Sensor Chip with Three Dimensional Structure" Technical Digest, International Electron Devices Meeting 1999, Dec. 5, 1999, pp. 879-882.

Koyanagi et al., Machine Translation of JP 2001-339057; application publication date: Dec. 7, 2001; translation obtained Dec. 12, 2019. (Year: 2019).

* cited by examiner

②Add Voltage Pulse to Sense Line Such That Voltage of Threshold or More is Applied to Memory Element ②Add Voltage Pulse to Sense Line Such That Voltage of Threshold or More is Applied to Memory Element CCD Image Sensor CMOS Image Sensor

SEMICONDUCTOR IMAGE SENSOR MODULE AND METHOD OF MANUFACTURING THE SAME

CROSS REFERENCES TO RELATED APPLICATIONS

The present application is a Continuation of U.S. patent application Ser. No. 16/863,383, filed Apr. 30, 2020, which is a Continuation of U.S. patent application Ser. No. 15/464,959, filed Mar. 21, 2017, which is a Continuation of U.S. patent application Ser. No. 15/149,534, filed May 9, 2016, now U.S. Pat. No. 10,594,972, issued Mar. 17, 2020, which is a Continuation of U.S. patent application Ser. No. 14/193,762, filed Feb. 28, 2014, which is a Continuation of U.S. patent application Ser. No. 11/915,958, filed Jul. 26, 2010, now U.S. Pat. No. 8,946,610, issued Feb. 3, 2015, which is a 371 of International Application Number PCT/JP2006/311007, filed on Jun. 1, 2006, which claims priority from Japanese Patent Application JP2005-163267, filed Jun. 2, 2005 and Japanese Patent Application JP2005-197730, filed Jul. 6, 2005, the entire contents of which being incorporated herein by reference.

TECHNICAL FIELD

The present invention relates to a semiconductor image sensor module and a method of manufacturing the same. In more detail, it relates to a semiconductor image sensor module which realizes simultaneous shuttering meeting speeding up of the shutter speed of, for example, a digital still camera, a video camera, a mobile phone with a camera or the like.

BACKGROUND ART

Since a CMOS image sensor operates with a single power supply in low power consumption as compared with a CCD image sensor and can be manufactured by a standard CMOS process, there is an advantage that a system on chip is easy. In recent years, a CMOS image sensor has started to be used based on this advantage even in a high-grade single lens reflex type digital still camera and a mobile phone.

In FIG. 54 and FIG. 55, simplified constitutions of a CCD image sensor and a CMOS image sensor are shown respectively.

A CCD image sensor 1 shown in FIG. 54 is formed in a constitution that a plurality of light receiving sensors (photoelectric conversion elements) 3 which become pixels are arranged regularly in an imaging region 2, for example, in a two dimensional matrix form and at the same time, vertical transfer registers 4 of a CCD structure which transfer signal charges in the vertical direction are arranged corresponding to respective light receiving sensor columns, further, a horizontal transfer register 5 of a CCD structure which is connected with respective vertical transfer registers 4 and which transfers signal charges in the horizontal direction is arranged, and an output unit 6 converting charge voltages to voltage signals and outputting the voltage signals is connected at the final stage of this horizontal transfer register 5. In this CCD image sensor 1, light received by the imaging region 2 is converted to signal charges in respective light receiving sensors 3 and is accumulated, and the signal charges of these respective light receiving sensors 3 are read out to the vertical transfer registers 4 through a readout gate portion 7 and are transferred in the vertical direction. Also, signal charges read out from the vertical transfer registers 4 to the horizontal transfer register 5 on a line-to-line basis are transferred in the horizontal direction, converted to voltage signals by the output unit 6, and outputted as image signals.

On the other hand, a CMOS image sensor 11 shown in FIG. 55 is constituted by being provided with an imaging region 13 in which a plurality of pixels 12 are arranged, a control circuit 14, a vertical drive circuit 15, a column unit 16, a horizontal drive circuit 17, and an output circuit 18. In the imaging region 13, a plurality of pixels 12 are regularly arranged two dimensionally, for example, in a two dimensional matrix form. Each pixel 12 is formed by a photoelectric conversion element (for example, photodiode) and a plurality of MOS transistors. The control circuit 14 receives an input clock, and data for instructing an operation mode or the like, and also outputs data including information of the image sensor.

In this CMOS image sensor 11, a line of pixels 12 is selected by a drive pulse from the vertical drive circuit 15, and outputs of the pixels 12 of the selected line are transmitted to the column unit 16 through vertical selection lines 21. In the column unit 16, column signal processing circuits 19 are arranged corresponding to the columns of pixels and receive signals of the pixels 12 for one line, and processes such as CDS (Correlated Double Sampling: process for eliminating fixed pattern noise), signal amplification, analog/digital (AD) conversion or the like are applied to the signals. Then, the column signal processing circuits 19 are sequentially selected by the horizontal drive circuit 17, and signals thereof are introduced to a horizontal signal line 20 and are outputted from the output circuit 18 as image signals.

There are shown, in FIGS. 56A and 56B, accumulation timing charts of pixel lines corresponding to respective scanning lines of the CCD image sensor 1 and the CMOS image sensor 11. In the case of the CCD image sensor 1, signal charges are accumulated in respective light receiving sensors 3 during the same period, and the signal charges are read out from the light receiving sensors 3 to the vertical transfer register 4 for all the pixels simultaneously. More specifically, as shown in FIG. 56A, signal charges of the pixels of all the lines are accumulated at the same time instant during an accumulation period of a certain frame. Thereby, simultaneity of accumulation is obtained, and simultaneous electronic shuttering is made possible.

On the other hand, in the case of the CMOS image sensor 11, due to its fundamental operation method, the pixel 12 which has outputted a signal starts accumulation of a photoelectrically converted signal again from that time point, so that as shown in FIG. 56B, accumulation periods are shifted in accordance with scanning timings in a certain frame period. Owing to this fact, simultaneity of accumulation is not obtained, and simultaneous electronic shuttering cannot be obtained. More specifically, in the CMOS image sensor 11, because a vertical transfer register which delays the transfer timing as in the case of the CCD image sensor is not provided, timing for transmitting data to the column signal processing circuit is adjusted by adjusting the pixel accumulation period in accordance with the reset timing. For this reason, it is necessary to shift accumulation periods of signal charges, and a simultaneous shutter configuration to perform charge accumulation of all the pixels at the same timing cannot be realized (see page 179 of Non-patent Document 1).

In particular, this difference comes out when imaging a moving picture at a high speed. FIGS. 57A and 57B show recorded pictures when a fan rotating at a high speed is recorded with a CCD image sensor and a CMOS image sensor. As can be appreciated from the same drawings, a fan 25 recorded by the CCD image sensor is recorded normally, but the fan 25 recorded by the CMOS image sensor is recorded distorted in its shape (see page 180 of Non-patent Document 1).

[Non-patent Document 1] [Basic and Application of CCD/CMOS Image Sensor] by Kazuya Yonemoto, published from CQ Publishing Kabushiki-kaisha on Aug. 10, 2003, pages 179 to 180

As a countermeasure for imaging a picture moving at a high speed in the above-mentioned CMOS image sensor, there has been proposed a constitution shown in FIG. 52 and FIG. 53. This CMOS image sensor 31 is a one applied to a front-illuminated type CMOS image sensor, and as shown in a plane block layout of FIG. 52, it is constituted by forming in a necessary region of one semiconductor chip, an imaging region, a so-called photodiode PD/sensor circuit region 32, in which pixels, each of which is composed of a photodiode as a photoelectric conversion element and a plurality of MOS transistors, are arranged, and an ADC/memory region 33 in which a plurality of analog/digital (AD) conversion circuits connected with respective pixels and memory means are arranged, adjacent to this photodiode PD-sensor circuit region 32.

There is shown in FIG. 53 a cross section structure of a unit pixel of the CMOS image sensor 31. In this example, it is constituted as a front-illuminated type by forming a p-type semiconductor well region 36 in an n-type semiconductor substrate 35; a unit pixel 38 composed of a photodiode PD and a plurality of MOS transistors Tr in a p-type semiconductor well region 36 of each region which is partitioned by a pixel separation region 37; a multilayer wiring layer 39 in which multilayers, for example, a first layer wiring 441, a second layer wiring 442, and a third layer wiring 443 are formed, on the substrate front face side, through an interlayer insulation film 43; and further a color filter 41 and an on-chip microlens 42 on the multiplayer wiring layer 39. The photodiode PD is constituted by a buried type photodiode having an n-type semiconductor region 46, and a p+ semiconductor region 47 that becomes an accumulation layer on the front face. Although not shown, it is possible to make the MOS transistors Tr constituting a pixel, for example, as a 3 transistor structure including a readout transistor, a reset transistor, and an amplifier transistor, or a 4 transistor structure in which a vertical selection transistor is further added.

In this CMOS image sensor 31, it is constituted such that after photoelectric conversion is carried out by the photodiode, analog/digital conversion is carried out at once and simultaneously, and the signal is held in the memory means as data, and thereafter, the data is read out from the memory means sequentially. In this constitution, because the signal which has been analog-to-digital converted is once held in the memory means and thereafter signal processing is carried out, simultaneous shuttering is made possible.

However, in the CMOS image sensor having the constitution of FIG. 52, the photodiode PD-sensor circuit region 32 and the ADC-memory region 33 are included in a single semiconductor chip, so that when the number of pixels is increased to achieve high resolution, the opening area of a unit pixel, that is, a minute pixel, becomes small, and high sensitivity cannot not be obtained. Then, chip use efficiency is inferior and the area of a chip is increased, so that cost increase cannot be avoided.

DISCLOSURE OF THE INVENTION

The present invention is to provide a CMOS type semiconductor image sensor module in which the aperture ratio of a pixel is improved and at the same time, improvement of chip use efficiency is attempted and furthermore, simultaneous shuttering of all the pixels is made possible, and a method of manufacturing the same.

A semiconductor image sensor module according to the present invention is characterized by being formed by laminating a first semiconductor chip including an image sensor in which a plurality of pixels are arranged regularly and each of the pixels is constituted by a photoelectric conversion element and transistors and a second semiconductor chip including an analog/digital converter array composed of a plurality of analog/digital converters.

A preferable mode of the present invention has a constitution in the aforesaid semiconductor image sensor module that a third semiconductor chip including a memory element array provided with at least a decoder and a sense amplifier is further laminated.

A preferable mode of the present invention has a constitution that the first and second semiconductor chips are arranged close to the third semiconductor chip such that a plurality of photoelectric conversion elements and a plurality of memory elements share one analog/digital converter.

It is possible to constitute the memory element by a volatile memory, a floating gate type nonvolatile memory, an MONOS type nonvolatile memory, a multivalued nonvolatile memory or the like.

It is possible to configure the memory element array to have a memory bit for parity check. It is possible to configure the memory element array to have a constitution that a spare bit for relieving a defect is included.

A semiconductor image sensor module according to the present invention is characterized by being formed by laminating a first semiconductor chip including an image sensor in which a plurality of pixels are arranged regularly and each of the pixels is constituted by a photoelectric conversion element and transistors, and a fourth semiconductor chip including an analog type nonvolatile memory array composed of a plurality of analog type nonvolatile memories, and in that an amount of information corresponding to an amount of accumulated electric charge is stored by the analog type nonvolatile memory.

A manufacturing method of a semiconductor image sensor module according to the present invention is characterized by including the steps of: forming a first semiconductor chip provided with an image sensor in which a plurality of pixels, each of which is constituted by a photoelectric conversion element and transistors, are regularly arranged two-dimensionally; forming a second semiconductor chip provided with an analog/digital converter array which is composed of a plurality of analog/digital converters; and laminating the first semiconductor chip and the second semiconductor chip and connecting the pixels of aforesaid image sensor and the analog/digital converters. In this connection process, the pixels of the image sensor of the first semiconductor chip and the analog/digital converters of the second semiconductor chip are bonded by means of bumps with the analogue/digital converters faced downward or connected by means of through-holes which pass through a wafer vertically with respect to an LSI chip surface.

A preferable mode of a manufacturing method of a semiconductor image sensor module according to the present invention includes in the aforementioned manufacturing method of a semiconductor image sensor module, a process for forming a third semiconductor chip provided with a memory element array which includes at least a decoder and a sense amplifier; and a process for laminating the first semiconductor chip, the second semiconductor chip, and the third semiconductor chip and connecting the pixels of the image sensor with the memory through the analog/digital converters. In this connection process, the pixels of the image sensor of the first semiconductor chip are connected with the memory of the third semiconductor chip through the analog/digital converters of the second semiconductor chip by means of through-holes passing through the wafer vertically with respect to the wafer face.

A manufacturing method of a semiconductor image sensor module according to the present invention is characterized by including: a process for forming a first semiconductor chip provided with an image sensor in which a plurality of pixels, each of which is constituted by a photoelectric conversion element and transistors, are regularly arranged two-dimensionally; a process for forming a fourth semiconductor chip provided with an analog nonvolatile memory array composed of a plurality of analog type nonvolatile memories; and a process for laminating the first semiconductor chip and the fourth semiconductor chip and connecting the pixels of the image sensor and the analog type nonvolatile memories.

According to a semiconductor image sensor module of the present invention, a first semiconductor chip provided with an image sensor in which a pixel is constituted by a photoelectric conversion element and transistors and a second semiconductor chip provided with an analog/digital converter array which is composed of a plurality of analog/digital converters are laminated to constitute the semiconductor image sensor module, so that in the first semiconductor chip, a large portion thereof can be formed as a pixel region and therefore, the aperture ratio of the photoelectric conversion element is improved and also, it is possible to improve chip utilization. Also, by providing a semiconductor chip which includes a memory element array composed of a plurality of memory elements, the pixel signals from the first semiconductor chip can be signal-processed after carrying out analog/digital conversion in the second semiconductor chip in a short period and once storing the signals in the memory element array, so that it is possible to realize simultaneous shuttering of the pixels.

By configuring a first semiconductor chip provided with an image sensor in which the pixel is constituted by a photoelectric conversion element and transistors, a second semiconductor chip provided with an analog/digital converter array which is composed of a plurality of analog/digital converters, and further a third semiconductor chip provided with a memory element array which includes at least a decoder and a sense amplifier, in a laminated structure, one unified device is obtained, and it is possible to realize improvement of the aperture ratio of the photoelectric conversion element, improvement of chip utilization, and further simultaneous shuttering of all the pixels.

By employing a constitution that the first and third semiconductor chips are arranged close to the second semiconductor chip such that a plurality of photoelectric conversion elements and a plurality of memory elements share one analog/digital converter, the signals from the plurality of photoelectric conversion elements can be analog-to-digital converted serially in the analog/digital converter and can be held in the memory elements in a short period, and it is possible to execute simultaneous shuttering of all the pixels.

According to a semiconductor image sensor module of the present invention, by employing a constitution that a first semiconductor chip provided with an image sensor in which a pixel is constituted by a photoelectric conversion element and transistors and a fourth semiconductor chip provided with an analog type nonvolatile memory array are laminated, in the first semiconductor chip, a large portion thereof can be formed as a pixel region, so that the aperture ratio of the photoelectric conversion element is improved and also, it is possible to improve chip utilization. In addition, because the pixel signals from the first semiconductor chip are signal-processed after having been held once in the analog type nonvolatile memory cell, it is possible to realize simultaneous shuttering of the pixels.

According to a manufacturing method of a semiconductor image sensor module of the present invention, it is possible to manufacture a semiconductor image sensor module provided with a CMOS image sensor in which it is possible to realize improvement of the aperture ratio of the photoelectric conversion element, improvement of chip utilization, and further simultaneous shuttering of all the pixels.

BEST MODE FOR CARRYING OUT THE INVENTION

Figure 1:
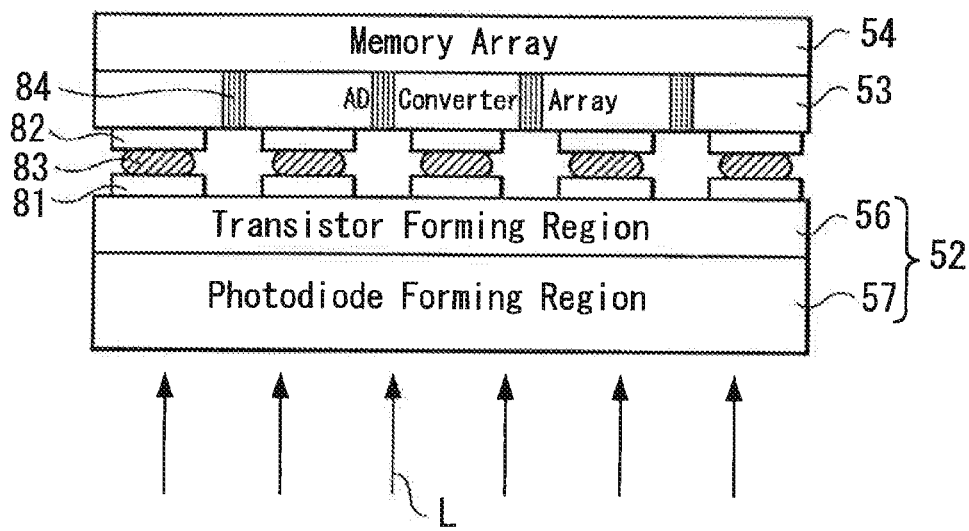
FIG. 1 is an outlined constitution diagram showing a first exemplified embodiment of a semiconductor image sensor module according to the present invention.

Hereinafter, exemplified embodiments of the present invention will be explained with reference to the drawings FIG. 1 shows a general constitution of a first exemplified embodiment of a semiconductor image sensor module according to the present invention. A semiconductor image sensor module 51 according to the exemplified embodiment of the present invention is constituted by laminating a first semiconductor chip 52 provided with an image sensor in which a plurality of pixels are arranged regularly and each of the pixels is constituted by a photodiode as a photoelectric conversion element and a transistor, a second semiconductor chip 53 provided with an analog/digital converter array composed of a plurality of analog/digital converters (a so-called analog/digital conversion circuit), and a third semiconductor chip 54 provided with a memory element array including at least a decoder and a sense amplifier.

The image sensor of the first semiconductor chip 52 in this example is constituted by a so-called back-illuminated type CMOS image sensor in which a transistor forming region 56, in which transistors constituting a unit pixel are formed, is formed on the chip front face side, and a photodiode forming region 57 having an incidence plane where light L enters and in which a plurality of photodiodes which become a plurality of photoelectric conversion elements are regularly arranged two dimensionally, for example, in a two dimensional matrix form, is formed on the chip rear face side.

Figure 2:
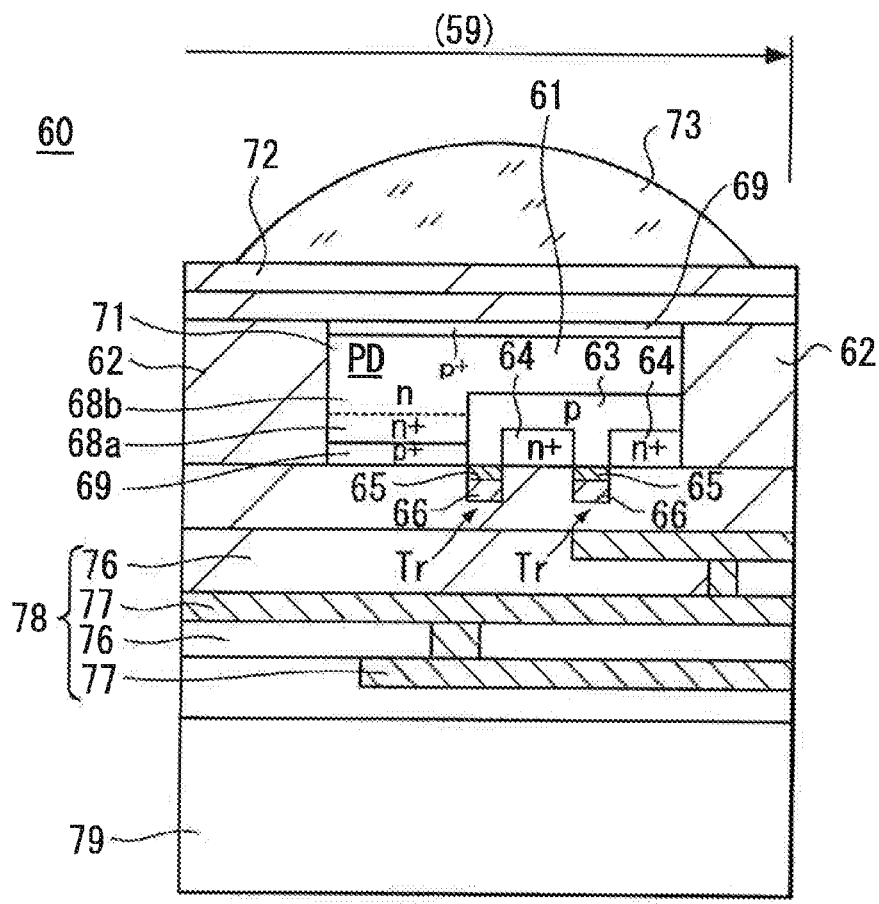
FIG. 2 is a cross-section diagram of a main portion of a back-illuminated type CMOS image sensor applied to the present invention.

There is shown in FIG. 2 an example of a unit pixel of a back-illuminated type CMOS image sensor. In the back-illuminated type CMOS image sensor 60 of this example, pixel separation regions 62 are formed in an imaging region 59 of a thinned semiconductor substrate, for example, an n-type silicon substrate 61, and a plurality of MOS transistors Tr, each of which is composed of an n-type source-drain region 64, a gate insulation film 65, and a gate electrode 66, are formed in a p-type semiconductor well region 63 of each pixel region partitioned by the pixel separation regions 62. These MOS transistors Tr are so-called sensor transistors by means of an amplifier transistor, a transistor for XY selection switching and the like, and are formed on the substrate front face side. The plurality of transistors Tr may be constituted by, for example, 3 transistors, i.e., a readout transistor having a source-drain region, which becomes a floating diffusion region FD, a reset transistor, and an amplifier transistor, or 4 transistors, i.e., the aforementioned 3 transistors and a vertical selection transistor. On the substrate front face side, there is formed a multilayer wiring layer 78 in which multilayer wirings 77 are formed through interlayer insulation films 76. Further, a support substrate 79 for reinforcement, for example, by means of a silicon substrate or the like, is joined on the multilayer wiring layer 78.

The photodiode PD is formed by an n+ charge accumulation region 68*a*, an n-type semiconductor region 68*b*, and p+ semiconductor regions 69 which become accumulation layers formed on both the front and rear faces of the substrate for suppressing dark current. Then, a color filter 72 is formed on the substrate rear face side through a passivation film 71, and further, an on chip microlens 73 corresponding to each pixel is formed on the color filter 72. This imaging region 59 becomes a so-called photodiode PD-sensor circuit region.

On the other hand, with respect to the second semiconductor chip 53, a plurality of analog/digital converter arrays each of which is composed of a plurality of analog/digital converters are arranged two dimensionally.

In the third semiconductor chip 54, there is formed thereon a memory array in which memory element sub-arrays composed of a plurality of memory elements are arranged two dimensionally. The memory element sub-array is constituted including a decoder and a sense amplifier. Each memory element sub-array is formed as a memory array block composed of a plurality of memory elements and including a decoder and sense amplifier, so as to correspond to each pixel array block in which, as described later, a plurality of pixels are assembled as a group.

For the memory element, it is possible to use, for example, a volatile memory, which is represented by a DRAM or a SRAM, a floating gate type nonvolatile memory, an MONOS type nonvolatile memory or the like.

Figure 4:
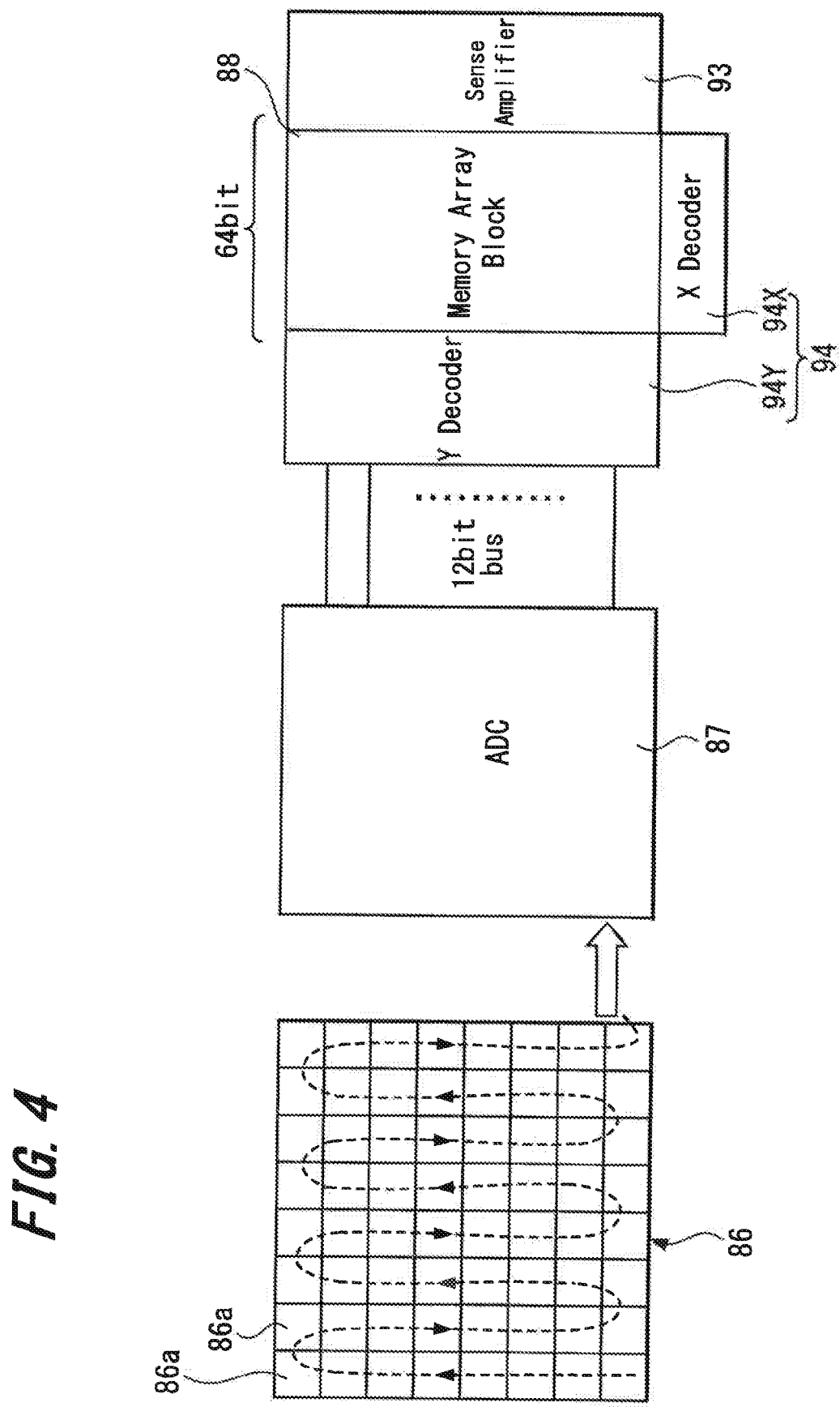
FIG. 4 is a block constitution diagram used for explanation of data transfer of the first exemplified embodiment.
Figure 5:
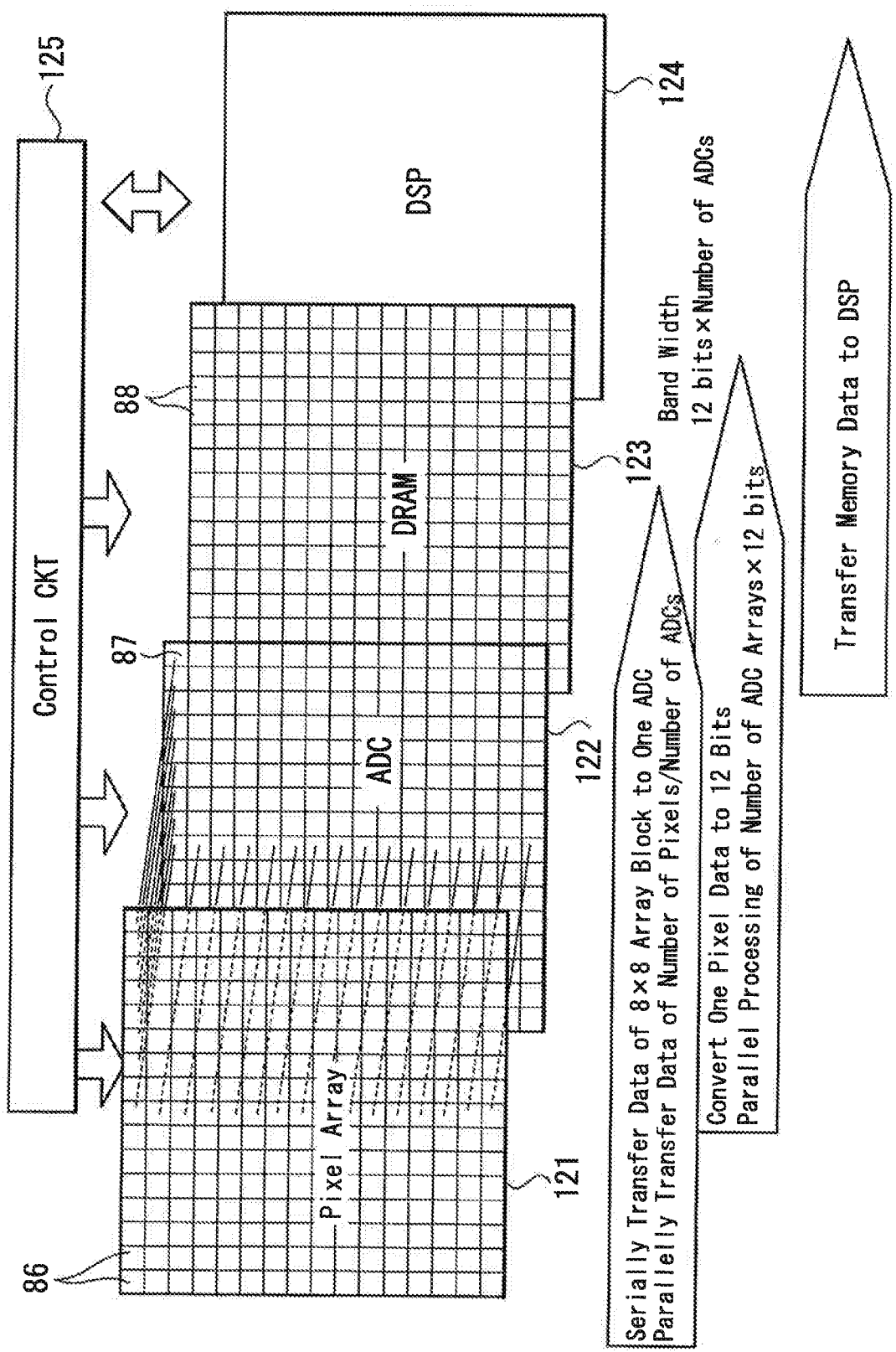
FIG. 5 is a whole block diagram of the first exemplified embodiment.
Figure 18:
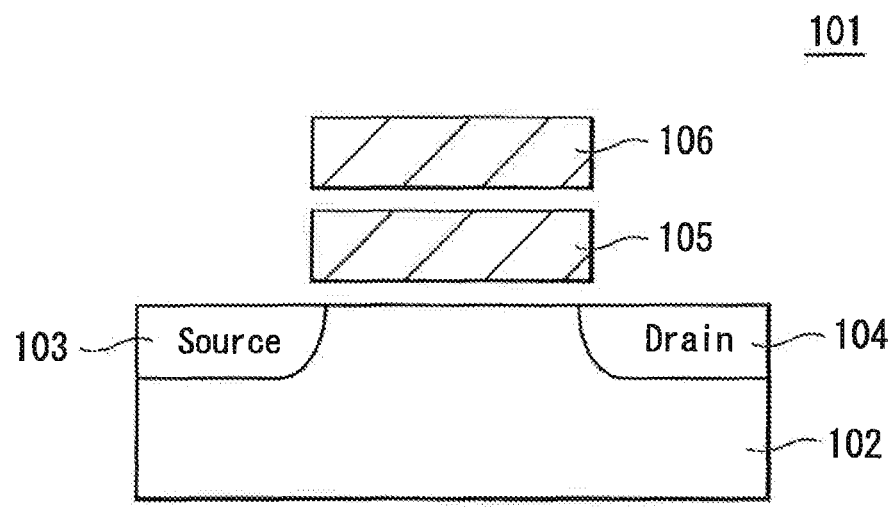
FIG. 18 is an outlined constitution diagram of a floating gate type nonvolatile memory.
Figure 19:
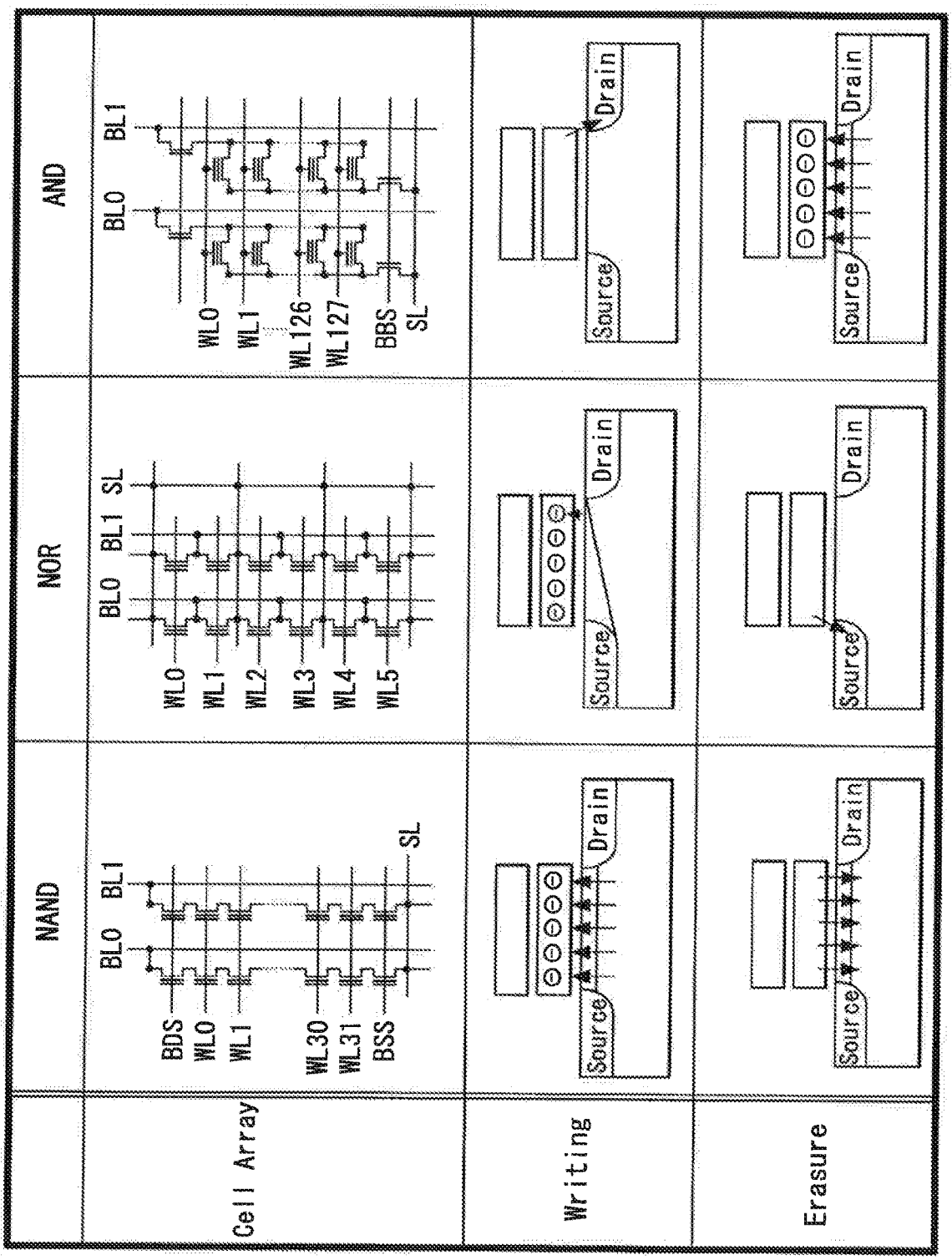
FIG. 19 is an explanatory diagram for explaining a cell array connection wiring, a writing operation and an erasing operation of a representative floating gate type nonvolatile memory.

There is shown in FIG. 18 and FIG. 19 a general constitution of a floating gate type nonvolatile memory. As shown in FIG. 18, a floating type nonvolatile memory 101 is constituted such that a source region 103 and a drain region 104 are formed in a semiconductor substrate 102 and a floating gate 105 and a control gate 106 are formed through a gate insulation film. There are shown in FIG. 19 cell array connection wiring diagrams, writing operations, and erasing operations of representative NAND type, NOR type and AND type flash memories. Since contact of a bit line and a single cell can be omitted in the NAND type one, ideally the minimum cell size of 4F.sup.2 (F is ½ of a minimum pitch determined by designing rule) can be realized. Writing is based on the channel FN tunneling (Fowler-Nordheim Tunneling) method and erasing is based on the substrate FN tunneling emission method. High-speed random access is possible in the NOR type in which writing is based on the CHE (Channel Hot Electron) method and erasing is based on the FN tunneling emission method to the source terminal. Writing of the AND type is based on the FN tunneling of the drain terminal and reading out thereof is based on the channel FN tunneling method. Writing speed of the NAND type flash memory is 25-50 .mu.S which is slow, but, by increasing the parallel degree in processing as shown in FIG. 4 and FIG. 5, high-speed data transfer of GBPS (gigabyte/sec) becomes possible.

Figure 20:
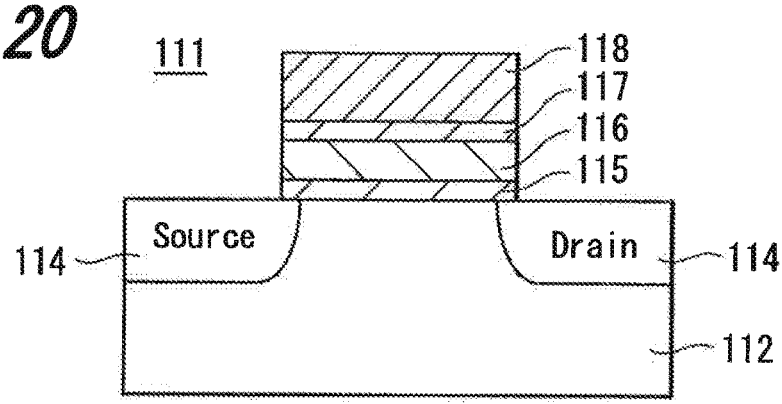
FIG. 20 is an outlined constitution diagram of an MONOS type nonvolatile memory.
Figure 21:
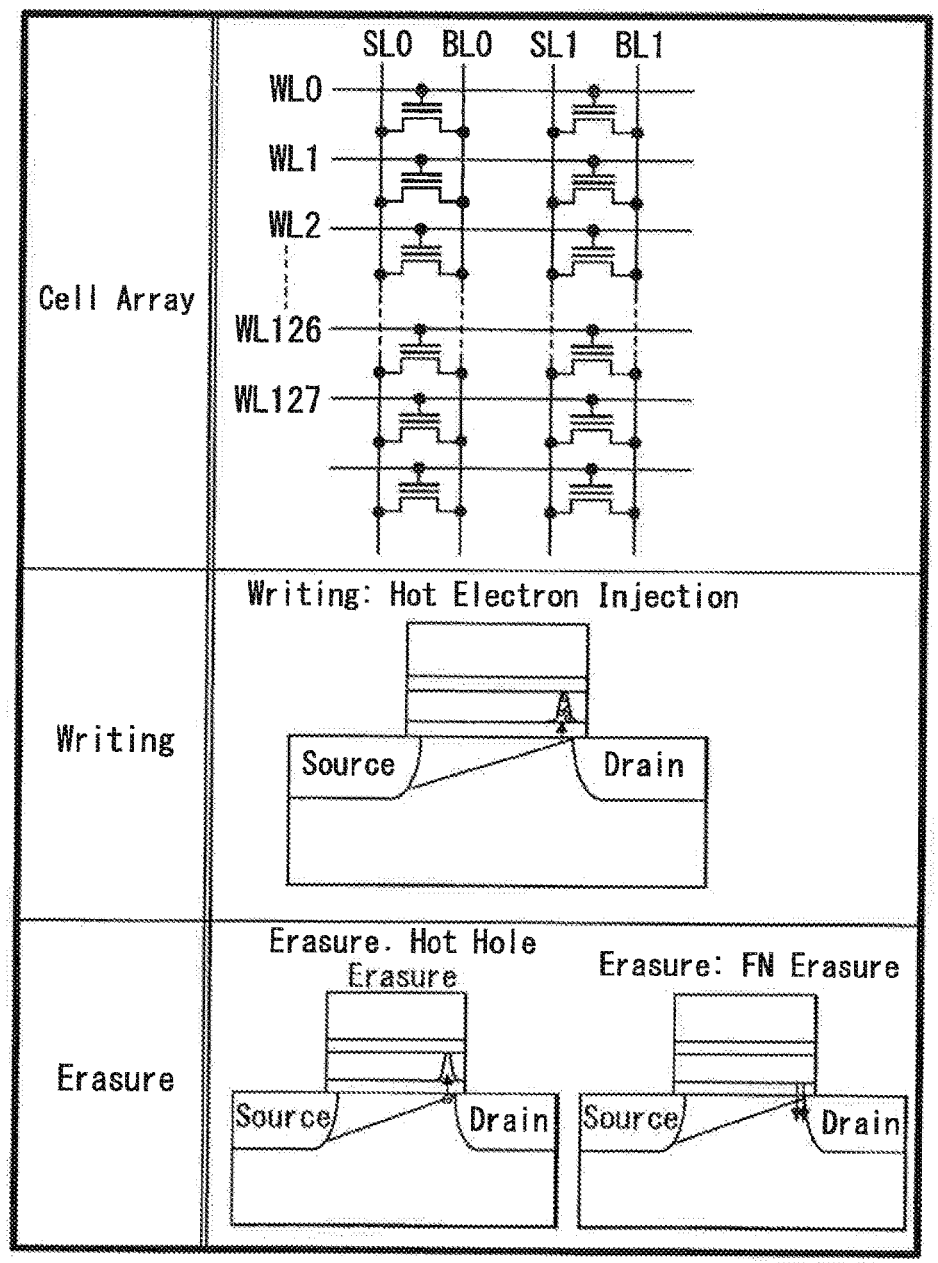
FIG. 21 is an explanatory diagram for explaining a cell array connection wiring, a writing operation and an erasing operation of an MONOS type memory.

There is shown in FIG. 20 and FIG. 21 a general constitution of an MONOS type nonvolatile memory. As shown in FIG. 20, an MONOS type nonvolatile memory 111 is constituted such that a source region 113 and a drain region 114 is formed in a semiconductor substrate 112, and a tunnel oxide film 115, an Si3N4 charge trap layer 116, a top oxide film 117 and a gate polyelectrode 118 are formed sequentially. There are shown in FIG. 21 a cell array connection wiring diagram, a writing operation and erasing operations of the MONOS type memory. Programming is carried out by injecting a hot electron to the Si3N4 charge trap layer 116 based on the CHE method and by changing the threshold. Erasing is carried out by injecting a hot hole or by pulling-out based on the FN tunneling method.

The first semiconductor chip 52 provided with the CMOS image sensor 60 and the second semiconductor chip 53 provided with the analog/digital converter array are laminated such that the front face side opposite to the light incident side of the first semiconductor chip 52 faces the second semiconductor chip 53, and respective pads 81 and 82 for connection are electrically connected through electroconductive connection bodies, for example, through bumps 83. Also, the second semiconductor chip 53 provided with the analog/digital converter array and the third semiconductor chip 54 laminated thereon and provided with the memory element array are joined such that the analog/digital converter and the memory elements are electrically connected through penetration contact portions 84 passing through the second semiconductor chip 53.

Usually, the analog/digital converter requires 50 to 100 times of layout area to the area of 1 pixel. Consequently, it is constituted in this exemplified embodiment such that a single analog/digital converter collectively processes the number of pixels of around the layout area of one analog/digital converter. Further, it is constituted such that data of a plurality of pixels are saved in the memory elements of the third semiconductor chip 54 laminated thereon. Usually, there is a data volume of 10 to 14 bits per 1 pixel, so that there is arranged a memory element array having the number of bits corresponding to the product obtained by multiplying the number of pixels corresponding to those directly on one analog/digital converter and the number of memory elements each of which can store the amount of information per 1 pixel.

Figure 3:
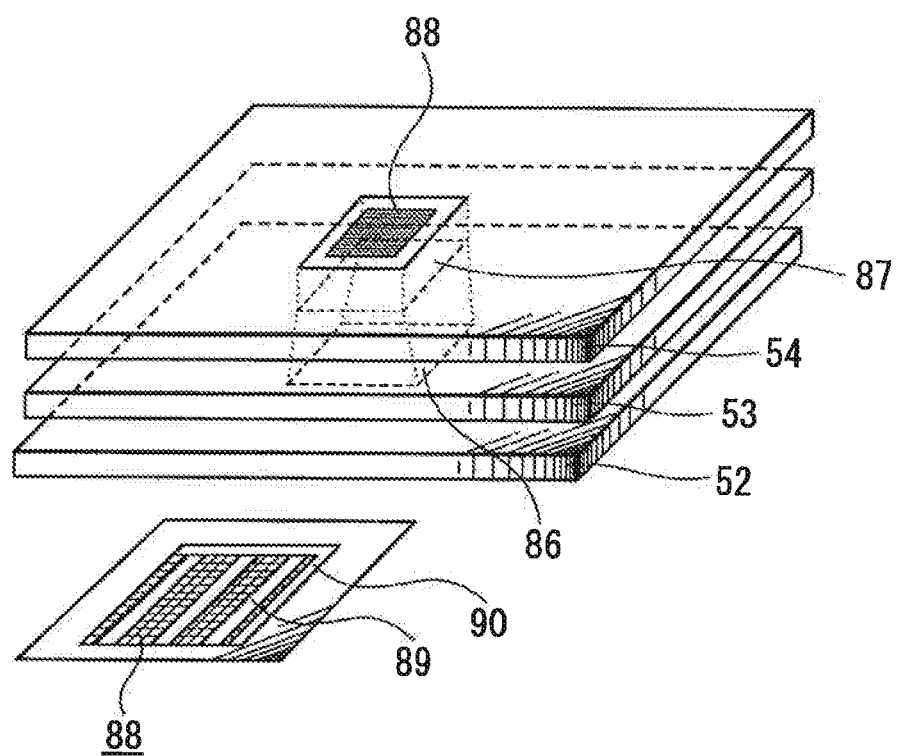
FIG. 3 is a schematic perspective view of a main portion of the exemplified embodiment in FIG. 1.

FIG. 3 shows in a form of a schematic perspective view, a relation among one pixel array block composed of the above-mentioned plurality of pixels, one analog/digital converter, and one memory element sub-array (that is, memory array block) composed of a plurality of memory elements which store data corresponding to the number of pixels in the pixel array block. The first semiconductor chip 52 as the image sensor, the second semiconductor chip 53 as the analog/digital converter array, and the third semiconductor chip 54 as the memory element array are laminated, and they are mutually connected such that one analog/digital converter 87 corresponds to one pixel array block 86 composed of a plurality of pixels and one memory element sub-array (memory array block) 88 composed of a plurality of memory elements which can store information of the pixel array block 86 corresponds to this one analog/digital converter 87.

FIG. 4 shows an example of data transfer of one pixel array block 86. In this example, the pixel array block 86 composed of 64 (=8.times.8) pieces of pixels 86a corresponds to one analog/digital converter (ADC) 87. Picture data are transferred from the pixel array block 86 to the analog/digital converter 87 serially. Data is written from the analog/digital converter 87 to the memory array block 88 serially with a bus width corresponding to the resolution. In this example, 1 pixel data are converted to 12 bits and are written in the memory array block 88. The memory array block 88 is provided with a sense amplifier 93 and a decoder 94 [X decoder 94X, Y decoder 94Y] which selects the pixels 86a. Since the analog/digital converter 87 is arranged on the sensor, it is desirable for the chip area efficiency that the number of pixels to be processed by one analog/digital converter 87 is selected such that the area of the analog/digital converter 87 and the area of the pixel array block 86 become comparable and that the memory array block 88 also has a comparable size since it is arranged on the analog/digital converter 87. Also, the memory array block 88 is arranged on the analog/digital converter 87. It is not always necessary that the pixel array block 86, the analog/digital converter 87, and the memory array block 88 are in such a positional relation that one is located immediately above another, and it is enough if respective taking out portions of the signal wirings overlap each other.

FIG. 5 is a whole block diagram. There are provided with a pixel array 121 in which a plurality of pieces of 64 pixels array blocks 86 are arranged, an analog/digital converter array 122 in which a plurality of pieces of analog/digital converter arrays each composed of a plurality of analog/digital converters 87 are arranged two-dimensionally such that one analog/digital converter 87 corresponds to each pixel array block 86, a memory array 123 in which a plurality of memory array blocks 88 are arranged two-dimensionally, and a digital signal processing device 124. Each of the pixel array 121, the analog/digital converter array 122, the memory array 123, and the digital signal processing device 124 is controlled by a control circuit 125. In this block diagram, data of each pixel in the 64 (=8.times.8) pixel array block 86 in the pixel array 121 are transferred to one analog/digital converter 87 serially, and also, pixel data of each pixel array block 86 are transferred to the corresponding analog/digital converter 87 in the analog/digital converter array 122 in parallel. The data transferred to the analog/digital converter array 122 are written in the memory array 123 after converting one pixel data to 12 bits in this example, by means of parallel processing of the number of analog/digital converters.times.12 bits. The data of this memory array 123 is processed by the digital signal processing device 124. In this manner, data of the whole pixels or the pixels in one block are transferred in parallel, so that a very high transfer speed can be realized as a system.

In this exemplified embodiment, the memory element array (memory array block) 88 described above has the number of bits of around 500 to 1 k bits, and is provided with a readout circuit (sense amplifier), a writing circuit, and a decoder. For example, if the pixel size is 2 .mu.m.sup.2 and the analog/digital conversion apparatus 87 is 100 .mu.m-.sup.2, it is enough if the number of pixels processed by one analog/digital converter 87 is 50 pieces, and the size of the memory element array provided on the analogue/digital converter 87 is one including a decoder of 50.times.(10 to 14) bits. Supposing that the amount of information is maximum 14 bits and the cell occupancy in the memory array block is 60%, the memory cell area becomes 0.01 .mu.m-.sup.2, and it can be realized by a cell size of a 90 nm generation DRAM.

The rear face side of the first semiconductor chip 52 is formed mainly as a photodiode PD array for a large portion thereof, so that an adequate aperture characteristic, that is, an aperture ratio can be obtained as a photodiode PD. Also, since an adequate aperture ratio can be obtained, conversely a minute pixel can be manufactured.

The analog-to-digital converted signal is once held in the memory element cell. With respect to the writing period to the memory element, it can be transferred by .mu.S order if sequential accessing is performed using, for example, a DRAM, so that the transfer time is adequately short as compared with an accumulation period of the photodiode PD, and as a result, simultaneous shuttering of all the pixels can be realized.

As shown in FIG. 3, there may be included parity check bits 89 and defect relieving redundant bits 90 in the memory element sub-array 88.

According to the semiconductor image sensor module 51 of the first exemplified embodiment, by laminating and integrating the first semiconductor chip 52 provided with the back-illuminated type CMOS image sensor 60; the second semiconductor chip 53 provided with the analog/digital converter array composed of the plurality of analog/digital converters 87; and the third semiconductor chip 54 provided with the memory array (memory element array) in which the memory element arrays are included, that is, a plurality of memory element sub-arrays (memory array blocks) 88 are arranged two dimensionally, it is possible to make the photodiode PD area on the rear face side, that is, the pixel aperture ratio adequately large. Thereby, pixel miniaturization corresponding to shrinkage of the optical system becomes possible, and also, low noise equivalent to a CCD image sensor can be realized. In particular, because production of a minute pixel having a large aperture ratio also becomes possible, a high resolution semiconductor image sensor module can be obtained. Also, because it is constituted such that the pixel array 86 composed of a plurality of pixels and the memory element array 88 composed of a plurality of memory elements share one analog/digital converter 87 and the signal from the pixel array 86, which has been analog-to-digital converted in a short period, is held in the memory element array 88 and thereafter signal-processed, it is possible to carry out simultaneous shuttering of all the pixels. Consequently, it is possible to provide a CMOS image sensor-module that has a high sensitivity and that is capable of simultaneous electronic shuttering. The CMOS image sensor-module of this exemplified embodiment is preferably applied, for example, to a digital still camera of a high-grade single lens reflex, a mobile phone or the like.

In the first exemplified embodiment, the first, second and third semiconductor chips 52, 53 and 54 have been laminated, however, it is also possible, for example, to laminate the first semiconductor chip 52 of the CMOS image sensor and the second semiconductor chip 53 of the analog/digital converter array except the third semiconductor chip 54 including the memory element array, arrange the third semiconductor chip in a necessary substrate or package together with the laminated body of the first and second semiconductor chips 52 and 53, and connect the second semiconductor chip 53 and the third semiconductor chip 54 through an external wiring.

Figure 6:
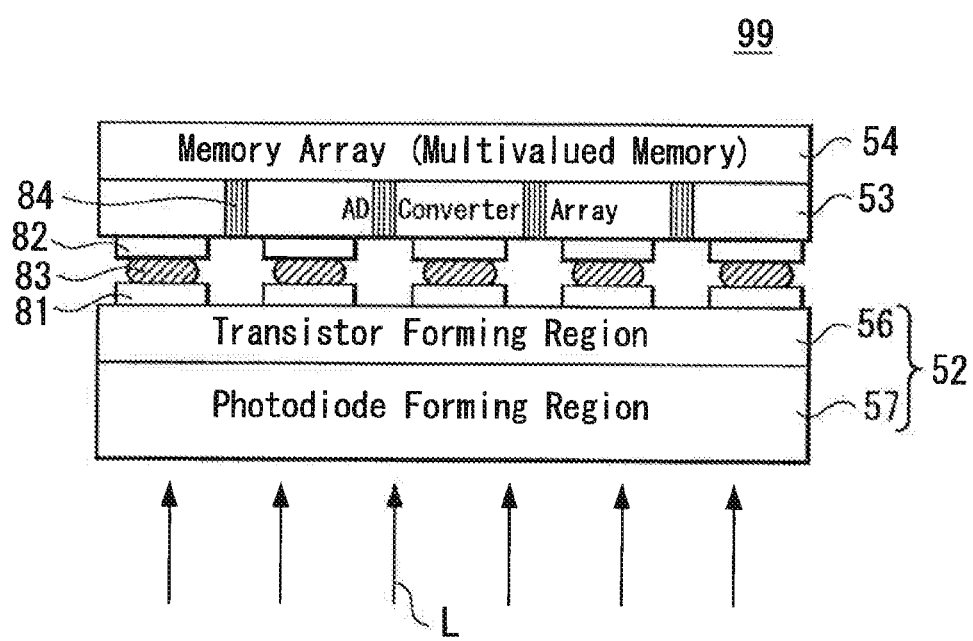
FIG. 6 is an outlined constitution diagram showing a second exemplified embodiment of a semiconductor image sensor module according to the present invention.

There is shown in FIG. 6 a general constitution of a second exemplified embodiment of a semiconductor image sensor module according to the present invention. A semiconductor image sensor module 99 according to this exemplified embodiment is constituted similarly as mentioned above by laminating the first semiconductor chip 52 provided with the CMOS image sensor 60 in which a plurality of pixels are arranged regularly and each of the pixels is constituted by the photodiode forming region 57 and the transistor forming region 56, the second semiconductor chip 53 provided with an analog/digital converter array composed of a plurality of analog/digital converters, and the third semiconductor chip 54 provided with a memory element array including at least a decoder and a sense amplifier.

Then, in this exemplified embodiment, a multivalued nonvolatile memory (hereinafter, referred to as a multivalued memory) is formed as the memory element of the third semiconductor chip 54. For this multivalued memory, it is possible to use, for example, a nonvolatile resistance random-access-memory (RRAM) by means of a thin film having huge magnetic resistance, which was published in 193-196 pages of IEDM Technical Digest (2002).

Figure 7:
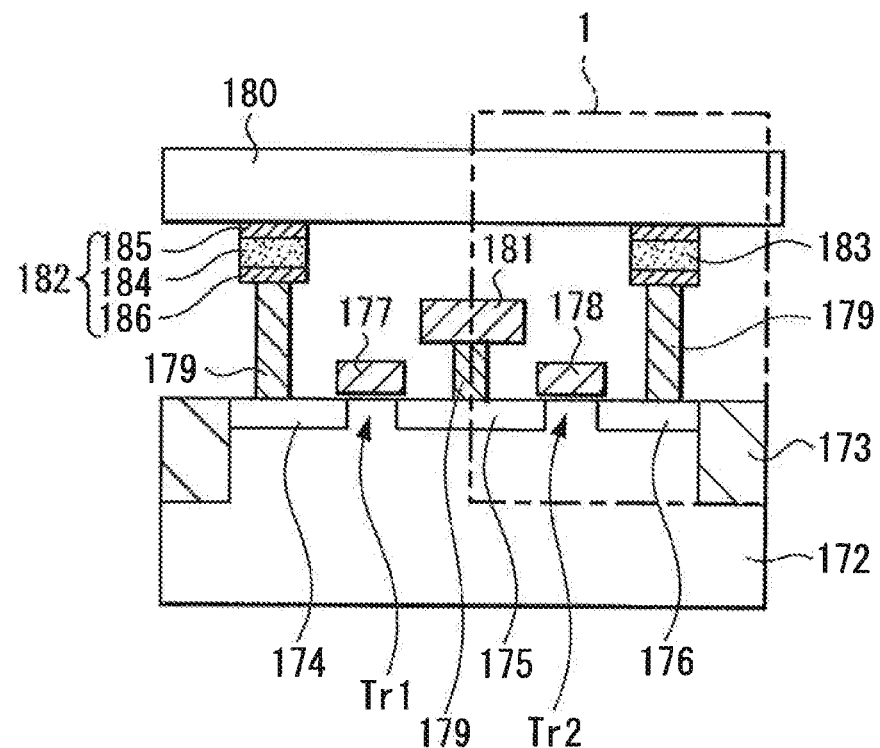
FIG. 7 is an outlined cross-section diagram of a multivalued nonvolatile memory (resistance-changing type multivalued memory) according to the second exemplified embodiment.

One example of this RRAM (Resistance RAM) is shown in FIG. 7 (cross section structure) and in FIG. 8 to FIG. 17 (programming).

Figure 8:
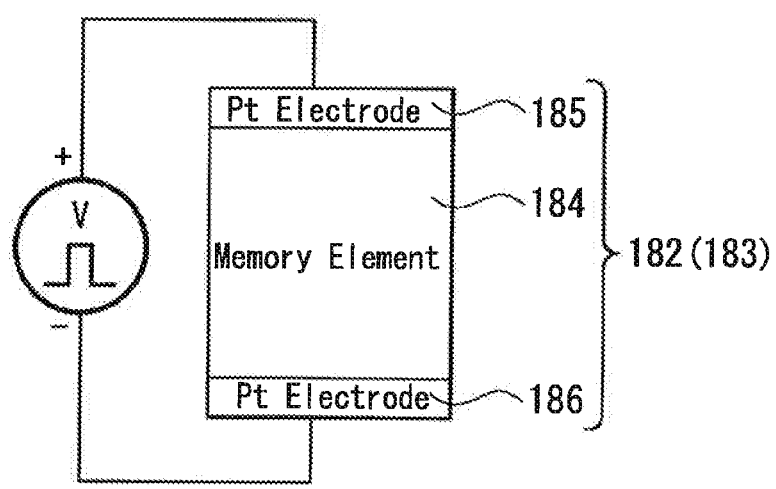
FIG. 8 is a circuit diagram of a multivalued memory.

There is shown in FIG. 8 a characteristic evaluation circuit of a simple element. There are shown in FIG. 9 a pulse application diagram and in FIG. 10 a voltage-current diagram.

In this RRAM, that is, a resistance-changing type multivalued memory element, as shown in FIG. 7, element separation regions 173 are formed in a silicon substrate 172, and a first, a second and a third source/drain regions 174, 175 and 176 are formed in the substrate 172 partitioned by the element separation regions 173. A first MOS transistor Tr1 is formed by the first and second source/drain regions 174 and 175 and a gate electrode (so-called word line) 177 which is formed through an insulation film. Also, a second MOS transistor Tr2 is formed by the second and third source/drain regions 175 and 176 and a gate electrode (so-called word line) 178 which is formed through an insulation film. The second source/drain region 175 is connected with a sense line 181 through a conductive plug 179, which passes through an interlayer insulation film. On the other hand, the first and third source/drain regions 174 and 176 are connected with resistance-changing type multivalued memory elements 182 and 183 through the conductive plugs 179 respectively. The other terminals of the resistance-changing type multivalued memory elements 182 and 183 are connected with a bit line 180. For the memory elements 182 and 183, it is possible to use, for example, a material of SrZrO3: Cr system. There exists in addition for the memory material, PCMO (Pr0.7Ca0.3MnO3), a material in which Cu or Ag has been added to chalcogenide, or the like. Pt electrodes 185 and 186 are formed above and below this memory material 184 and thereby the memory elements 182 and 183 are formed. 1 bit is constituted by one memory element and one MOS transistor. In FIG. 7, there are constituted memory elements for 2 bits, which share the sense line. There is shown in FIG. 8 a circuit of a single memory element.

First, it will be reviewed about a case of a binary resistance-changing type memory.

Figure 9:
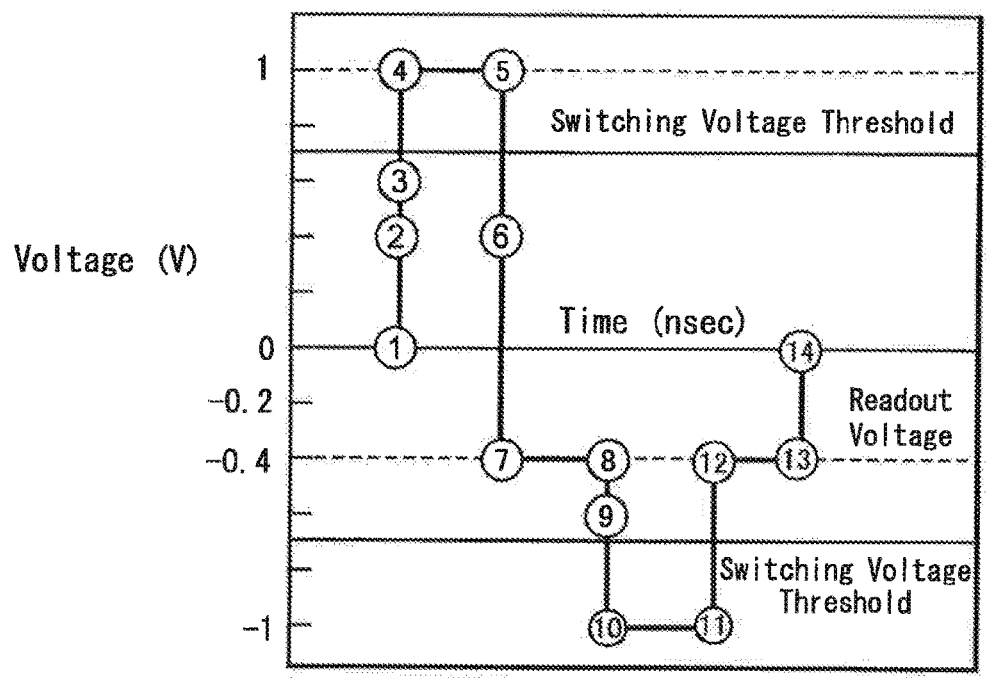
FIG. 9 is an explanatory diagram of pulse application in the case of a binary resistance-changing type memory.
Figure 10:
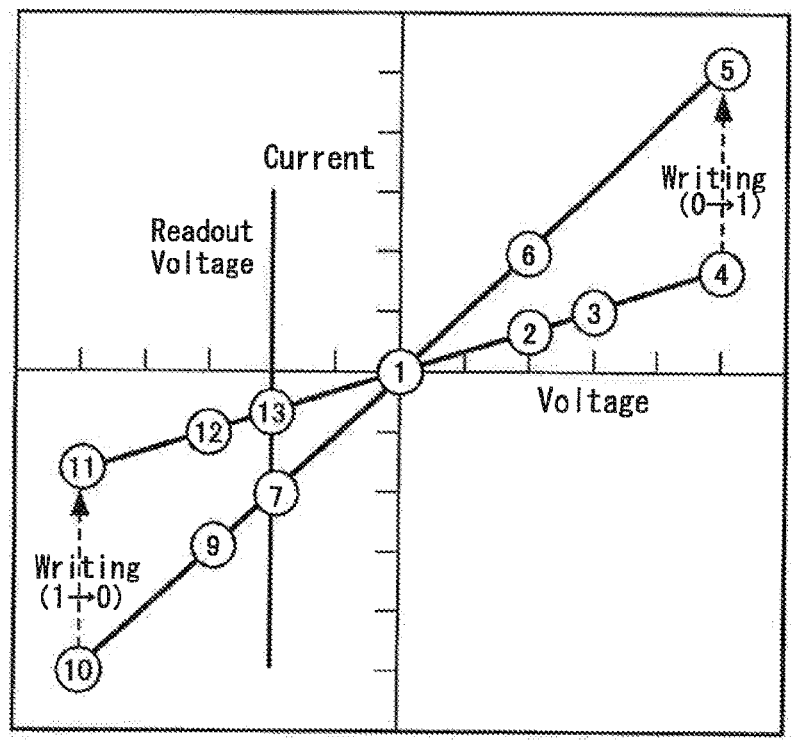
FIG. 10 is a voltage-current characteristic diagram in the case of a binary resistance-changing type memory.
Figure 11:
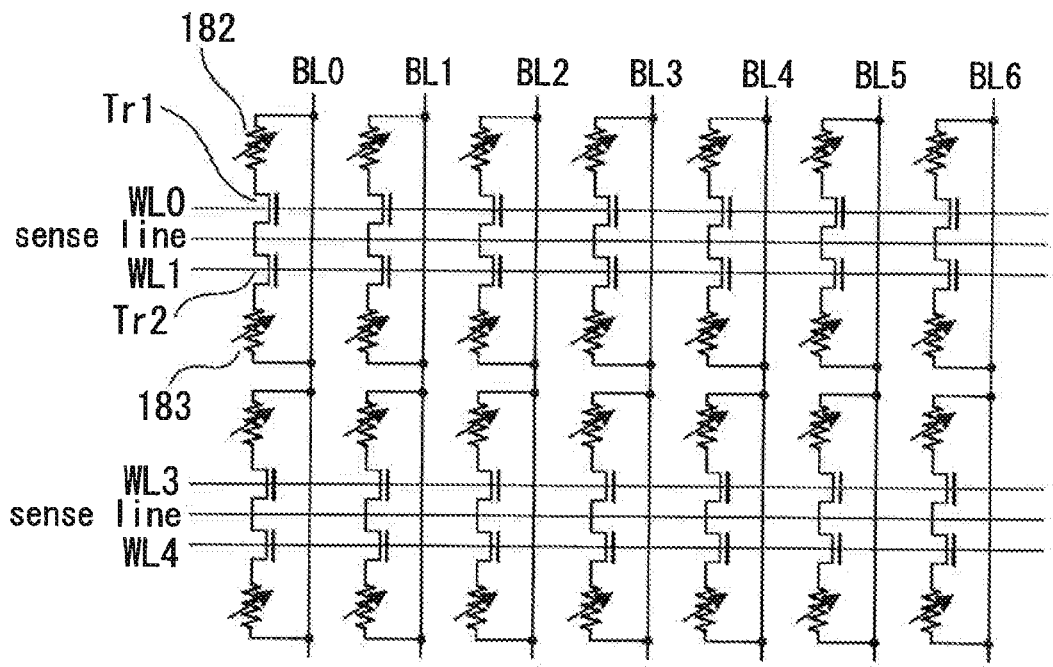
FIG. 11 is a connection wiring diagram of a memory array.
Figure 12:
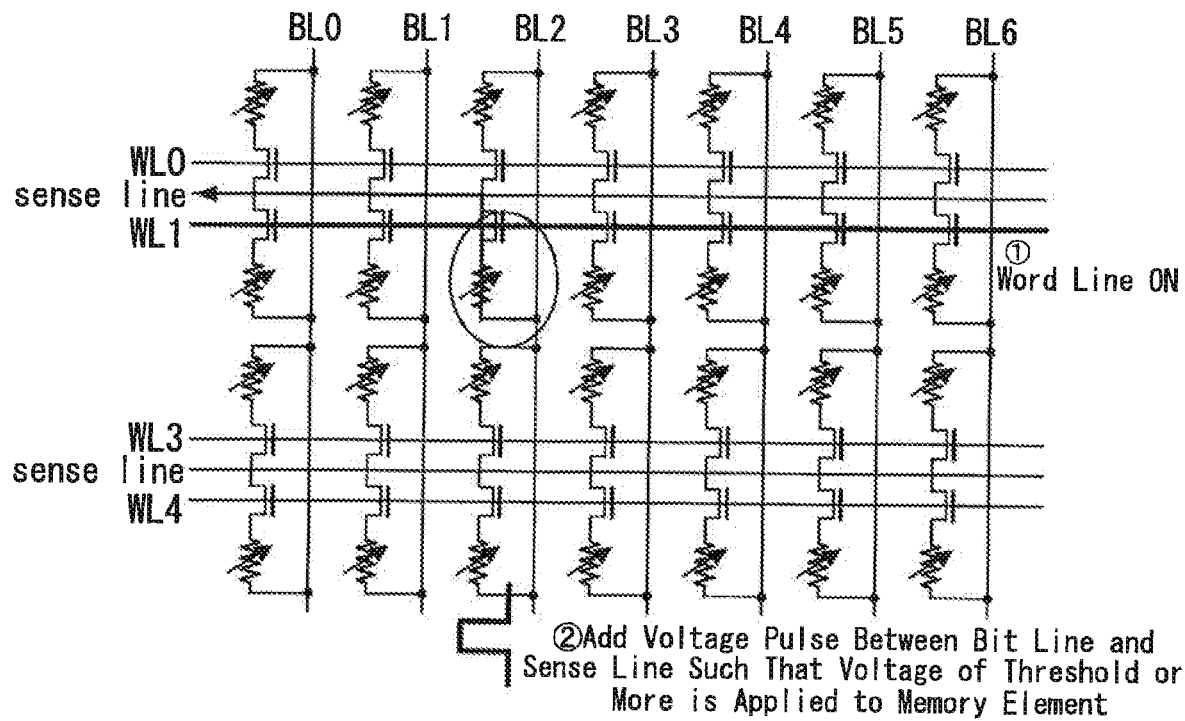
FIG. 12 is an operation explanatory diagram of "0" writing.

A pulse voltage is applied to the memory element as shown in FIG. 9. The switching voltage threshold changes according to the material and the film thickness. In FIG. 9, the threshold voltage is made to be +−0.7 V. Although it is actually not a target in many cases, it will be explained here assuming that absolute values of the threshold voltages of "0" writing and "1" writing are equal. When the pulse voltage is increased to the threshold or more, the resistance value changes (4.fwdarw.5, 10.fwdarw.11: (see FIG. 10)). In an actual readout operation, a voltage lower than the threshold is applied and "0" or "1" is judged from the flowing current. In many cases, a middle resistance having a resistance value between "0" resistance value and "1" resistance value is created, and "0" or "1" is judged by comparing this resistance and the memory resistance. There is shown in FIG. 11 a connection wiring diagram of a memory array. FIG. 12 shows an explanatory diagram of the "0" writing operation. When writing "0" (high resistance) in a "1" (low resistance) bit, the word line of a selection cell is made ON and "0" writing is carried out by adding a pulse voltage to the bit line such that a voltage of the threshold voltage or more is added to the memory element.

Figure 13:
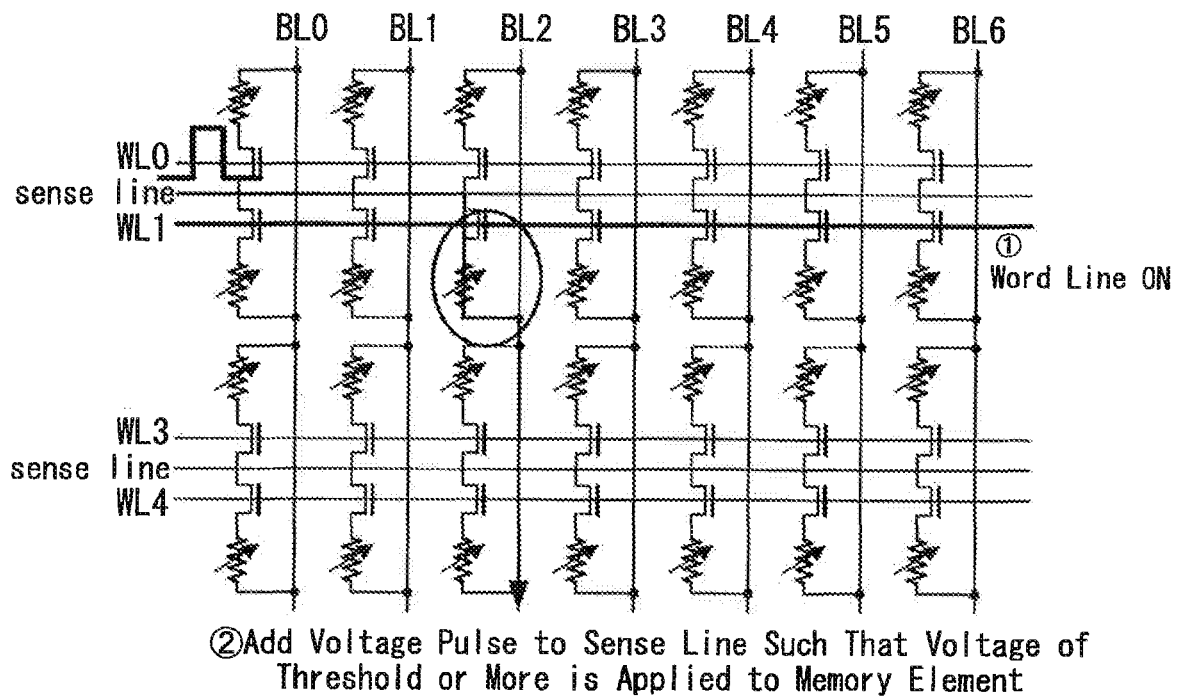
FIG. 13 is an operation explanatory diagram of "1" writing.
Figure 14:
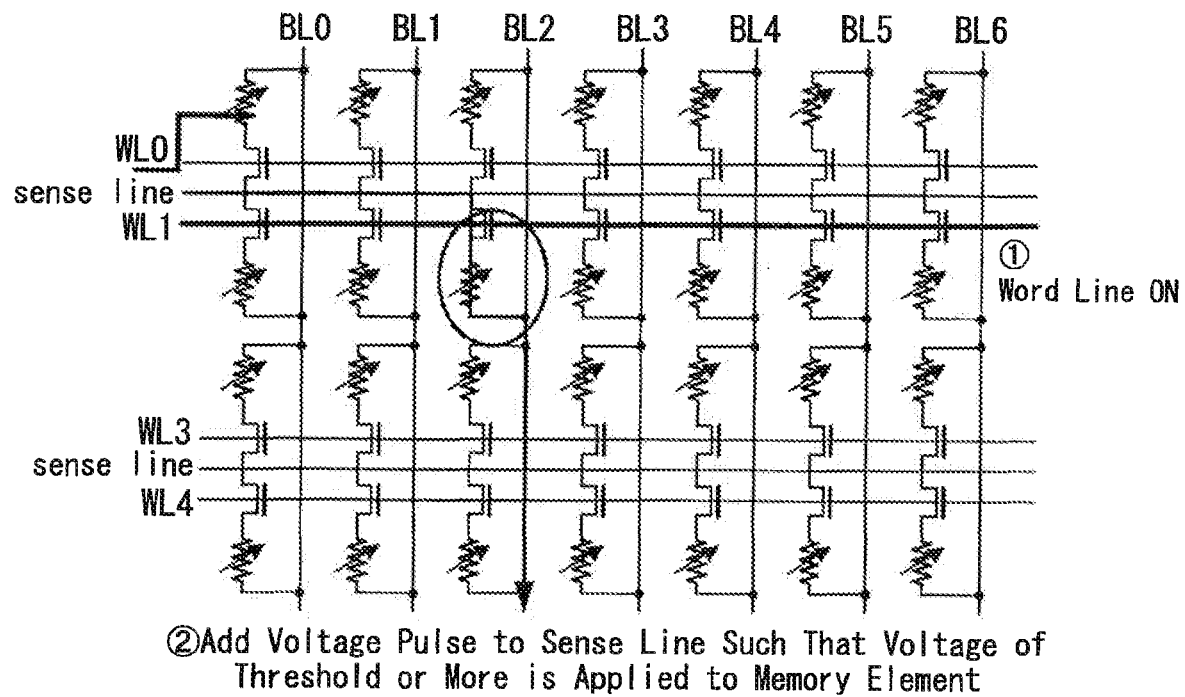
FIG. 14 is an operation explanatory diagram of readout.

"1" writing (Reset) will be explained using FIG. 13. The word line of the "1" writing operation selecting cell is made ON and "1" writing is carried out by adding a pulse voltage between the sense line and the bit line such that a voltage of the threshold voltage or more is added to the memory element. FIG. 14 is a diagram for explaining a readout operation. A voltage adequately lower than the threshold voltage is applied to the memory element between the sense line and the bit line, this current is converted to a voltage, and "1" or "0" is judged by comparing it with the current flowing in the middle resistance (reference).

Figure 15:
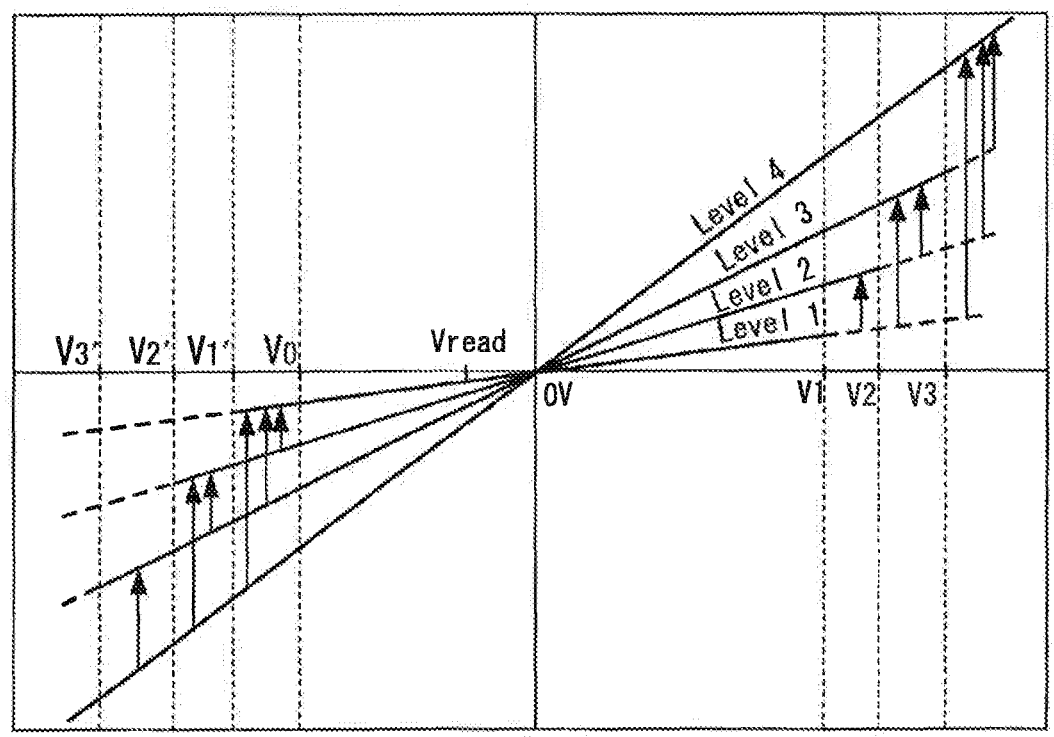
FIG. 15 is a current-voltage characteristic diagram of a multivalued memory.

FIG. 15 illustrates a current-voltage characteristic example of a multivalued memory having four thresholds. In the case of a multivalued memory, in the example of the current-voltage characteristic in FIG. 15 in which the thresholds become plural, the readout for V0, V1', V2' and V3' are carried out by a voltage (Vread in the drawing) lower than V1. In the case of a writing operation to a higher level than the previous level, writing of level 2 is carried out by a voltage between V1 and V2, writing of level 3 is carried out by a voltage between V2 and V3, and writing of level 4 is carried out by a voltage of V3 or more. Also, in the case of writing-in to a level lower than the previous state, writing of level 3 is carried out by a voltage between V3' and V2', writing of level 2 is carried out by a voltage between V2' and V1', and writing of level 1 is carried out by a voltage between V1' and V0. Readout is carried out by performing comparison of sizes with the middle resistance at respective levels that have been generated. The multivalue control can be performed with the bias voltage control from the outside of the memory array, so that the cell array circuit itself is the same as in the binary value (see FIG. 11). The multivalued memory can be realized even by changing the writing pulse.

Figure 16:
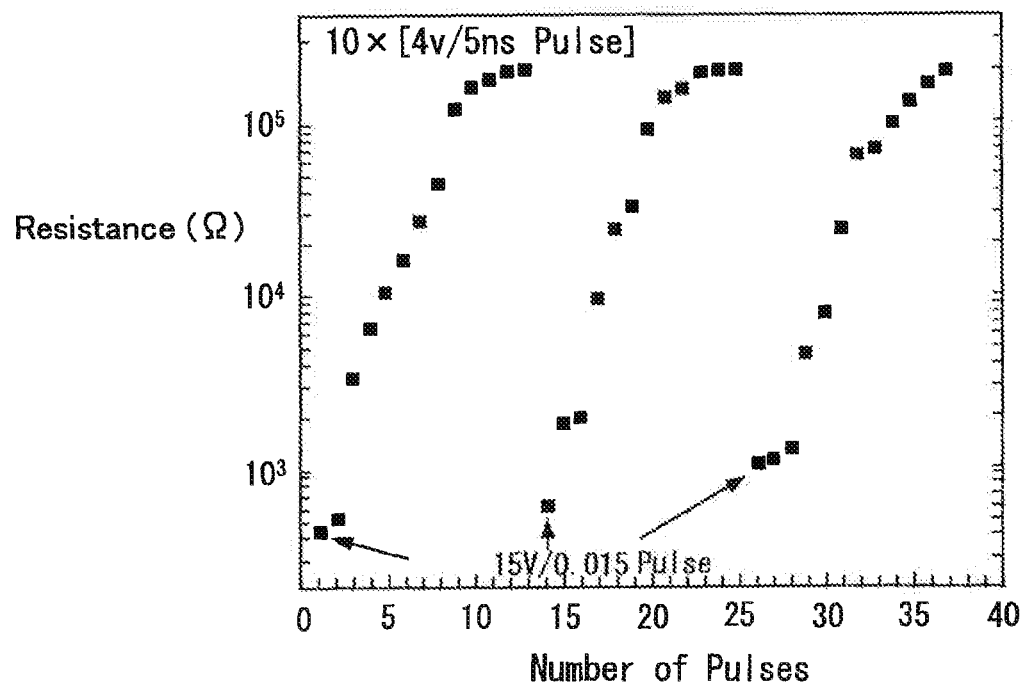
FIG. 16 is a program diagram for explanation of a multivalued memory.
Figure 17:
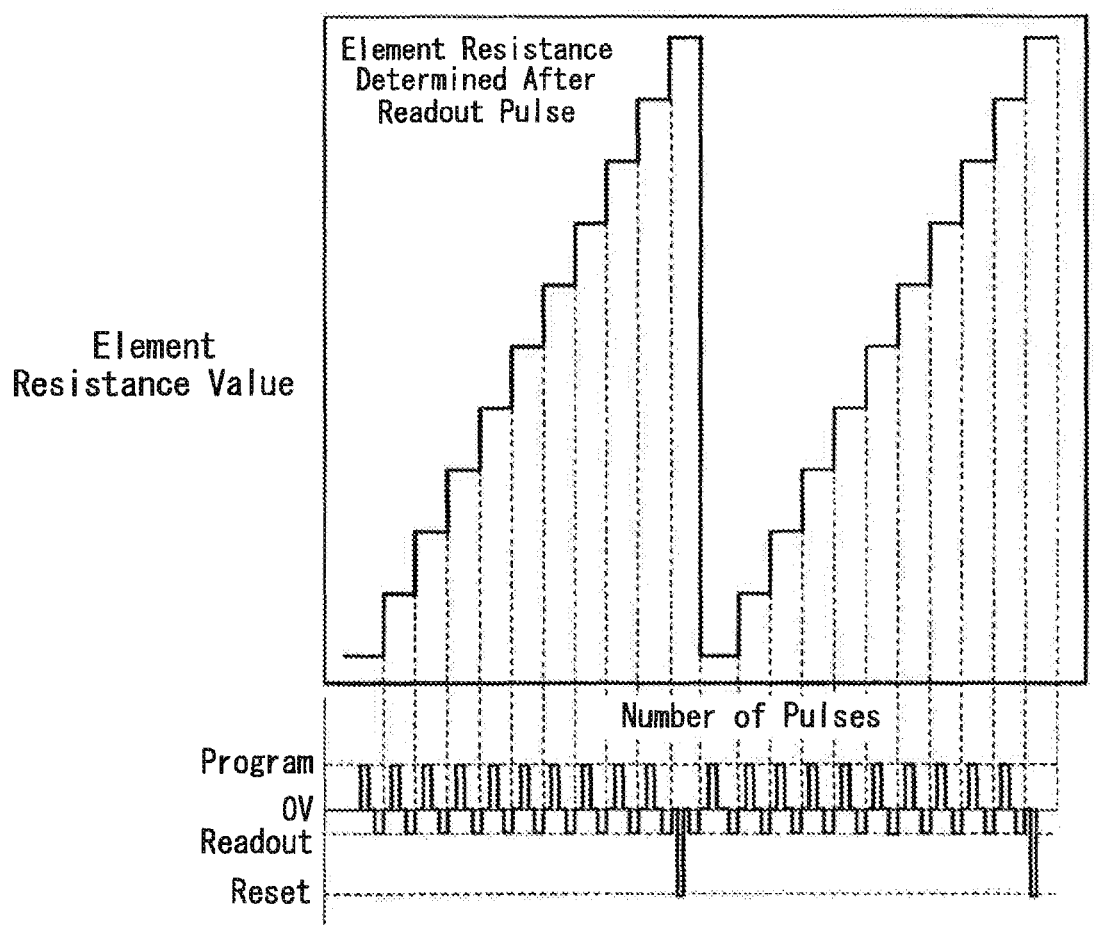
FIG. 17 is an explanatory diagram of a plurality of pulse programs of a multivalued memory in an ideal case.

FIG. 16 is a diagram showing an observation result of the aforesaid IEDM (International Electron Device Meeting) Technical Digest. It will be explained with respect to this ideal case referring to FIG. 17. As shown in the drawing, the element resistance changes step-wise depending on the number of program pulses. The reset is carried out with applying a pulse of the opposite direction. For the readout, the resistance value is detected by applying a voltage that is adequately low as compared with the program voltage. Also in this case, the cell array circuit is the same as that in FIG. 11.

In this manner, a RAM can record if the number of writing pulses of the memory is adjusted in response to the amount of the accumulated electric charge of the photodiode PD. Also, readout can be carried out with applying a current to the memory and detecting the difference of resistance values (voltages). Supposing that the data volume per one pixel is x and an n value memory is used, the number of memory bits y constituting the memory cell per one pixel becomes n-th root of x, and it is possible to decrease the number of memory bits in the memory array block.

In FIG. 6, other constitutions are similar to those of the first exemplified embodiment described above, so that the same reference numerals are put on the corresponding portions and the repetitive explanation thereof will be omitted.

According to the CMOS image sensor-module 99 in the second exemplified embodiment, by using a nonvolatile multivalued memory for the memory element constituting the memory element array of the third semiconductor chip, the number of memory elements which records information corresponding to one pixel is decreased drastically. Then, similarly as the first exemplified embodiment, the rear face side is formed mainly as a photodiode PD array for a large portion thereof, so that an adequate aperture ratio of a photodiode PD can be obtained, and also it is possible to produce a minute pixel. The analog-to-digital converted signal is once held in the memory element cell once. With respect to the writing period to the memory element, data can be transferred by .mu.S order if sequential access is performed, which is adequately short to an accumulation period of the photodiode PD, and simultaneous shuttering of all the pixels can be realized. Consequently, it is possible to provide a CMOS image sensor-module that has a high sensitivity and is capable of simultaneous electronic shuttering.

Figure 22:
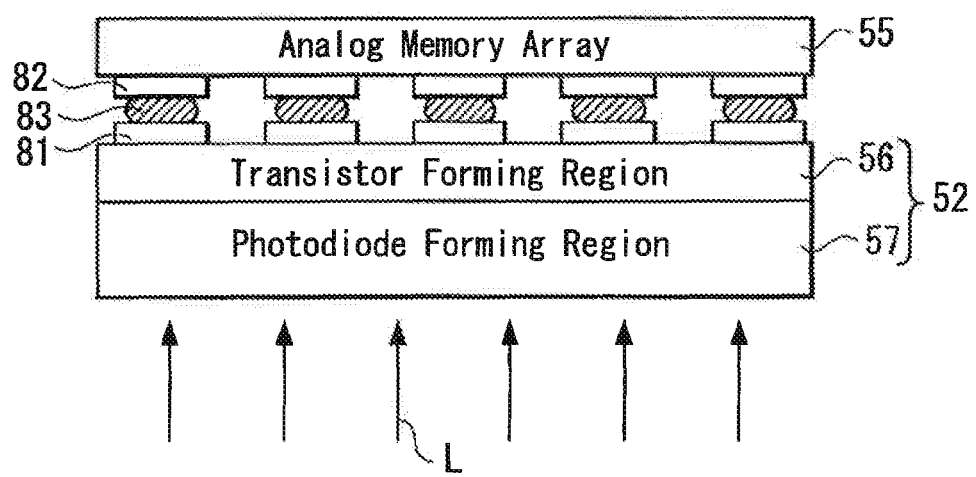
FIG. 22 is an outlined constitution diagram showing a third exemplified embodiment of a semiconductor image sensor module according to the present invention.

There is shown in FIG. 22 a general constitution of a third exemplified embodiment of a semiconductor image sensor module according to the present invention. A semiconductor image sensor module 100 according to this exemplified embodiment is constituted by laminating the first semiconductor chip 52 provided with the CMOS image sensor 60 similar to the previously described one in which a plurality of pixels are arranged regularly and each of the pixels is constituted by the photodiode forming region 57 and the transistor forming region 56, and the fourth semiconductor chip 55 in which a memory element array is formed.

Then, in this exemplified embodiment, the memory element constituting the memory element array of the fourth semiconductor chip 55 is formed by means of an analog type nonvolatile memory represented, for example, by a switched capacitor. In this analog type nonvolatile memory, for example, in a switched capacitor, a potential corresponding to a charge amount accumulated by the pixel photoresist PD is generated by an amplifier, and according to this potential, the amount of accumulated electric charge of the capacitor is controlled. The charge accumulated in the capacitor is proportional to the signal charge amplified by the amplifier. In this case, it is enough if memory elements corresponding to the number of pixels are provided.

Figure 23:
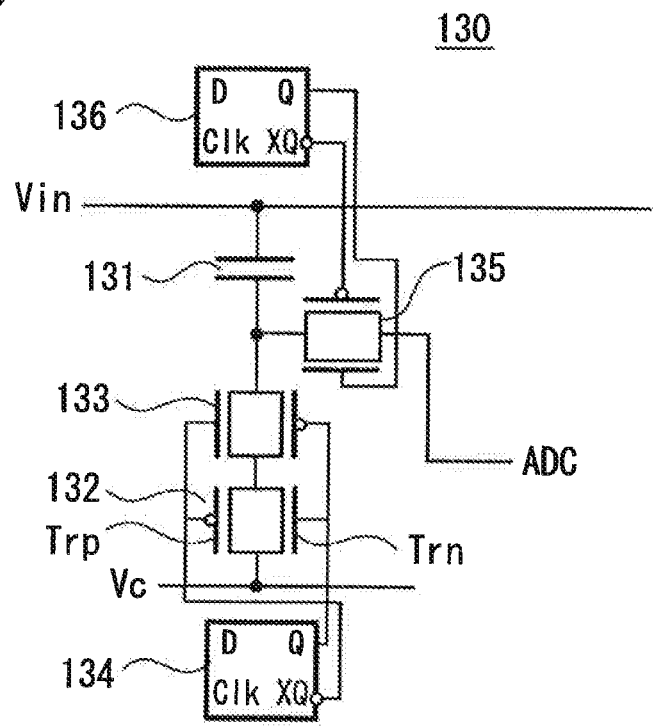
FIG. 23 is a memory cell circuit diagram of a switched capacitor type analog memory.

There is shown in FIG. 23 a memory cell circuit diagram using a switched capacitor. This memory cell circuit 130 is constituted by including a memory capacitor 131, a switch for writing 132, a writing dummy switch 133, a D-type flip-flop 134 for writing, a switch for readout 135 and a D-type flip-flop for readout 136. Each of the switches 132, 133 and 135 is constituted of an NMOS transistor Trn and a PMOS transistor Trp. In other words, each of the switches is constituted of CMOS transistors. In this switched capacitor type analog memory, with respect to writing, the switch for writing 132 is made ON when a Q output of the D-type flip flop for writing 134 becomes a high level (High) and the memory capacitor 131 is charged so as to be of a voltage between Vin and Vc. With respect to readout, the switch for readout 135 (so-called CMOS pass transistor) is made ON when an output Q of the D-type flip-flop for readout 136 becomes a high level (High) and an output is derived therefrom. It is allowed to insert an amplifier in the succeeding stage thereof. Data of the switched capacitor type analog memory are transferred to an analog/digital converter (ADC).

Figure 24:
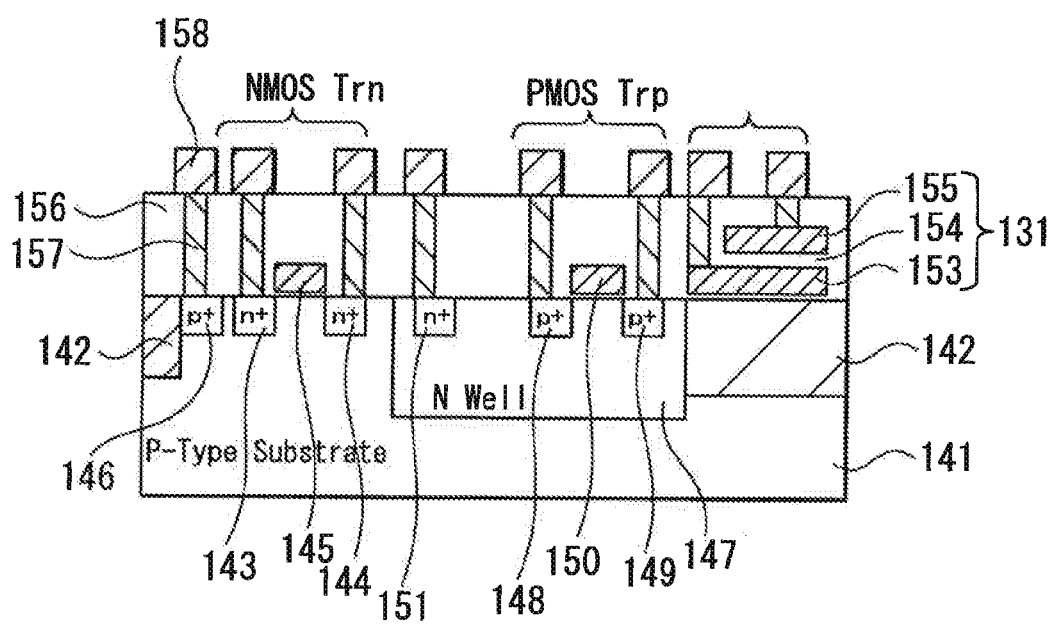
FIG. 24 is an outlined constitution diagram of a switched capacitor type analog memory.

FIG. 24 shows one example of a cross section structure of a switched capacitor. The drawing shows the portion of a memory capacitor and a switch for readout. An NMOS transistor Trn is formed by forming element separation regions 142 in a p-type semiconductor substrate 141, and a n-type source region 143, a drain region 144, and a gate electrode 145 by means of 1 layer polysilicon through a gate insulation film in the substrate 141 partitioned by the element separation regions 142. A p-type region 146 is a potential supply region provided for fixing the substrate potential. A PMOS transistor Trp is formed by forming a n-type semiconductor well region 147 in the p-type semiconductor substrate 141, and a p-type source region 148, a drain region 149, and a gate electrode 150 by means of 1 layer polysilicon through a gate insulation film in this n-type semiconductor well region 147. An n-type region 151 is a potential supply region provided for fixing the well region potential. CMOS transistors constituting the switch for readout 135 are formed by these NMOS transistor Trn and PMOS transistor Trp. On the other hand, there is formed on the element separation region 142, the memory capacitor 131 which is constituted by laminating a first electrode 153 by means of 1 layer polysilicon, a dielectric film (interlayer insulation film) 154, and a second electrode 155 by means of 2 layer polysilicon. A wiring 158 connected with each region through each conductive plug 157, which passes through an interlayer insulation film 156, is formed. Only 1 layer metal is shown for the wiring 158, but it does not matter even if there is provided a wiring pattern of a plurality of layers. For the memory capacitor 131, it is possible to use a capacitor using a 2 layer metal or a MOS capacitor other than the above-described one.

Figure 25:
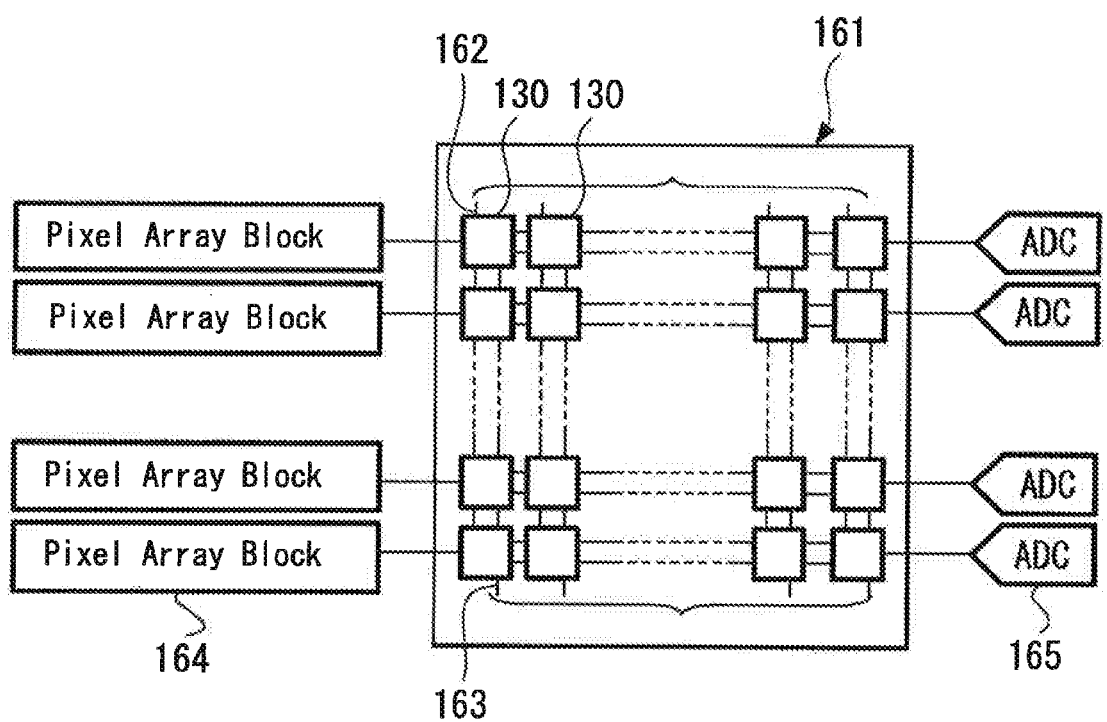
FIG. 25 is a connection wiring diagram of a switched capacitor type analog memory.

There is shown in FIG. 25 a block diagram using an analog memory array by means of switched capacitor type analog memories. A plurality of switched capacitor type analog memories 130 are arranged in a line-column form to form an analog memory array 161. It is constituted such that the analog memories 130 in each column are connected with a writing control signal input line 162 and a readout control signal input line 163. Corresponding to the analog memories 130 in respective lines of the analog memory cell 161, pixel array blocks 164 are connected on the input side of the analog memory array 161 and analog/digital converters 165 are connected on the output side thereof, respectively. The analog signal inputted from each pixel cell of the pixel array blocks 164 to the analog memory array 161 is accumulated sequentially in each of the analog memories (memory cells) 130 serially. With respect to readout, signals are inputted sequentially to the analog/digital converter 165 corresponding to the pixel array block 164 starting from the head memory cell according to readout control signals, and digital signals are outputted.

Other constitutions are similar to those of the first exemplified embodiment described above, so that repetitive explanation thereof will be omitted by putting the same reference numerals on the corresponding portions.

Writing to this analog type nonvolatile memory is carried out by relating each plurality of pixels to the memory element sub-array in which information of the plurality of pixels is stored and by serially accessing the information of the plurality of pixels for writing in the corresponding memory array. With respect to the writing period, transferring can be attained in .mu.S order or less if this analog memory is used and sequential access is employed.

According to the semiconductor image sensor module 100 in the third exemplified embodiment, by laminating and integrating the first semiconductor chip 52 provided with the back-illuminated type CMOS image sensor and the fourth semiconductor chip 55 provided with the analog type nonvolatile memory array, similarly as in the first exemplified embodiment described above, the rear face side of the first semiconductor chip 52 is formed mainly as a photodiode PD array for a large portion thereof, so that an adequate aperture ratio of a photodiode PD can be obtained, and also it is possible to produce a minute pixel. Further, with respect to the writing period to the analogue type nonvolatile memory, because data can be transferred in .mu.S order or less, which is adequately short relative to an accumulation period of the photodiode PD, simultaneous shuttering of all the pixels can be realized.

Next, an exemplified embodiment of a manufacturing method of a semiconductor image sensor module according to the present invention will be explained using FIG. 26. This example is a case that the method is applied to the manufacture of the semiconductor image sensor module 51 according to the first exemplified embodiment in FIG. 1.

Figure 26A:
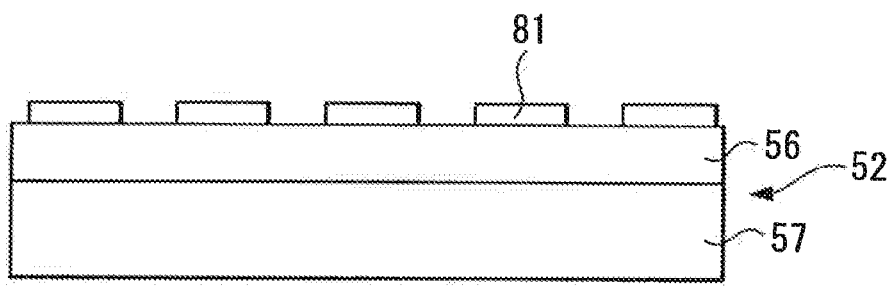
FIGS. 26A to 26C are manufacturing process diagrams showing one exemplified embodiment of a manufacturing method of a semiconductor image sensor module according to the present invention.

First, as shown in FIG. 26A, a transistor forming region is formed on a first front face side of a semiconductor substrate, and the first semiconductor chip 52 is formed in which a forming region for a photodiode which becomes a photoelectric conversion element is formed on a second front face which is the rear face of the substrate. Specifically, as shown in FIG. 2, a pixel transistor is formed on the front face side of a thinned semiconductor substrate, and a photodiode is formed so as to make the rear face side a light incidence plane. A multilayer wiring layer is formed on the front face side of the semiconductor substrate, and a support substrate for reinforcement, for example, a silicon substrate, is joined thereon. A color filter is formed on the rear face side of the semiconductor substrate through a passivation film, and further, an on chip microlens is formed. Thinning of the semiconductor substrate is carried out using grinding and CMP (Chemical Mechanical Polishing) or the like after joining the support substrate. Then, the pads 81 connected with the multilayer wiring are formed on the support substrate, for example through penetration contacts.

Figure 26B:
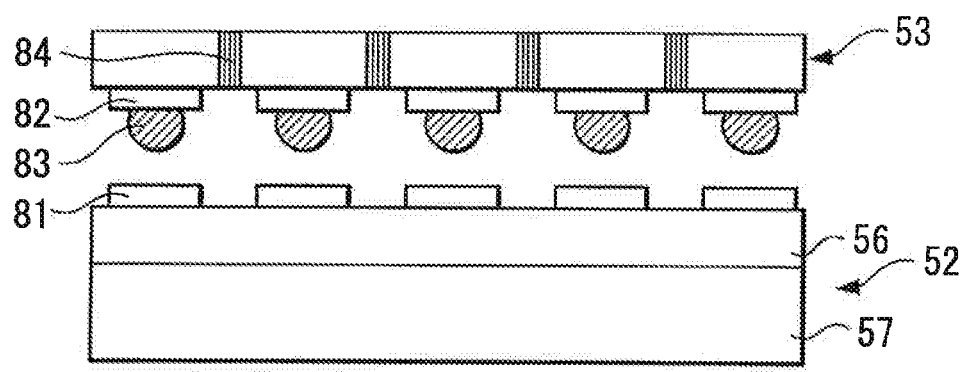

Next, as shown in FIG. 26B, at least an analog/digital converter array is formed in the semiconductor substrate, the pads 82 for connection of respective analog/digital converters are formed on the front face of the semiconductor substrate, and further, the second semiconductor chip 53, in which the penetration contact portions 84 which pass through the semiconductor substrate so as to be exposed to the rear face side of the semiconductor substrate have been formed, is formed. This semiconductor substrate is also thinned.

The conductive micro bumps 83 are provided on the pads 82 of this second semiconductor chip 53 and the pads 82 of the second semiconductor chip 53 and the pads 81 on the front face side of the first semiconductor chip 52 are connected electrically through this micro bumps 83 with the second semiconductor chip 53 faced downward.

Figure 26C:
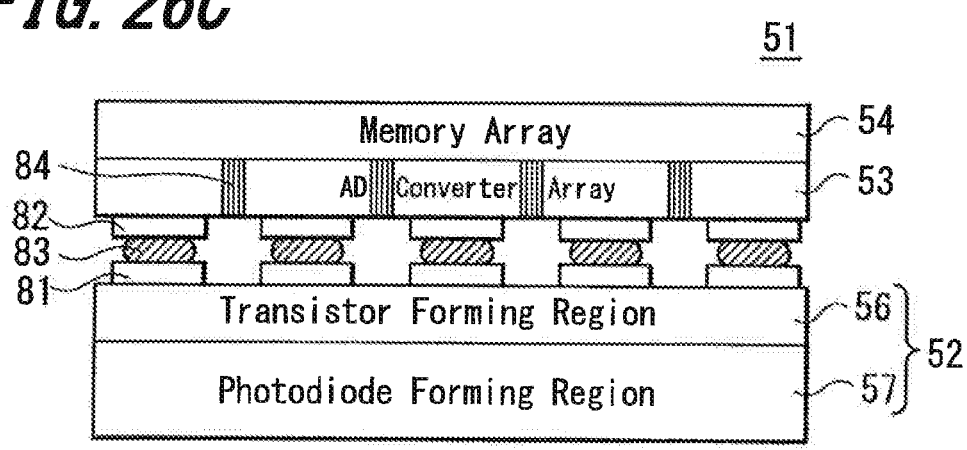

Next, as shown in FIG. 26C, the third semiconductor chip 54, in which a memory array has been formed with arranging memory element arrays two dimensionally, is formed. This third semiconductor chip 54 is laminated on the second semiconductor chip 53, and the second analog/digital converter array and the memory element array of the third semiconductor chip 54 are connected electrically through the penetration contact portions 84. Thereby, the semiconductor image sensor module 51 provided with the aimed CMOS image sensor is obtained.

According to the manufacturing method of the semiconductor image sensor module in this exemplified embodiment, mainly a back-illuminated type CMOS image sensor is formed on the first semiconductor chip 52, so that the aperture ratio of the photodiode becomes large and it is possible to attempt a high sensitivity even in the case of a minute pixel. Then, the first, the second and the third semiconductor chips 52, 53 and 54 are laminated and mutual electric connections thereof are carried out by means of the micro bumps 83 and the penetration contact portions 84, so that it is possible to make wirings of the mutual connections the shortest and to accumulate data of the photodiode in the memory element array at a high speed, and simultaneous shuttering of all the pixels becomes possible. Accordingly, it is possible to manufacture a semiconductor image sensor module provided with a CMOS image sensor, that has a high sensitivity and that is capable of simultaneous electronic shuttering.

In the exemplified embodiment of FIG. 26, the second semiconductor chip 53 in which the analog/digital converter array has been formed is laminated so as to be connected on the front face side of the first semiconductor chip 52 in which the CMOS image sensor has been formed, with the second semiconductor chip 53 faced downward, but instead of this configuration, it is allowed to employ a configuration that connection between the first semiconductor chip 52 and the second semiconductor chip 53 is performed by a penetration contact portion which passes through the second semiconductor chip 53.

It is possible to manufacture also the semiconductor image sensor module 99 according to the second exemplified embodiment shown in FIG. 6 fundamentally by a manufacturing method similar to the one shown in FIG. 25.

In addition, it is possible to manufacture the semiconductor image sensor module 100 according to the third exemplified embodiment in FIG. 22 by providing micro bumps to the pads of the fourth semiconductor chip 55 in which the analog type nonvolatile memory array has been formed according to the process of FIG. 25B and by connecting the fourth semiconductor image sensor module 55 with the first semiconductor chip 52 with the fourth semiconductor image sensor module 55 faced downward.

Figure 27A:
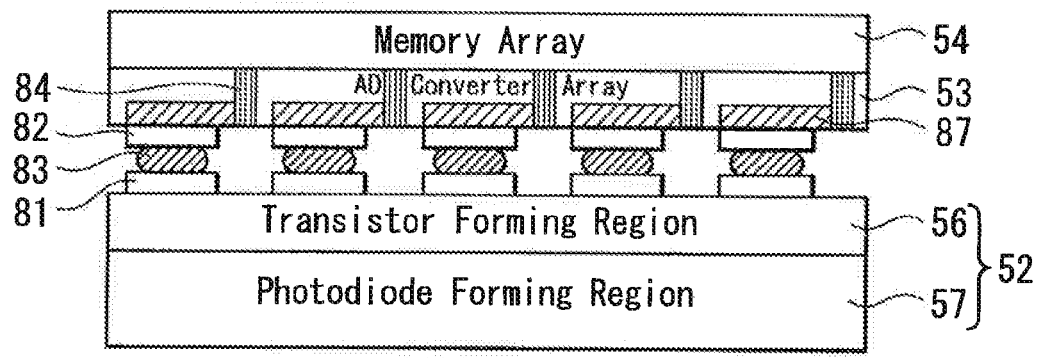
FIGS. 27A and 27B are outlined constitution diagrams respectively showing a fourth exemplified embodiment of a semiconductor image sensor module according to the present invention.
Figure 27B:
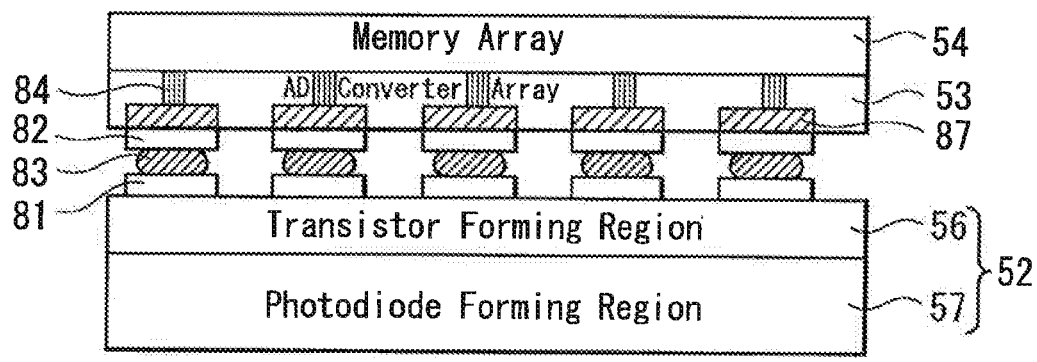

There are shown in FIGS. 27A and 27B general constitutions of a fourth exemplified embodiment of a semiconductor image sensor module according to the present invention. Semiconductor image sensor modules 166 and 167 according to this exemplified embodiment are constituted similarly as described above by laminating the first semiconductor chip 52 provided with the CMOS image sensor 60 in which a plurality of pixels are arranged regularly and each pixel is constituted by the photodiode forming region 57 and the transistor forming region 56, the second semiconductor chip 53 provided with an analog/digital converter array composed of a plurality of analog/digital converters, and the third semiconductor chip 54 provided with a memory element array including at least a decoder and a sense amplifier. The first semiconductor chip 52 and the second semiconductor chip 53 are electrically connected between the pads 81 and 82 for connection, which have been formed respectively, through, for example, the bumps (micro bumps) 83. Also, the second semiconductor chip 53 and the third semiconductor chip 54 are joined each other such that the analog/digital converters and the memory elements are connected electrically through penetration contact portions 84 passing through the second semiconductor chip 53. Then, in this exemplified embodiment, the analog/digital converters 87 are formed on the undersurface side of the second semiconductor chip 53.

The semiconductor image sensor module 166 in FIG. 27A is an example in which the penetration contact portion 84 is not connected with the pad 82 directly and is formed deviated from the position immediately above the pad 82. In other words, this semiconductor image sensor module 166 is suitably applied to a case in which it is not desired to directly connect the penetration contact portion 84 with the pad 82.

The semiconductor image sensor module 167 of FIG. 27B is an example in which the penetration contact portion 84 is formed just above the pad 82. FIG. 27B is a schematic diagram, and it appears as if the analog/digital converter 87 intervenes between the penetration contact portion 84 and the pad 82, but actually, it is formed such that the penetration contact portion 84 is connected with the pad 82 directly and the analog/digital converter is formed around the penetration contact portion 84. In other words, this semiconductor image sensor module 167 is suitably applied to a case in which it is desired to directly connect the penetration contact portion 84 with the pad 82.

According to the semiconductor image sensor modules 166 and 167 in the fourth exemplified embodiment in FIGS. 27A and 27B, it is possible to transmit signals to the analog/digital converter 87 without picking up a noise in the penetration contact portion 84.

Figure 28A:
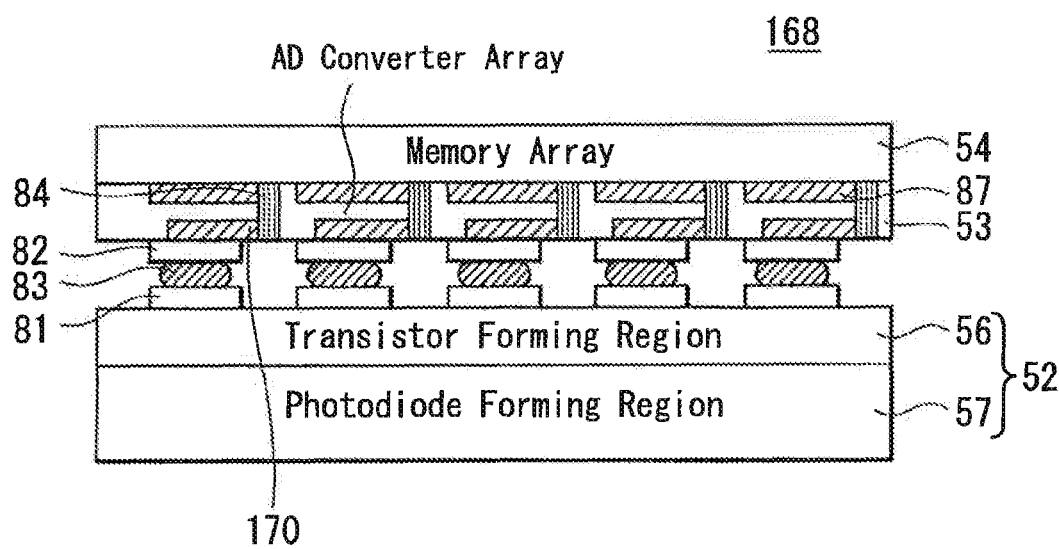
FIGS. 28A and 28B are outlined constitution diagrams respectively showing a fifth exemplified embodiment of a semiconductor image sensor module according to the present invention.
Figure 28B:
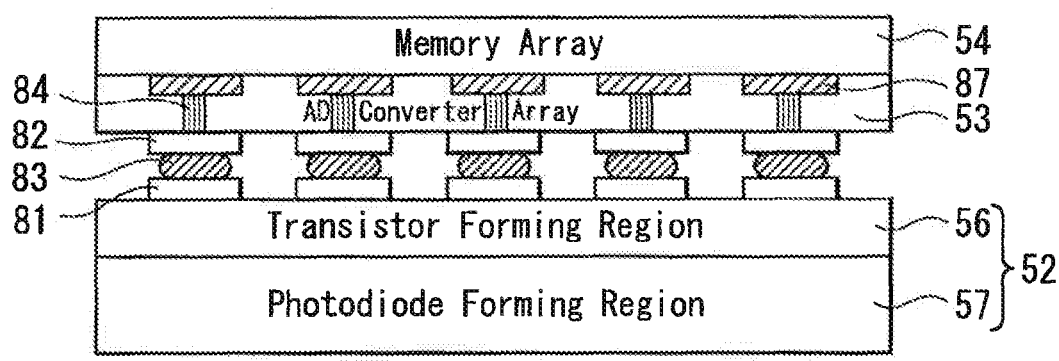

There are shown in FIGS. 28A and 28B general constitutions of a fifth exemplified embodiment of a semiconductor image sensor module according to the present invention. Semiconductor image sensor modules 168 and 169 according to this exemplified embodiment is constituted similarly as mentioned above by laminating the first semiconductor chip 52 provided with the CMOS image sensor 60 in which a plurality of pixels are arranged regularly, the second semiconductor chip 53 provided with an analog/digital converter array composed of a plurality of analog/digital converters, and the third semiconductor chip 54 provided with a memory element array including at least a decoder and a sense amplifier. The first semiconductor chip 52 and the second semiconductor chip 53 are electrically connected between the pads 81 and 82 for connection which have been formed respectively, through, for example, the bumps (micro bumps) 83. Also, the second semiconductor chip 53 and the third semiconductor chip 54 are joined each other such that the analog/digital converter and the memory elements are connected electrically through penetration contact portions 84 passing through the second semiconductor chip 53. Then, in this exemplified embodiment, the analog/digital converters 87 are formed on the upper surface side of the second semiconductor chip 53. The signal of each pixel from the first semiconductor chip 52 passes through the penetration contact portion 84 and is analog/digital converted by the analog/digital converter 87.

The semiconductor image sensor module 168 in FIG. 28A is an example in which the penetration contact portion 84 is not connected with the pad 82 directly and is formed deviated from the position immediately above the pad 82. In this case, a wiring layer 170 connected with the pad 82 is formed on the undersurface side of the second semiconductor chip 53, and the pad 82 and the penetration contact portion 84 are connected electrically through this wiring layer 170. In other words, this semiconductor image sensor module 168 is suitably applied to a case that it is not desired to connect the penetration contact portion 84 with the pad 82 directly.

The semiconductor image sensor module 169 of FIG. 28B is an example in which the penetration contact portion 84 is formed just above the pad 82. Also, FIG. 28B is a schematic diagram, and similarly as mentioned above, the penetration contact portion 84 is connected with the analog/digital converter 87 so as to be positioned at the center portion of the analog/digital converter 87 on the upper surface side. In other words, this semiconductor image sensor module 169 is suitably applied to a case that it is desired to connect the penetration contact portion 84 with the pad 82 directly.

The semiconductor image sensor modules 168 and 169 according to the fifth exemplified embodiment of FIGS. 28A and 28B are preferably applied to a case that distortion is large on the undersurface side of the second semiconductor chip 53 and it is difficult to form the analog/digital converter 87 on the undersurface side.

Figure 29A:
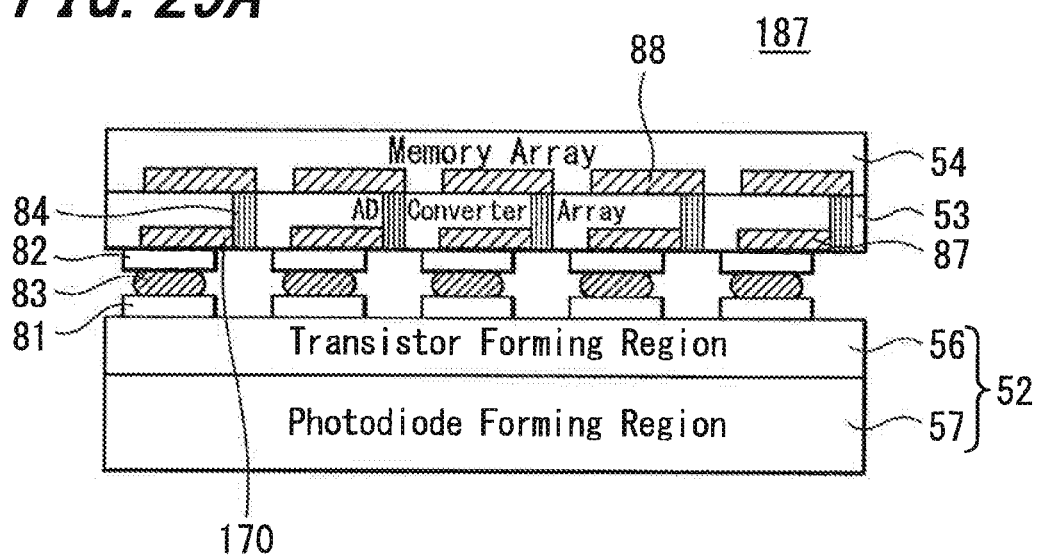
FIGS. 29A and 29B are outlined constitution diagrams respectively showing a sixth exemplified embodiment of a semiconductor image sensor module according to the present invention.
Figure 29B:
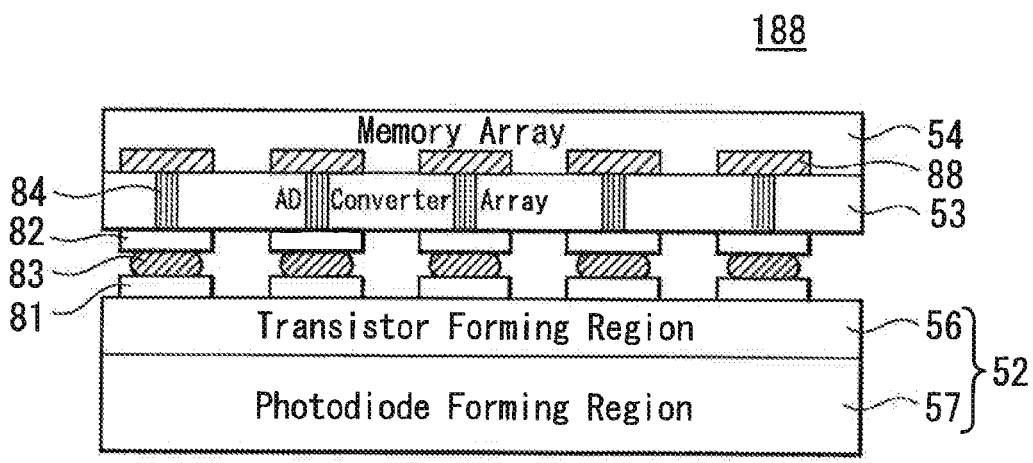

There are shown in FIGS. 29A and 29B general constitutions of a sixth exemplified embodiment of a semiconductor image sensor module according to the present invention. Semiconductor image sensor modules 187 and 188 according to this exemplified embodiment are constituted similarly as mentioned above by laminating the first semiconductor chip 52 provided with the CMOS image sensor 60 in which a plurality of pixels are arranged regularly and each pixel is constituted by the photodiode forming region 57 and the transistor forming region 56, the second semiconductor chip 53 provided with an analog/digital converter array composed of a plurality of analog/digital converters, and the third semiconductor chip 54 provided with a memory element array including at least a decoder and a sense amplifier. The first semiconductor chip 52 and the second semiconductor chip 53 are electrically connected between the pads 81 and 82 for connection which have been formed respectively, through, for example, the bumps (micro bumps) 83. Also, the second semiconductor chip 53 and the third semiconductor chip 54 are joined each other such that the analog/digital converter and the memory elements are connected electrically through penetration contact portions 84 passing through the second semiconductor chip 53. Then, in this exemplified embodiment, the memory array blocks 88 are formed on the undersurface side of the third semiconductor chip 54. The signal analog/digital converted by the analog/digital converter array of the second semiconductor chip 53 is stored in the memory array block 88.

The semiconductor image sensor module 187 in FIG. 29A is an example in which the penetration contact portion 84 in the second semiconductor chip 53 is not connected with the pad 82 directly and is formed deviated from the position immediately above the pad 82. In this case, a wiring layer 170 connected with the pad 82 is formed on the undersurface side of the second semiconductor chip 53, and the pad 82 and the penetration contact portion 84 are connected electrically through this wiring layer 170. In other words, this semiconductor image sensor module 187 is suitably applied to a case in which it is not desired to connect the penetration contact portion 84 in the second semiconductor chip 53 and the pad 82 directly.

The semiconductor image sensor module 188 of FIG. 29B is an example in which the penetration contact portion 84 in the second semiconductor chip 53 is formed just above the pad 82. In other words, this semiconductor image sensor module 188 is suitably applied to a case in which the penetration contact portion 84 in the second semiconductor chip 53 and the pad 82 are connected directly.

The semiconductor image sensor modules 187 and 188 according to the fifth exemplified embodiment of FIGS. 29A and 29B are preferably applied to a case in which distortion is large on the upper surface side of the third semiconductor chip 54 and it is difficult to form the memory array block 88 on the upper surface side.

Figure 30A:
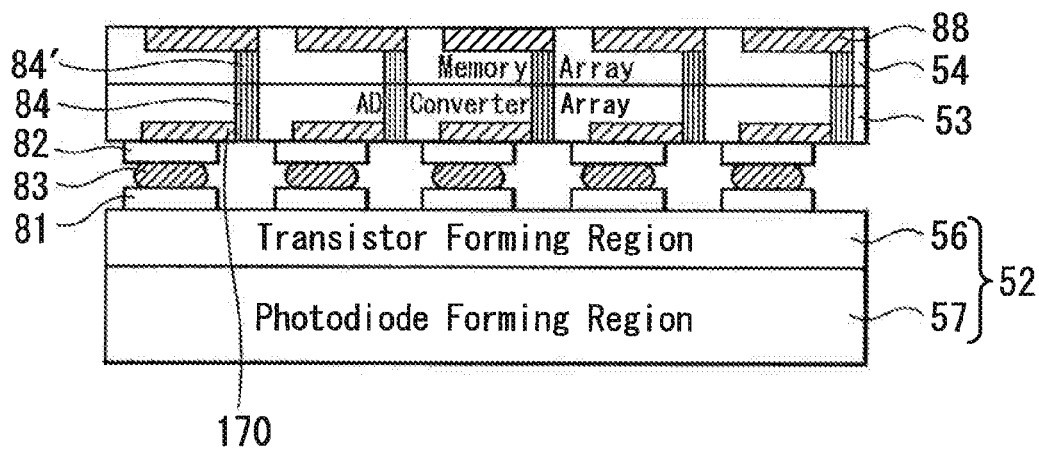
FIGS. 30A and 30B are outlined constitution diagrams respectively showing a seventh exemplified embodiment of a semiconductor image sensor module according to the present invention.
Figure 30B:
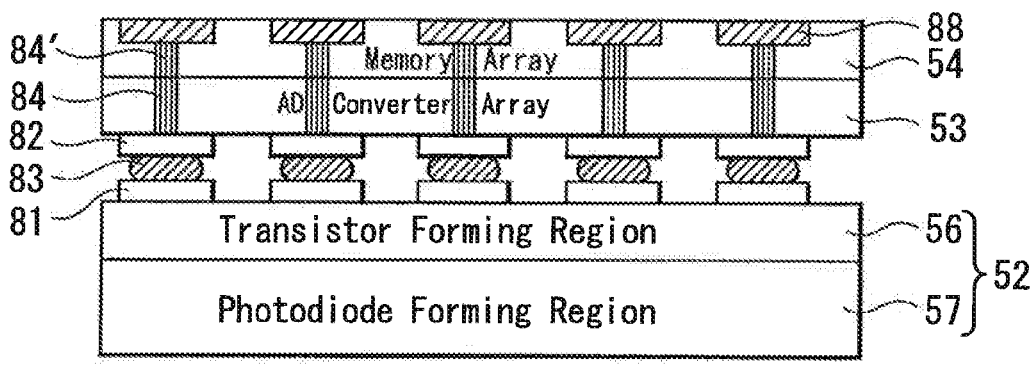

There are shown in FIGS. 30A and 30B outlines of a seventh exemplified embodiment of a semiconductor image sensor module according to the present invention. Semiconductor image sensor modules 189 and 190 according to this exemplified embodiment is constituted similarly as mentioned above by laminating the first semiconductor chip 52 provided with the CMOS image sensor 60 in which a plurality of pixels are arranged regularly and each pixel is constituted by the photodiode forming region 57 and the transistor forming region 56, the second semiconductor chip 53 provided with an analog/digital converter array composed of a plurality of analog/digital converters, and the third semiconductor chip 54 provided with a memory element array including at least a decoder and a sense amplifier. The first semiconductor chip 52 and the second semiconductor chip 53 are electrically connected between the pads 81 and 82 for connection which have been formed respectively, through, for example, the bumps (micro bumps) 83. Also, the second semiconductor chip 53 and the third semiconductor chip 54 are joined each other such that the analog/digital converter and the memory elements are connected electrically through penetration contact portions 84 passing through the second semiconductor chip 53 and penetration contact portions 84' passing through the third semiconductor chip 53. Then, in this exemplified embodiment, the memory array blocks 88 are formed on the upper surface side of the third semiconductor chip 54, and the penetration contact portions 84 and 84' are connected so as to face each other. The signal analog/digital converted by the analog/digital converter array of the second semiconductor chip 53 is stored in the memory array block 88 by way of the penetration contact portions 84 and 84'.

The semiconductor image sensor module 189 in FIG. 30A is an example in which the penetration contact portion 84 in the second semiconductor chip 53, which is connected with the penetration contact portion 84' in the third semiconductor chip 54, is not connected with the pad 82 directly and is formed deviated from the position immediately above the pad 82. In this case, a wiring layer 170 connected with the pad 82 is formed on the undersurface side of the second semiconductor chip 53, and the pad 82 and the penetration contact portion 84 are connected electrically through this wiring layer 170. In other words, this semiconductor image sensor module 187 is suitably applied to a case in which it is not desired to connect the penetration contact portion 84 in the second semiconductor chip 53 and the pad 82 directly.

The semiconductor image sensor module 190 of FIG. 30B is an example in which the penetration contact portion 84 in the second semiconductor chip 53, which is connected with the penetration contact portion 84' in the third semiconductor chip 54, is formed just above the pad 82. In other words, this semiconductor image sensor module 190 is suitably applied to a case in which the penetration contact portion 84 in the second semiconductor chip 53 and the pad 82 are connected directly.

The semiconductor image sensor modules 189 and 190 according to FIGS. 30A and 30B are preferably applied to a case in which distortion is large on the undersurface side of the third semiconductor chip 54 and it is difficult to form the memory array block 88 on the undersurface side.

Figure 31A:
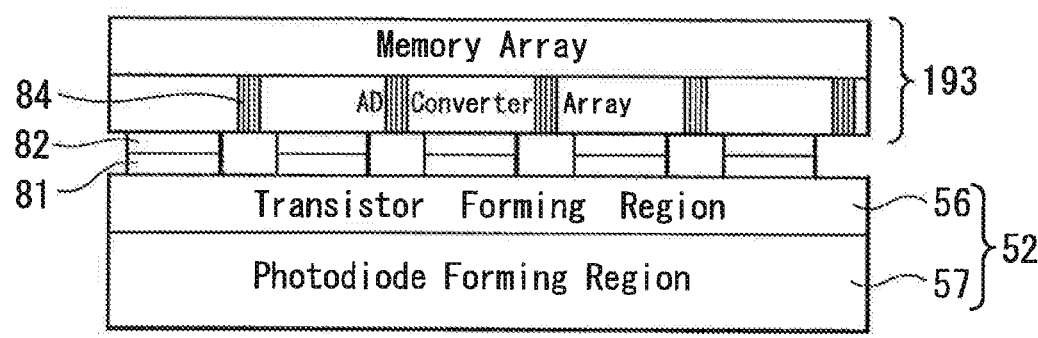
FIGS. 31A and 31B are outlined constitution diagrams respectively showing an eighth exemplified embodiment of a semiconductor image sensor module according to the present invention.
Figure 31B:
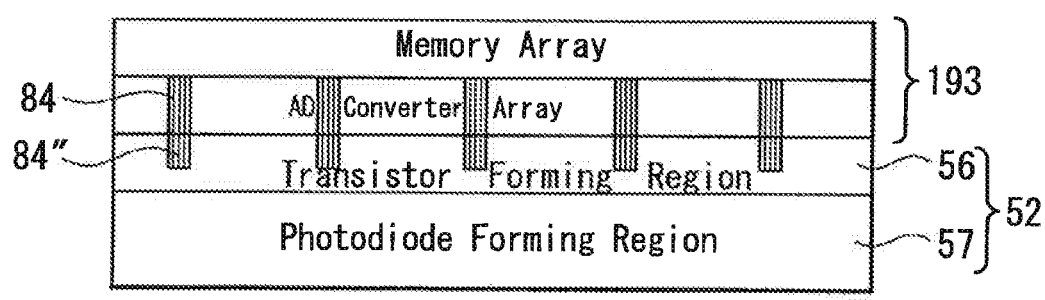

There are shown in FIGS. 31A and 31B outlines of an eighth exemplified embodiment of a semiconductor image sensor module according to the present invention. Semiconductor image sensor modules 189 and 190 according to this exemplified embodiment are constituted by laminating the first semiconductor chip 52 and a second semiconductor chip 193. The first semiconductor chip 52 is provided with the CMOS image sensor 60 in which a plurality of pixels are arranged regularly and each pixel is constituted by the photodiode forming region 57 and the transistor forming region 56 the CMOS image sensor 60. The second semiconductor chip 193 is provided with an analog/digital converter array composed of a plurality of analog/digital converters on the lower portion side and at the same time provided with a memory element array including at least a decoder and a sense amplifier on the upper portion side. Also, in the second semiconductor chip 193, the analog/digital converters and the memory elements are connected electrically through the penetration contact portions 84 which pass through the region in which the analog/digital converter array is formed.

The semiconductor image sensor module 191 of FIG. 31A is constituted such that the pads 82 are formed on the undersurface of the second semiconductor chip 193, the pads 81 are formed on the upper surface of the first semiconductor chip 52, and the first semiconductor chip 52 and the second semiconductor chip 193 are pressed to contact each other while applying heat so as to connect the pad 82 and 81. By bonding the region other than the pads 81 and 82 by means of adhesive material, the bonding strength between the first and the second semiconductor chips 52 and 193 is further intensified.

In the semiconductor image sensor module 192 of FIG. 31B, pads are not formed, the penetration contact portions 84 are formed in the region in which the analog/digital converter array is formed on the lower portion side of the second semiconductor chip 193, and contact portion 84" are formed in the transistor forming region 56 of the first semiconductor chip 52. Then, the semiconductor image sensor module 192 is constituted by connecting the first semiconductor chip 52 and the second semiconductor chip 193 by causing the contact portions 84 and 84" to face each other and to contact each other by applying heat and pressure.

Figure 32A:
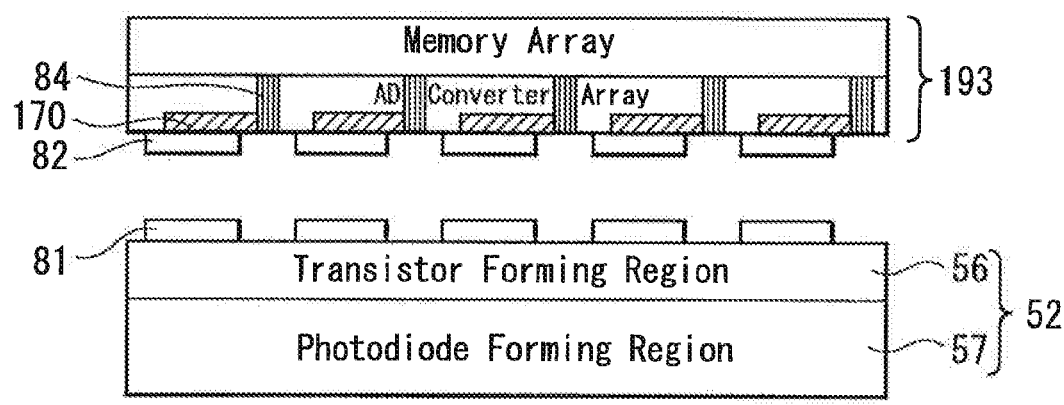
FIGS. 32A and 32B are outlined constitution diagrams showing a ninth exemplified embodiment of a semiconductor image sensor module according to the present invention together with a manufacturing method thereof.

There are shown in FIG. 32 outlines of a ninth exemplified embodiment of a semiconductor image sensor module according to the present invention together with a method of manufacturing the same. In the semiconductor image sensor module 194 according to this exemplified embodiment, first, as shown in FIG. 32A, the first semiconductor chip 52 and the second semiconductor chip 193 are formed. The first semiconductor chip 52 is provided with the CMOS image sensor 60 in which a plurality of pixels are arranged regularly and each pixel is constituted by the photodiode forming region 57 and the transistor forming region 56, and the pads 81 are formed on the upper surface of the transistor forming region 56. The second semiconductor chip 193 is provided with an analog/digital converter array composed of a plurality of analog/digital converters on the lower portion side and at the same time is provided with a memory element array including at least a decoder and a sense amplifier on the upper portion side. In this second semiconductor chip 193, the pads 82 are formed on the undersurface of the lower side portion in which the analog/digital converter array has been formed, the penetration contact portions 84 which pass through the lower side portion are formed, and at the same time, the pads 82 and the penetration contact portions 84 are connected through the wiring layers 170.

Figure 32B:
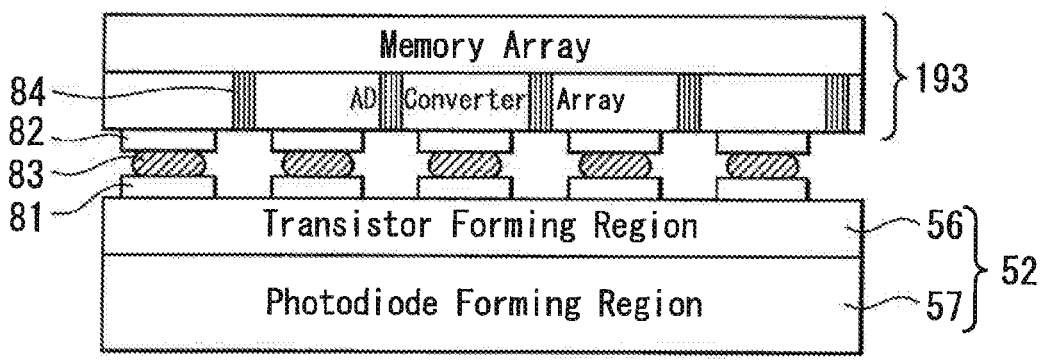

Next, as shown in FIG. 32B, the pads 81 of the first semiconductor chip 52 and the pads 82 of the second semiconductor chip 193 are joined through the bumps (micro bumps) 83 by applying heat and pressure. Parallel connection in units of several pixels becomes possible by means of these bumps 83. In this manner, the semiconductor image sensor module 194 according to the ninth exemplified embodiment is manufactured.

Figure 33A:
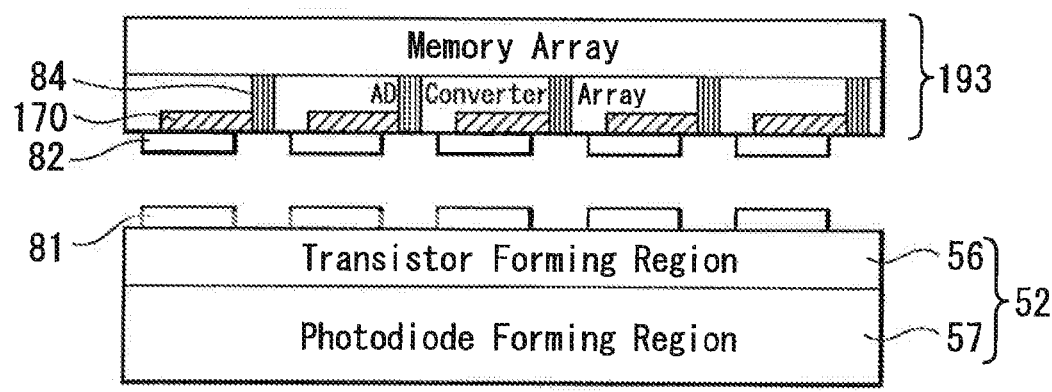
FIGS. 33A and 33B are manufacturing process diagrams showing a manufacturing method of the semiconductor image sensor module according to the eighth exemplified embodiment in FIG. 31A.

There is shown in FIG. 33 a manufacturing method of the semiconductor image sensor module 191 of FIG. 31A. First, as shown in FIG. 33A, the first semiconductor chip 52 and the second semiconductor chip 193 are formed. The first semiconductor chip 52 is provided with the CMOS image sensor 60 in which a plurality of pixels are arranged regularly and each pixel is constituted by the photodiode forming region 57 and the transistor forming region 56, and the pads 81 are formed on the upper surface of the transistor forming region 56. The second semiconductor chip 193 is provided with an analog/digital converter array composed of a plurality of analog/digital converters on the lower portion side and at the same time is provided with a memory element array including at least a decoder and a sense amplifier on the upper portion side. In this second semiconductor chip 193, the pads 82 are formed on the undersurface of the lower side portion in which the analog/digital converter array is formed, the penetration contact portions 84 which pass through the lower side portion are formed, and at the same time, the pads 82 and the penetration contact portions 84 are connected through the wiring layers 170.

Figure 33B:
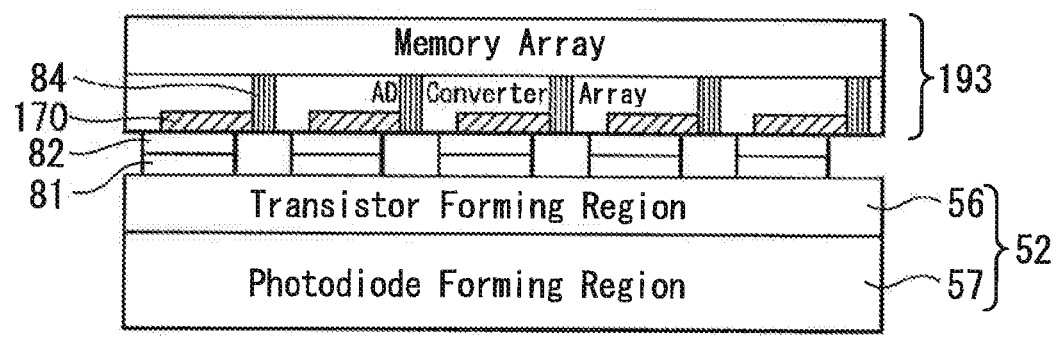

Next, as shown in FIG. 33B, the first semiconductor chip 52 and the second semiconductor chip 193 are joined by applying heat and pressure such that the pads 81 and 82 are connected facing each other. By forming the pads 81 and 82 small, parallel connection in units of several pixels becomes possible. By bonding the region other than the connection region of the pads 81 and 82 by means of adhesive material, the bonding strength is further intensified. In this manner, the semiconductor image sensor module 191 of FIG. 31A is manufactured.

Figure 34A:
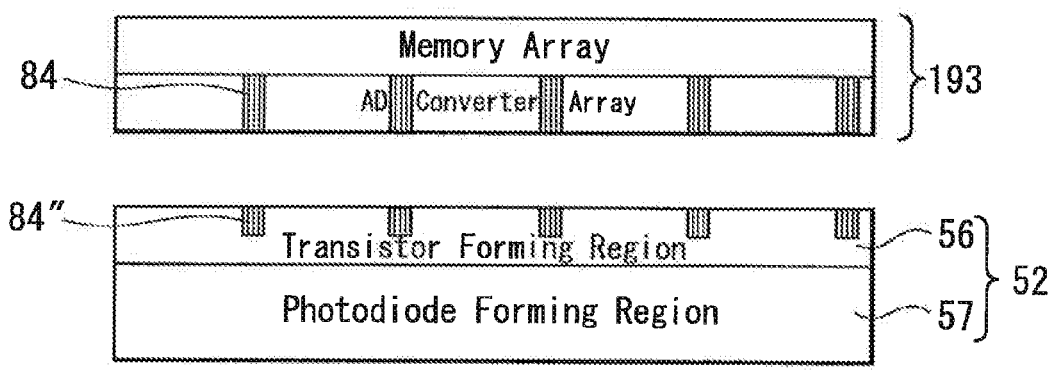
FIGS. 34A and 34B are manufacturing process diagrams showing a manufacturing method of the semiconductor image sensor module according to the eighth exemplified embodiment in FIG. 31B.

There is shown in FIG. 34 a manufacturing method of the semiconductor image sensor module 192 of FIG. 31B. First, as shown in FIG. 34A, the first semiconductor chip 52 and the second semiconductor chip 193 are formed. The first semiconductor chip 52 is provided with the CMOS image sensor 60 in which a plurality of pixels are arranged regularly and each pixel is constituted by the photodiode forming region 57 and the transistor forming region 56, and the contact portions 84" are formed in the transistor forming region 56. The second semiconductor chip 193 is provided with an analog/digital converter array composed of a plurality of analog/digital converters on the lower portion side and at the same time is provided with a memory element array including at least a decoder and a sense amplifier on the upper portion side. In this second semiconductor chip 193, the penetration contact portions are formed on the lower side portion in which the analog/digital converter array has been formed, so as to pass therethrough. No pads are formed on the first and the second semiconductor chips 52 and 193.

Figure 34B:
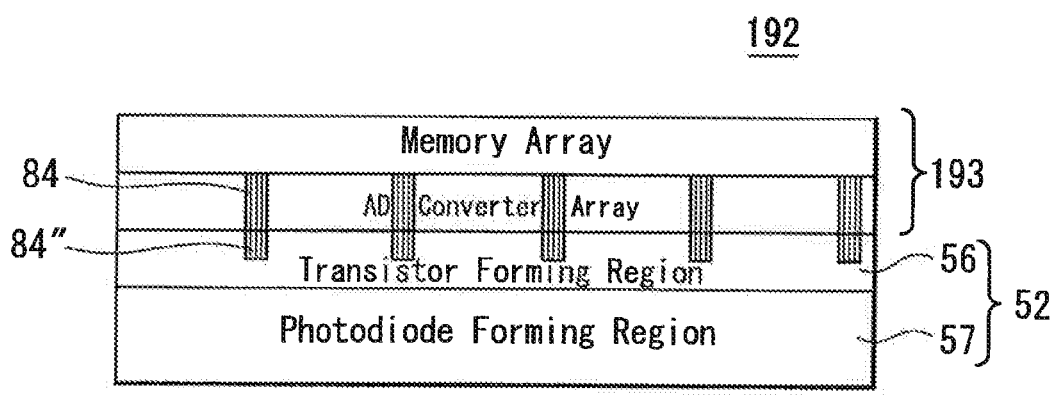

Next, as shown in FIG. 34B, the first semiconductor chip 52 and the second semiconductor chip 193 are joined by applying heat and pressure such that the contact portion 84" and the penetration contact portion 84 are connected facing each other. In this manner, the semiconductor image sensor module 192 of FIG. 31B is manufactured. In this manufacturing method, alignment is difficult, but it is possible to increase the number of pixels per unit area to the utmost. Also, in the exemplified embodiments in FIG. 32 to FIG. 34, it is possible in the semiconductor image sensor module 192 of FIG. 34 to make the height from the undersurface of the first semiconductor chip to the upper surface of the second semiconductor chip the smallest.

Figure 35A:
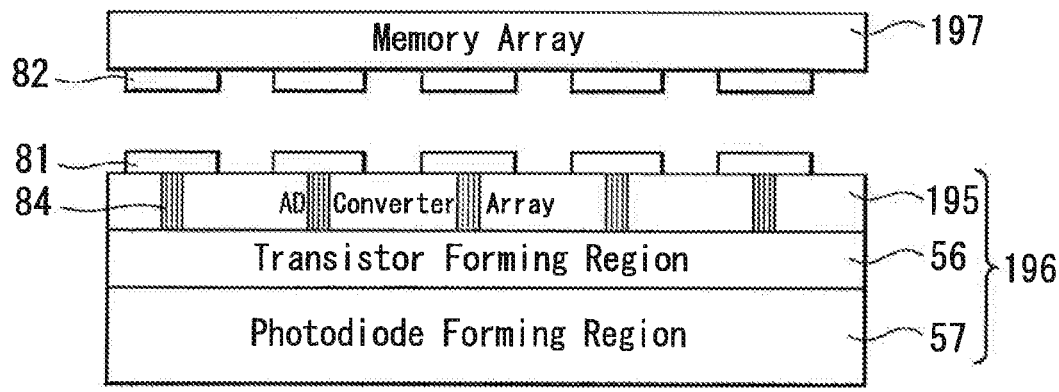
FIGS. 35A and 35B are outlined constitution diagrams showing a tenth exemplified embodiment of a semiconductor image sensor module according to the present invention together with a manufacturing method thereof.

There are shown in FIGS. 35 to 37 outlines of tenth to twelfth exemplified embodiments of a semiconductor image sensor module according to the present invention together with a method of manufacturing the same. The semiconductor image sensor modules according to the tenth to twelfth exemplified embodiments are constituted by joining a first semiconductor chip 196 including the photodiode forming region 57, the transistor forming region 56, and the analog/digital converter array 195, and a second semiconductor chip 197 in which a memory array has been formed. In the first semiconductor chip 196, the analog/digital converter array 195 is connected on the side of the transistor forming region 56. By employing such a constitution, the analog signal generated in the photodiode forming region 57 can be converted to a digital signal by the analog/digital converter without picking up a noise in, for example, the bumps (micro bumps) 83 in FIG. 32B. For this reason, the final picture output signal contains less noise.

There is shown in FIG. 35 a semiconductor image sensor module of the tenth exemplified embodiment. In a semiconductor image sensor module 198 according to this exemplified embodiment, the first semiconductor chip 196 and the second semiconductor chip 197 are formed. The first semiconductor chip 196 is constituted to include the CMOS image sensor constituted by the photodiode forming region 57 formed on the lower portion side and the transistor forming region 56 formed in the intermediate portion and the analog/digital converter array 195 formed on the upper portion side. In the region in which the analog/digital converter array 195 has been formed, there are formed the penetration contact portions 84, and the pads 81 connected with the penetration contact portions 84 are formed on the upper surface. The second semiconductor chip 197 is constituted by forming a memory array and by forming the pad 82 on the undersurface.

Figure 35B:
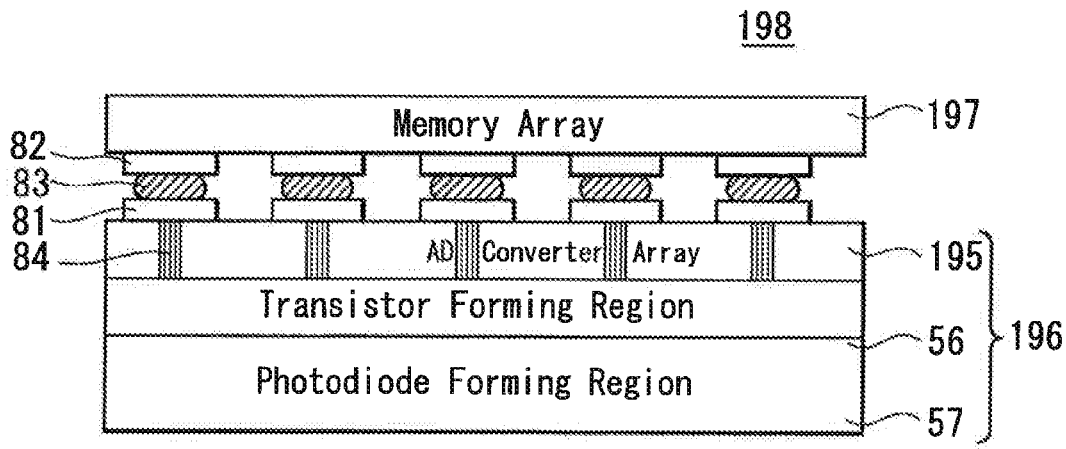

Next, as shown in FIG. 35B, the first semiconductor chip 196 and the second semiconductor chip 197 are joined by forming the bumps (micro bumps) 83 between the pads 81 and the pads 82 and by applying heat and pressure In this manner, the semiconductor image sensor-block 198 of the tenth exemplified embodiment is manufactured. In this semiconductor image sensor-block 198, parallel connection in units of several pixels becomes possible by means of the bumps 83.

Figure 36A:
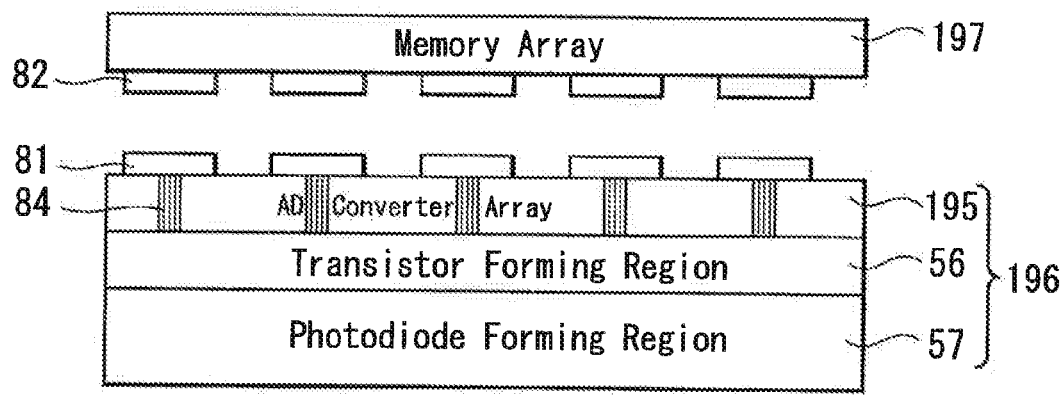
FIGS. 36A and 36B are outlined constitution diagrams showing an eleventh exemplified embodiment of a semiconductor image sensor module according to the present invention together with a manufacturing method thereof.

There is shown in FIG. 36 a semiconductor image sensor module of an eleventh exemplified embodiment. With respect to the semiconductor image sensor module 199 according to this exemplified embodiment, first, as shown in FIG. 36A, the first semiconductor chip 196 and the second semiconductor chip 197 are formed similarly as mentioned above. The constitutions of the first semiconductor chip 196 and the second semiconductor chip 197 are similar to those of FIG. 35, so that detailed explanations thereof will be omitted by putting the same reference numerals on the corresponding portions thereof.

Figure 36B:
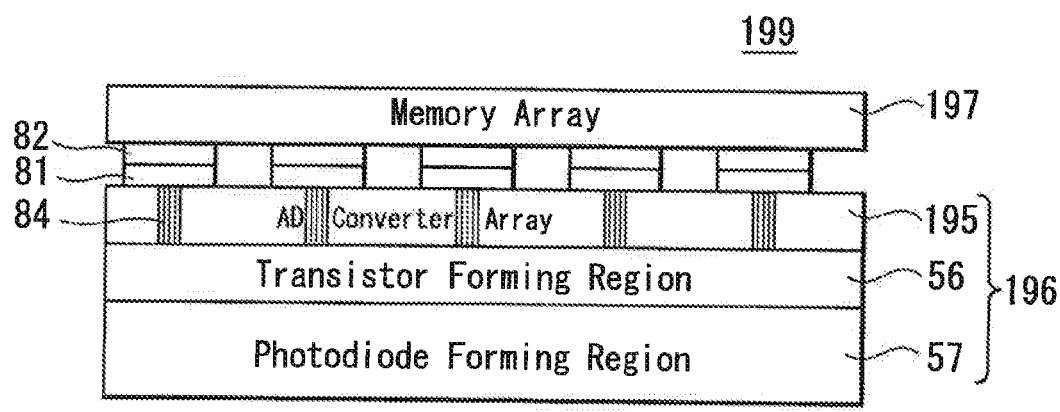

Next, as shown in FIG. 36B, the first semiconductor chip 196 and the second semiconductor chip 197 are joined by applying heat and pressure such that the pads 81 and 82 are connected facing each other. In this manner, the semiconductor image sensor-block 199 of the eleventh exemplified embodiment is manufactured. In this semiconductor image sensor module 199, by forming the pads 81 and 82 small, parallel connection in units of several pixels becomes possible. It should be noted that by bonding the region other than the connection region of the pads 81 and 82 by means of adhesive material, the bonding strength between the first and the second semiconductor chips 196 and 197 is further intensified.

Figure 37A:
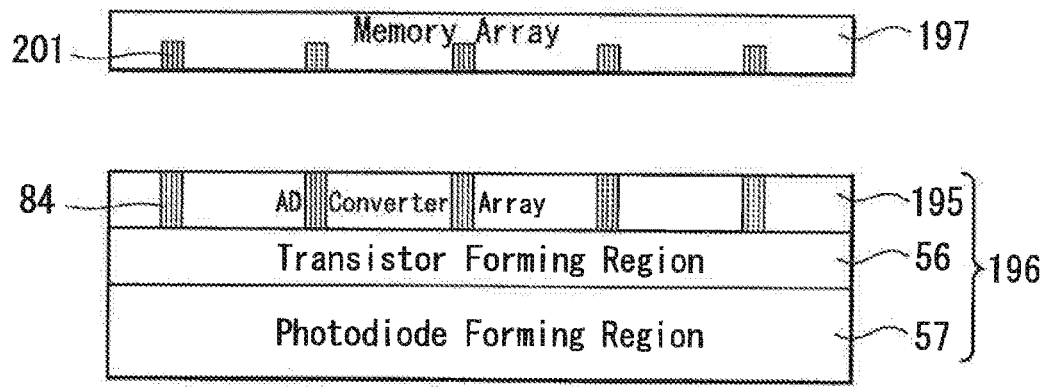
FIGS. 37A and 37B are outlined constitution diagrams showing a twelfth exemplified embodiment of a semiconductor image sensor module according to the present invention together with a manufacturing method thereof.

There is shown in FIG. 37 a semiconductor image sensor module of a twelfth exemplified embodiment. With respect to the semiconductor image sensor module 200 according to this exemplified embodiment, first, as shown in FIG. 37A, the first semiconductor chip 196 and the chip 197 are formed similarly as mentioned above. The constitution of the first semiconductor chip 196 is similar to the one of FIG. 35 other than that no pads are formed, so that detailed explanations thereof will be omitted by putting the same reference numerals on the corresponding portions thereof. Also, the second semiconductor chip 197 is constituted by forming a memory array and at the same time by forming contact portions 201 so as to be exposed to the undersurface. Various forms of the contact portion 201 can be conceived and, for example, it is also possible to form it so as to pass therethrough. No pads are formed in this second semiconductor chip 197.

Figure 37B:
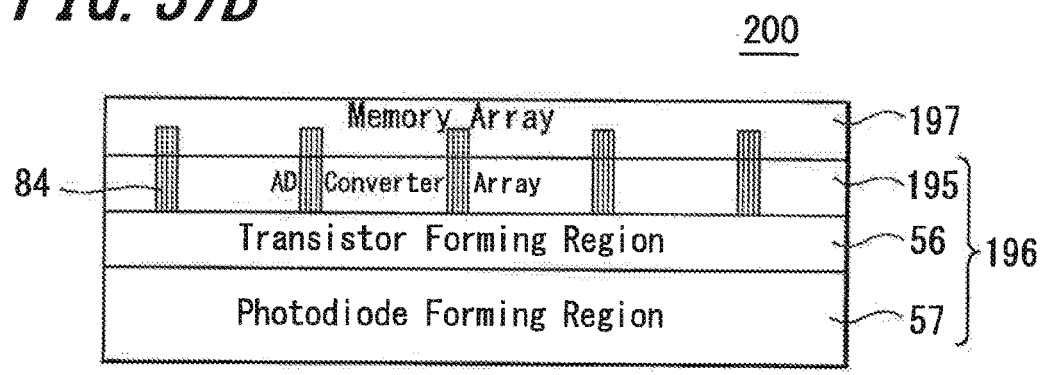

Next, as shown in FIG. 37B, the first semiconductor chip 196 and the second semiconductor chip 197 are joined by applying heat and pressure such that the penetration contact portions 84 and the contact portions 201 are connected facing each other. In this manner, the semiconductor image sensor module 200 of the twelfth exemplified embodiment is manufactured. In the manufacturing method of the semiconductor image sensor module 200 according to this twelfth exemplified embodiment, alignment is difficult, but it is possible to increase the number of pixels per unit area to the utmost. Also, in the exemplified embodiments from the tenth exemplified embodiment to the twelfth exemplified embodiment, it is possible in the semiconductor image sensor module 200 of the second exemplified embodiment to make the height from the undersurface of the first semiconductor chip 196 to the upper surface of the second semiconductor chip 197 the smallest.

Next, it will be explained with respect to a thirteenth exemplified embodiment of a semiconductor image sensor module according to the present invention. The semiconductor image sensor module according to this exemplified embodiment has a constitution in respective exemplified embodiments described above such that the floating diffusion is shared by a plurality of pixels in the transistor forming region thereof. Thereby, it is possible to increase the photodiode area per unit pixel area.

In addition, it is possible to employ a constitution that under a condition that the floating diffusion is shared by a plurality of pixels in the transistor forming region, further, the amplifier transistor is also shared by a plurality of pixels. With this constitution also, it is possible to further increase the photodiode area per unit pixel area.

Figure 38:
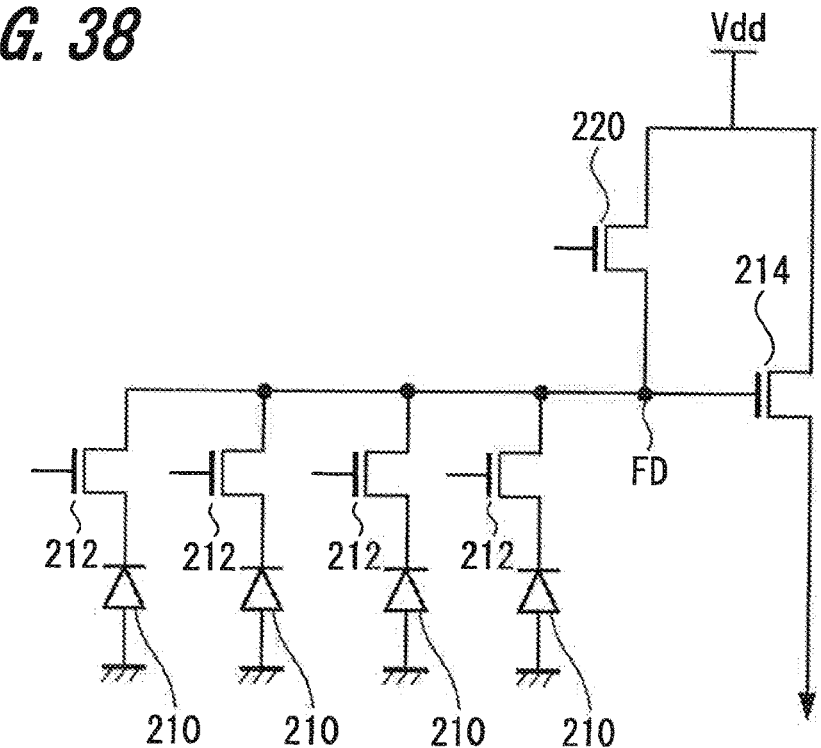
FIG. 38 is an equivalent circuit diagram used for explanation of a thirteenth exemplified embodiment of a semiconductor image sensor module according to the present invention.

There is shown in FIG. 38 an equivalent circuit in a pixel in a case that a portion of the pixel transistor circuit is shared by four pixels in the transistor forming region.

This equivalent circuit is constituted such that there are provided separate transfer transistors 212 corresponding to four light receiving portions (photodiodes PD) 210 of four pixels, these transfer transistors 212 are connected with a common floating diffusion (FD) portion to share one amplifier transistor 214 and one reset transistor 220 or the like in the subsequent stage. The signal charge is connected to a signal output line through the amplifier transistor 214. It is also possible to switch the output to the signal output line by providing a transfer transistor between the amplifier transistor 214 and the signal output line.

It is possible to apply the pixel structure sharing this floating diffusion portion with a plurality of pixels to the back-illuminated type CMOS image sensor according to the present invention. For example, when the micro bump requires an area corresponding to 4 pixels, the floating diffusion FD, the amplifier transistor 214, and the reset transistor 220 are shared by 4 pixels. In this manner, even in a case that the necessary area of the micro bump is large, it needs not design one pixel with a large area corresponding to the necessary area of the micro bump thereof, so that it is possible to increase the number of pixels per unit area.

Also, the description has been made with respect to a case that a portion of the pixel transistor circuit is shared by four pixels in the transistor forming region, but a case is also conceivable that a portion of the pixel transistor circuit is shared by three pixels in the transistor forming region or a case that a portion of the pixel transistor circuit is shared by six pixels in the transistor forming region.

Next, it will be explained with respect to a fourteenth exemplified embodiment of a semiconductor image sensor module according to the present invention. The semiconductor image sensor module according to this exemplified embodiment is constituted by being equipped with color coating technology that arranges pixels in a zigzag (in so-called oblique arrangement). With the constitution of this pixel arrangement, the imaginary number of pixels per unit pixel area is increased as compared with a square pixel arrangement. It is possible to apply this pixel arrangement to the back-illuminated type CMOS image sensor according to the present invention. For example, in a case that the micro bump requires an area for a plurality of pixels, if the floating diffusion FD is shared by a plurality of pixels as in the thirteenth exemplified embodiment described above, it needs not design one pixel with a large area corresponding to the necessary area of the micro bump. Consequently, is possible to increase the number of pixels per unit area, and further, the imaginary number of pixels per unit pixel area is increased as compared with a square pixel arrangement.

Figure 39:
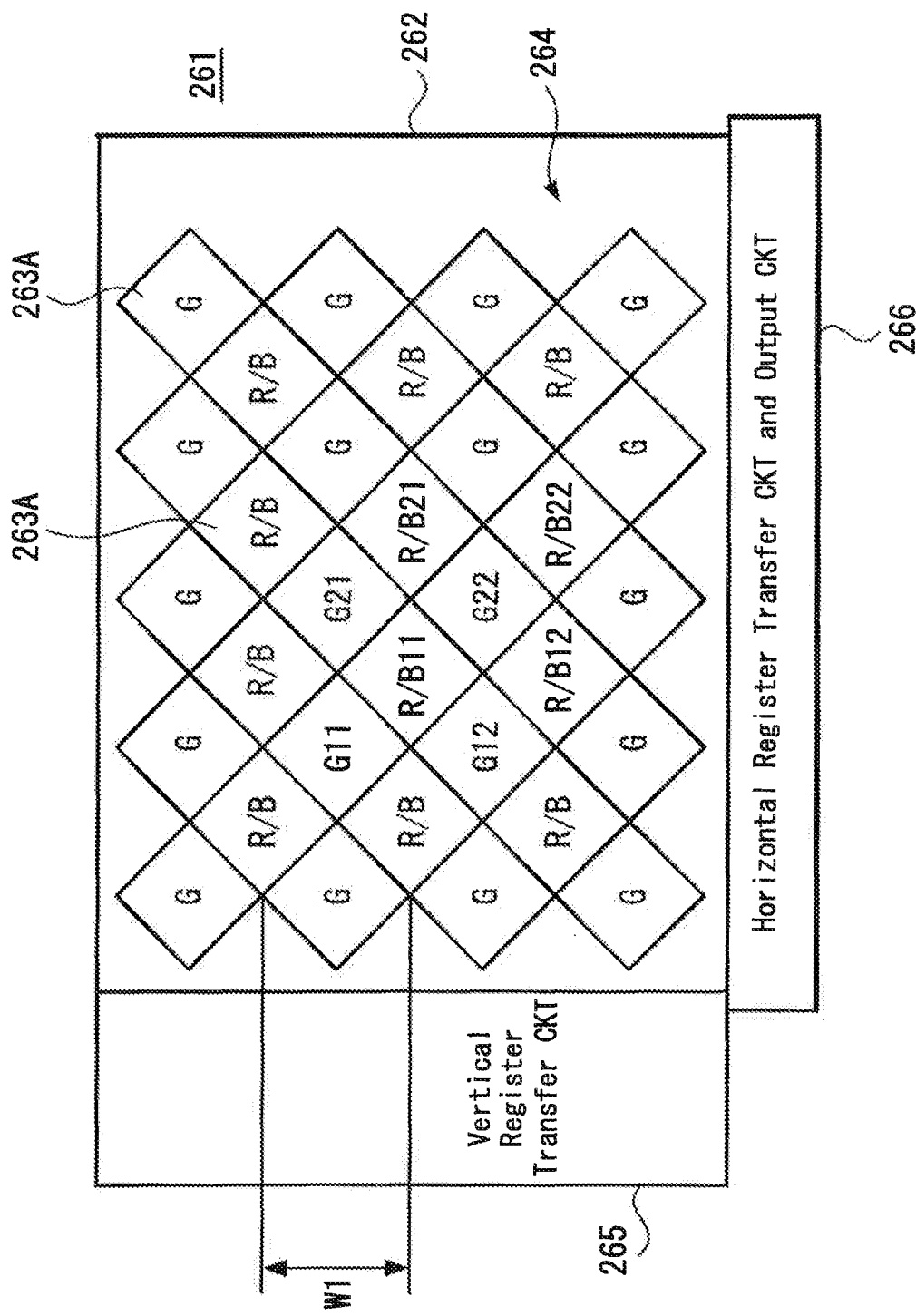
FIG. 39 is an outlined constitution diagram showing a fourteenth exemplified embodiment of a semiconductor image sensor module according to the present invention.

There is shown in FIG. 39 a general constitution of a semiconductor image sensor module according to a fourteenth exemplified embodiment of the present invention, that is, a back-illuminated type CMOS image sensor. The semiconductor image sensor of this exemplified embodiment is an example that color-separation is carried out without using an on chip color filter. A semiconductor image sensor 261 according to this exemplified embodiment is formed by being provided with an imaging region 264 formed on the front face of the same semiconductor chip 262 (corresponding to first semiconductor chip 52), which becomes a light receiving region in which a plurality of pixels 263 are arranged two-dimensionally, and with peripheral circuits 265 and 266 arranged on the outside of this imaging region 264 for selection of the pixels 263 and for signal output. It is allowed that the peripheral circuits 265 and 266 are not within the photodiode forming region 57 mentioned above, and they may be located within the transistor forming region 56. The peripheral circuit 265 is constituted by a vertical scanning circuit (so-called vertical register circuit) which is positioned on the side of the imaging region 264. The peripheral circuit 266 is constituted by a horizontal scanning circuit (so-called horizontal register circuit) positioned on the lower side of the imaging region 264 and an output circuit or the like (including a signal amplification circuit, an A/D converter circuit, a synchronous signal generating circuit or the like).

In the imaging region 264, a plurality of pixels are arranged in a so-called oblique arrangement. More specifically, it is constituted by a first pixel group in which a plurality of pixels 263A are arranged two-dimensionally with predetermined pitches W1 in the horizontal and vertical directions approximately in a lattice shape, and a second pixel group in which a plurality of pixels 263B are arranged two-dimensionally deviated by approximately ½ pitch of the aforesaid pitch W1 both in the horizontal direction and in the vertical direction with respect to the first pixel group, and the pixels 263A and 263B are arranged and formed just in a square lattice shape deviated obliquely. In this example, the pixels 263B are arranged in odd lines, and the pixel 263A are arranged in even lines deviated by ½ pitch. For the on chip color filters, primary color filters of red (R), green (G) and blue (B) are used in this example. In FIG. 39, the designation of R/B shows that it is either one of red (R) and blue (B). More specifically, the red (R) and the blue (B) are arranged alternatively along the vertical direction in FIG. 39 so as to be red (R)-blue (B)-red (R)-blue (B).

Next, it will be explained with respect to a fifteenth exemplified embodiment of a semiconductor image sensor module according to the present invention. The semiconductor image sensor module of this exemplified embodiment is an example in which an ADC shared by pixels is installed. Here, there is shown a flow of charge signals in the case of any one exemplified embodiment of the first to fourteenth exemplified embodiments mentioned above. Due to sharing of FD by pixels (thirteenth exemplified embodiment) and zigzag coating (fourteenth exemplified embodiment), charge signals outputted from the transistor forming region are transmitted to the inside of the AD conversion array.

Figure 40:
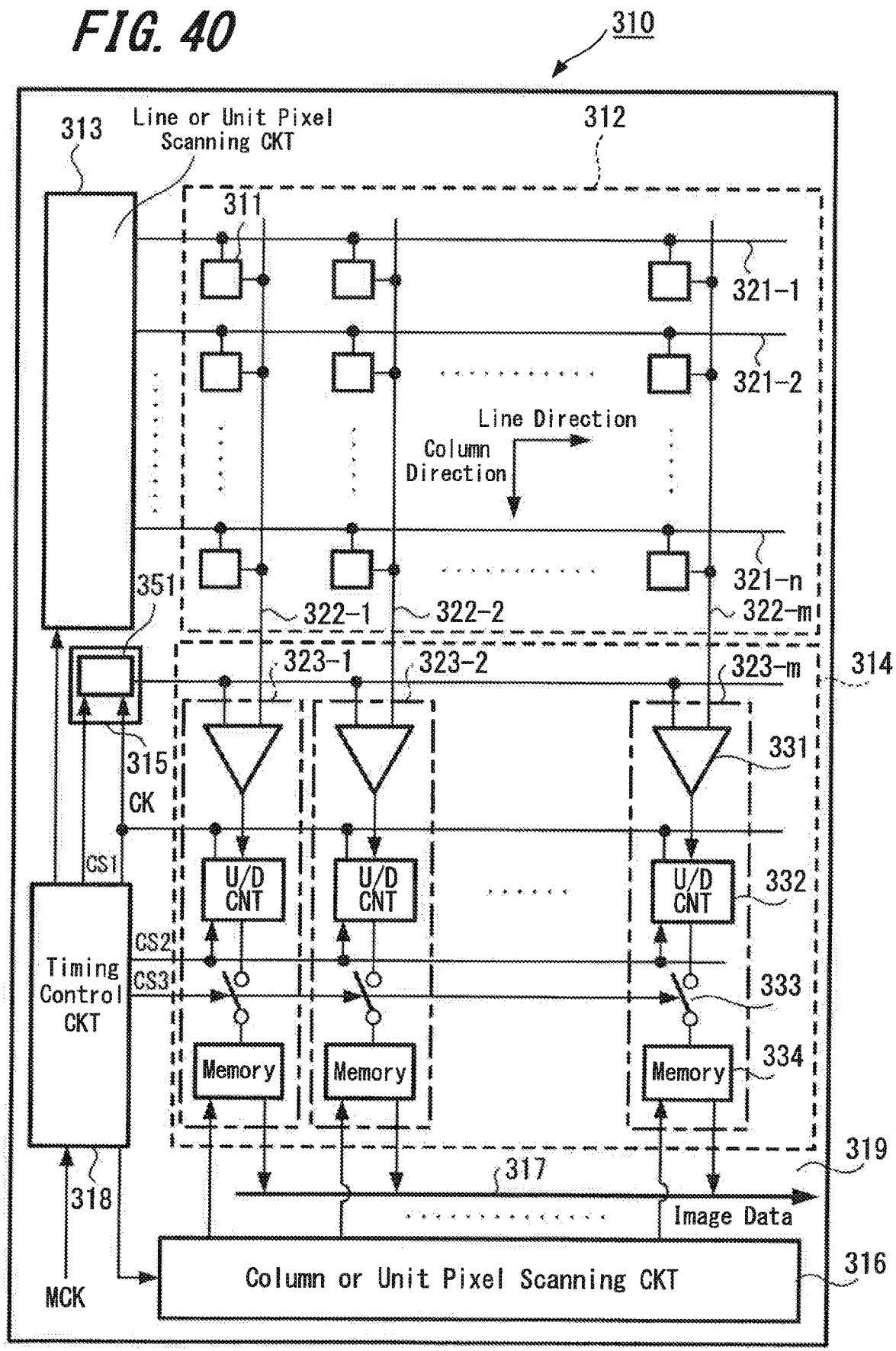
FIG. 40 is a block diagram showing a constitution of a fifteenth exemplified embodiment of a semiconductor image sensor module according to the present invention.

FIG. 40 is a block diagram showing a constitution of a solid-state imaging device applied to a semiconductor image sensor module according to the fifteenth exemplified embodiment, for example, a CMOS image sensor equipped with a pixel parallel ADC.

As shown in FIG. 40, a CMOS image sensor 310 according to this exemplified embodiment is configured to include a line or unit pixel scanning circuit 313, a column processing unit 314, a reference voltage supply unit 315, a column or unit pixel scanning circuit 316, a horizontal output line 317, and a timing control circuit 318, in addition to a pixel array unit 312 in which a large number of unit pixels 311 each including a photoelectric conversion element are arranged in a line-column form (in a matrix form) two dimensionally.

In this system constitution, the timing control circuit 318 generates, based on the master clock MCK, clock signals which become the basis of the operations of the line or unit pixel scanning circuit 313, the column or unit pixel processing unit 314, the reference voltage supply unit 315, the column or unit pixel scanning circuit 316 and the like, and control signals and the like, and supplies them to the line or unit pixel scanning circuit 313, the column processing unit 314, the reference voltage supply unit 315, the column or unit pixel scanning circuit 316 and the like.

Also, a peripheral drive system and a signal processing system which drive or control each unit pixel 311 of the pixel array unit 312, that is, the line or unit pixel scanning circuit 313, the reference voltage supply unit 315, the column or unit pixel scanning circuit 316, the timing control circuit 318 and the like, are integrated in a transistor forming region 356 on a same chip 319 (corresponding to the first semiconductor chip 52) as the pixel array unit 312.

For the unit pixel 311, although graphic indication is omitted here, it is possible to use a pixel of 3 transistor constitution, which includes, in addition to a photoelectric conversion element (for example, photodiode), for example, a transfer transistor transferring charges obtained by performing photoelectric conversion in aforesaid photoelectric conversion element to the FD (floating diffusion) portion, a reset transistor controlling the potential of this FD portion, and an amplifier transistor outputting signals corresponding to the potential of the FD portion, and further, it is possible to use a pixel of 4 transistor constitution which further includes a selection transistor separately for carrying out pixel selection or the like.

In the pixel array unit 312, unit pixels 311 are arranged two dimensionally in m columns and n lines, and at the same time, to the pixel arrangement of these m lines and n columns, line or unit pixel control lines 321 (321-1 to 321-*n*) are wired for respective lines or unit pixels, and column or unit pixel signal lines 322 (322-1 to 322-*m*) are wired for respective columns or unit pixels. Alternatively, to the pixel arrangement of these m lines and n columns, it is allowed to wire pixel control lines for respective pixels so as to control each pixel. Respective terminals of the line control lines 321-1 to 321-*n* are connected with corresponding output terminals of the line scanning circuit 313. The line or unit pixel scanning circuit 313 is constituted by a shift register or the like and carries out controls of line or unit pixel addresses of the pixel array unit 312 and line or unit pixel scanning, through the line or unit pixel control lines 321-1 to 321-*n*. The column or unit pixel processing unit 314 includes ADCs (analog-to-digital conversion circuits) 323-1 to 323-*m* provided, for example, for respective pixel columns or unit pixels of the pixel array unit 312, that is, for respective columns or unit pixel signal lines 322-1 to 322-*m*, and outputs analog signals outputted from the unit pixels 311 of the pixel array unit 312 for respective columns or unit pixels by converting them to digital signals.

This exemplified embodiment is characterized by the constitution of these ADCs 323-1 to 323-*m*, and it will be described later with respect to the details thereof.

The reference voltage supply unit 315 includes, for example, a DAC (digital-to-analog conversion circuit) 351 as a means for generating a reference voltage Vref of a so-called ramp (RAMP) waveform whose level changes in an inclined state as time elapses. It should be noted that the means for generating the reference voltage Vref of a ramp waveform is not limited to the DAC 351. The DAC 351 generates the reference voltage Vref of a ramp waveform based on the clock CK given from this timing control circuit 318 under a control by a control signal CS1 given from the timing control circuit 318 and supplies it to the ADCs 323-1 to **323-*m* of the column or unit pixel processing unit 314**.

Here, it will be explained specifically with respect to details of the constitution of the ADCs 323-1 to **323-*m* by which this exemplified embodiment is characterized. It should be noted that each of the ADCs 323-1 to 323-*m* has a constitution that the AD conversion operation can be carried out selectively between the operation mode corresponding to a usual frame rate mode by means of a progressive scanning system in which information of all of the unit pixels 311 is read out and the operation mode corresponding to a high-speed frame rate mode which increases the frame rate as much as N times, for example, 2 times as compared with the occasion of the usual frame rate mode by setting the exposure period of the unit pixel 311 to 1/N. The changeover of these operation modes is executed according to the control by control signals CS2, CS3 given from the timing control circuit 318. Also, to the timing control circuit 318**, instruction information is given from an external system controller (not shown) for changing the operation mode between the usual frame rate mode and the high-speed frame rate mode.

The ADC 323-1 to **323-*m* have the same constitution and are arranged in the AD conversion array in the first semiconductor chip 52 or the second semiconductor chip described above. Also, it is allowed to arrange the column or unit pixel processing unit 314, a comparator 331, for example, an up/down counter (in the drawing, marked as U/D CNT) 332 which is a counting means, a transfer switch 333 and a memory device 334, a DAC 351, the reference voltage supply unit 315, and the timing control circuit 318 in the AD conversion array of the first semiconductor chip 52 or the second semiconductor chip. Also, different from the constitution that the reference voltage supply unit 315, the column or unit pixel scanning circuit 316, and the timing control circuit 318 are provided in the transistor forming region 56 of aforesaid first semiconductor chip 52, it is allowed to arrange the reference voltage supply unit, the column or unit pixel scanning circuit, and the timing control circuit in the AD conversion array within the first semiconductor chip 52** or the second semiconductor chip.

Here, it will be explained by taking the ADC **323-*m* for each column or unit pixel. The ADC 323-*m* has a constitution including the comparator 331, for example the up/down counter (in the drawing, marked as U/D CNT) 332 which is a counting means, the transfer switch 333, and the memory device 334**.

The comparator 331 compares signal voltage Vx of the column or unit pixel signal line **322-*m* corresponding to the signal outputted from each unit pixel 311 of the n-th column of the pixel array unit 312 with the reference voltage Vref of a ramp waveform supplied from the reference voltage supply unit 315** and for example when the reference voltage Vref is larger than the signal voltage Vx, the output Vco becomes a "H" level, and when the reference voltage Vref is equal to or less than the signal voltage Vx, the output Vco becomes a "L" level.

The up/down counter 332 is an asynchronous counter, and is provided with the clock CK from the timing control circuit 318 simultaneously with the DAC 351 under the control by the control signal CS2 given from the timing control circuit 318, and by carrying out a down (DOWN) count or up (UP) count in synchronism with this clock CK, a comparison period from the start to the end of the comparison operation is measured. Specifically, in the usual frame rate mode, in a signal reading-out operation from one unit pixel 311, the comparison period on the first readout is measured by carrying out a down-count on the occasion of the first readout operation and the comparison period on the second readout is measured by carrying out an up-count on the occasion of the second readout operation. On the other hand, in the high-speed frame rate mode, a count result with respect to a unit pixel 311 of a certain line is maintained as it is, and subsequently, with respect to a unit pixel 311 of a next line, the comparison period on the occasion of the first readout is measured by carrying out a down-count from the previous count result on the occasion of the first readout operation and the comparison period on the occasion of the second readout is measured therefrom by carrying out an up-count on the occasion of the second readout operation.

In the usual frame rate mode, the transfer switch 333 becomes an ON (closed) state at the time point when the count operation of the up/down counter 332 with respect to a unit pixel 311 of a certain line is completed under the control by means of the control signal CS3 given from the timing control circuit 318, and transfers the count result of the up/down counter 332 to the memory device 334. On the other hand, in the high-speed frame rate mode of, for example, N=2, it remains in an OFF (open) state at the time point when the count operation of the up/down counter 332 with respect to a unit pixel 311 of a certain line is completed, and subsequently, it becomes an ON state at the time point when the count operation of the up/down counter 332 with respect to a unit pixel 311 of a next line is completed, and the count result for vertical 2 pixels of this up/down counter 332 is transferred to the memory device 334. In this manner, the analog signals which are supplied for respective columns or unit pixels by way of column or unit pixel signal lines 322-1 to **322-*m* from respective unit pixels 311 of the pixel array unit 312 are converted to digital signals of N bits according to respective operations of the comparator 331 and the up/down counter 332 in the ADC 323 (323-1 to 323-*m*) and stored in the memory device 334 (334-1 to 334-*m***).

The column or unit pixel scanning circuit 316 is constituted by a shift register or the like and carries out control of line or unit pixel addresses and scanning of column or unit pixels of the ADCs 323-1 to **323-*m* in the column or unit pixel processing unit 314. Under the control by means of this line or unit pixel scanning circuit 316, the digital signals of N bits AD-converted in respective ADCs 323-1 to 323-*m* are read out sequentially to the horizontal output line 317 and outputted as image data by way of this horizontal output line 317**.

Although not shown particularly because it is not related directly to this exemplified embodiment, it should be noted that it is also possible to provide a circuit applying various kinds of signal processes to the image data outputted by way of the horizontal output line 317 or the like, other than the aforesaid components. In the CMOS image sensor 310 equipped with an ADC with parallel column or unit pixels according to this exemplified embodiment having the aforesaid constitution, because it is possible to transfer the count result of the up/down counter 332 selectively to the memory device 334 through the transfer switch 333, it is possible to control the count operation of the up/down counter 332 and the readout operation of the count result of this up/down counter 332 to the horizontal output line 317 independently.

Figure 41:
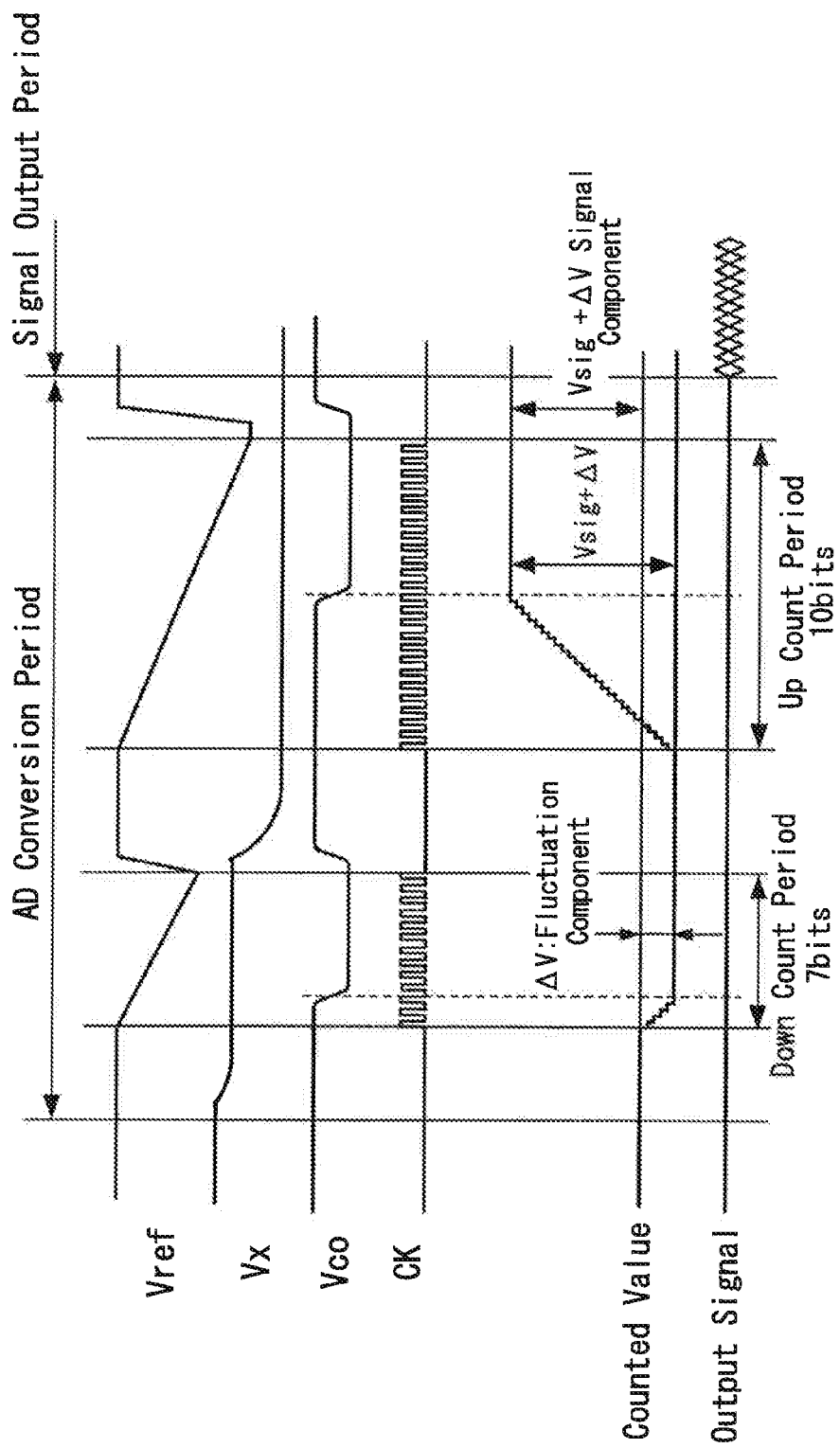
FIG. 41 is a timing chart used for explaining an operation of the semiconductor image sensor module according to the fifteenth exemplified embodiment.

Next, it will be explained with respect to the operation of the CMOS image sensor 310 according to the fifteenth exemplified embodiment of the aforesaid constitution by using a timing chart of FIG. 41.

Here, explanation with respect to the specific operation of the unit pixel 311 will be omitted, however, as well known, the reset operation and the transfer operation are carried out in each unit pixel 311, and in the reset operation, the potential of the FD portion when the unit pixel is reset to a predetermined potential is outputted as a reset component from the unit pixel 311 to the column or unit pixel signal lines 322-1 to 322-$m$, and in the transfer operation, the potential of the FD portion when the charge by means of photoelectric conversion is transferred from the photoelectric conversion element is outputted as a signal component from the unit pixel 311 to the column or unit pixel signal lines 322-1 to 322-$m$.

A certain line or unit pixel i is selected by means of line or unit pixel scanning by the line or unit pixel scanning circuit 313, and after a first readout operation from the unit pixel 311 of the selected line or unit pixel i to the column or unit pixel signal lines 322-1 to 322-$m$ has been stabilized, a reference voltage Vref having a ramp waveform is applied from the DAC 351 to each comparator 331 of the ADCs 323-1 to 323-$m$, thereby the comparison operation with respect to each of the signal voltages Vx of the column or unit pixel signal lines 322-1 to 322-$m$ and the reference voltage Vref is carried out in the comparator 331. At the same time when the reference voltage Vref is applied to the comparator 331, the clock CK is applied from the timing control circuit 318 to the up/down counter 332, thereby in this up/down counter 332, the comparison period in the comparator 331 on the occasion of the first readout operation is measured by the down count operation.

Then, when the reference voltage Vref and the signal voltage Vx of the column or unit pixel signal lines 322-1 to 322-$m$ become equal to each other, the output Vco of the comparator 331 is inverted from the "H" level to the "L" level. Receiving this polarity inversion of the output Vco of the comparator 321, the up/down counter 332 stops the down count operation and holds the counted value corresponding to the first comparison period in the comparator 331. In this first readout operation, as previously noted, the reset component .DELTA.V of the unit pixel 311 is read out. In this reset component .DELTA.V, a fixed pattern noise which fluctuates with respect to each unit pixel 311 is included as an offset.

However, because fluctuation of this reset component .DELTA.V is small generally, and also, the reset level is common for all the pixels, the signal voltage Vx of each of the column or unit pixel signal lines 322-1 to 322-$m$ is almost well-known. Consequently, on the occasion of the readout of the first reset component .DELTA.V, it is possible to shorten the comparison period by adjusting the reference voltage Vref.

In this exemplified embodiment, comparison of the reset component .DELTA.V is carried out during the count period for 7 bits (128 clock). In the second readout operation, in addition to the reset component .DELTA.V, the signal component Vsig corresponding to the amount of incident light of each unit pixel 311 is read out by an operation similar to the readout operation of the first reset component .DELTA.V. More specifically, after the second readout from the unit pixel 311 of the selection line or unit pixel i to the column or unit pixel signal lines 322-1 to 322-$m$ has been stabilized, the reference voltage Vref is applied from the DAC 351 to each comparator 331 of the ADCs 323-1 to 323-$m$, thereby the comparison operation with respect to each of the signal voltages Vx of the column or unit pixel signal lines 322-1 to 322-$m$ and the reference voltage Vref is carried out in the comparator 331. At the same time, the second comparison period in this comparator 331 is measured in the up/down counter 332 by an up count operation conversely to the first one.

In this manner, by making the count operation of the up/down counter 332 a down count operation at the first time and an up count operation at the second time, a subtraction process of (second comparison period)−(first comparison period) is carried out in this up/down counter 332 automatically. Then, when the reference voltage Vref and the signal voltage Vx of the column signal lines 322-1 to 322-$m$ become equal to each other, the output Vco of the comparator 331 is inverted in polarity, and receiving this polarity inversion, the count operation of the up/down counter 332 stops. As a result, the counted value corresponding to the result of the subtraction process of (second comparison period)−(first comparison period) is held in the up/down counter 332. It is calculated as (second comparison period)−(first comparison period)=(signal component Vsig+reset component .DELTA.V+offset component of ADC 323)−(reset component .DELTA.V+offset component of ADC 323)=(signal component Vsig), and owing to the above two readout operations and the subtraction process in the up/down counter 332, the offset component of each of the ADCs 323 (323-1 to 323-$m$) is also removed in addition to the reset component .DELTA.V including the fluctuation of each unit pixel 311, so that it is possible to extract only the signal component Vsig corresponding to the amount of incident light of each unit pixel 311.

Here, the process for removing the reset component .DELTA.V including fluctuation of each unit pixel 311 is a so-called CDS (correlated double sampling) process. On the occasion of the second readout, because the signal component Vsig corresponding to the amount of incident light is read out, it is necessary to greatly change the reference voltage Vref in order to judge the magnitude of the amount of light in a wide range. Consequently, it is constituted in the CMOS image sensor 310 according to this exemplified embodiment such that comparison after readout of the signal component Vsig is carried out during the count period for 10 bits (1024 clocks). In this case, the compared number of bits is different between the first time and the second time, but by making inclination of the ramp waveform of the reference voltage Vref identical for both of the first and second times, the accuracy of AD conversion can be made equal to each other, so that a correct subtraction result can be obtained as a result of the subtraction process of (second comparison period)−(first comparison period) by means of the up/down counter 332.

After the termination of a series of AD conversion operations mentioned above, a digital value of N bits is held in the up/down counter 332. Then, the digital values of N bits (digital signals) which have been AD-converted in respective ADCs 323-1 to 323-$m$ of the column processing unit 314 are outputted sequentially to the outside by way of the horizontal output line 317 having an N-bit width by means of column or unit pixel scanning by the column or unit pixel scanning circuit 316. Thereafter, similar operations are repeated sequentially for respective lines or unit pixels, and thereby a two dimensional picture is generated. Also, in the CMOS image sensor 310 equipped with the column or unit pixel parallel ADC according to this exemplified embodiment, each of the ADCs 323-1 to 323-$m$ has a memory device 334, so that it is possible to execute the readout operation and the up/down count operation in parallel with respect to the unit pixels 311 of (i+1).sup.th line while transferring the digital value after AD conversion to the memory device 34 and outputting it externally from the horizontal output line 317 with respect to the unit pixels 311 of i.sup.th line.

According to this exemplified embodiment, in a solid-state imager device having a constitution that analog signals outputted from the unit pixel through the column signal line are converted to digital values and are read out, even if the exposure period of the unit pixel is shortened by adding respective digital values among a plurality of unit pixels to be read out, it never occurs as a result that the amount of information of one pixel decreases, so that it is possible to attempt achieving a high frame rate mode, without incurring sensitivity lowering.

It is possible to form the penetration contact portions (inside of the first, second and third semiconductor chips) and the contact portions 84" and 201 in all the exemplified embodiments described above by Cu, Al, W, WSi, Ti, TiN, silicide or a combination thereof.

Figure 42:
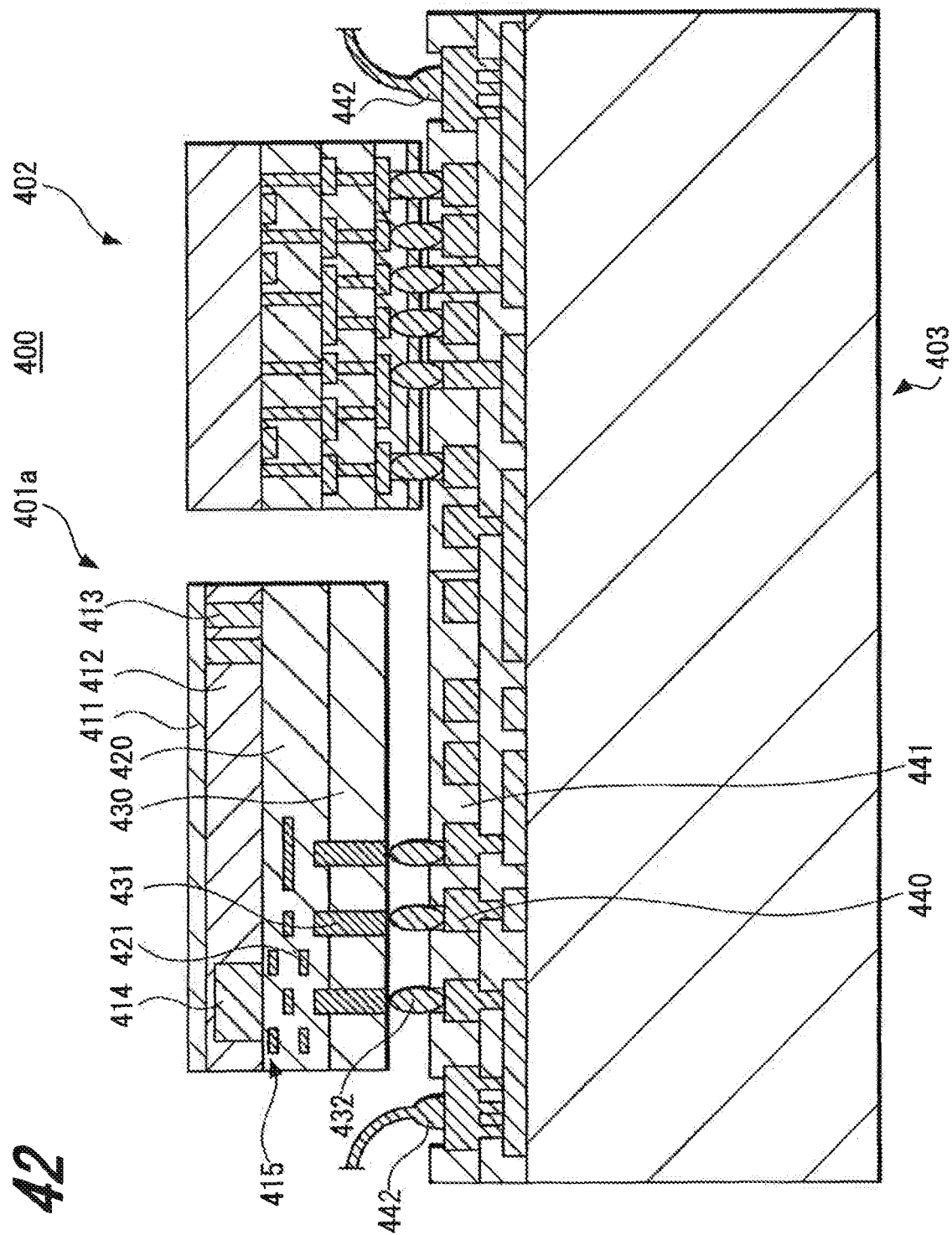
FIG. 42 is a schematic cross-section diagram showing a sixteenth exemplified embodiment of a semiconductor image sensor module according to the present invention.

There is shown, in FIG. 42, a sixteenth exemplified embodiment of a semiconductor image sensor module according to the present invention. FIG. 42 is a schematic cross-section diagram showing a constitution of a semiconductor image sensor module mounting a back-illuminated type CMOS solid-state imaging device. A semiconductor image sensor module 400 according to this exemplified embodiment is formed, for example, by mounting a sensor chip 401a which is a back-illuminated type CMOS solid-state imaging device provided with an imaging pixel unit on an interposer (intermediate substrate) 403 and a signal processing chip 402 which is provided with a peripheral circuit unit of a signal process or the like.

In the sensor chip 401a, an interlayer insulation layer 420 is formed on a support substrate 430, and buried wiring layers 421 are buried inside of the layer 420. A semiconductor layer 412 is formed in the upper layer of the layer 420 and a surface insulation film 411 is formed on the front face thereof. There are formed, in the semiconductor layer 412, a photodiode 414 which becomes a photoelectric conversion element, electrodes 413 for testing, and the like. Also, a portion of the buried wiring layers 421 becomes a gate electrode formed through a gate insulation film with respect to the semiconductor layer 412, and thus a MOS transistor 415 is constituted. Further, there are formed support substrate penetrating wirings 431 which pass through the support substrate 430 to be connected with the buried wiring layers 421, and there are formed, on the front faces of the support substrate penetrating wirings 431, protrusion electrodes (bumps) 432 which project from the front face of the support substrate 430. The bumps (micro bumps) 432 are protrusion like metal electrodes formed by electrolytic plating or the like on pads which are smaller than a usual pad electrode used for wire bonding.

The sensor chip 401a having the constitution mentioned above is a so-called back-illuminated type CMOS solid-state imaging device in which when light is illuminated from the surface insulation film 411 side to the photodiode 414 formed in the semiconductor layer 412, signal charge is generated and accumulated in the photodiode. The MOS transistor 415 has the functions of transfer of signal charge accumulated in the photodiode 414 to the FD portion and signal amplification or resetting and the like. In the constitution mentioned above, the semiconductor layer is obtained by thinning the rear face of the semiconductor substrate, and has a structure of being pasted with the support substrate 430 in order to stabilize the substrate shape.

As described above, the CMOS solid-state imaging device according to this exemplified embodiment is a back-illuminated type solid-state imaging device in which there are formed buried wirings connected with a plurality of pixels on one surface of the semiconductor layer in which a plurality of pixels including photoelectric conversion elements and field effect transistors have been formed, and the other surface of the semiconductor layer becomes a light receiving surface of the photoelectric conversion element.

The sensor chip 401a mentioned above is mounted by flip chip on the interposer 403, in which the wirings 440 and the insulation layer 441 for insulating them have been formed, from the support substrate 430 side which is the opposite side of the light illumination side such that the land, which is formed by causing a portion of the front face of the wiring to be exposed from the opening portion of the insulation layer, and the bump are joined.

On the other hand, the signal processing chip 402 in which peripheral circuit units have been formed is mounted on the interposer 403 by flip chip, for example, through bumps.

The semiconductor image sensor module 400 having such a constitution is mounted on another mounting substrate together with the interposer 403, and is connected electrically to be used, for example, by means of the wire bonding 442 or the like. For example, there is formed, on the interposer 403, an electrode PAD for evaluating the function of 1 chip made by connecting the aforesaid sensor chip (CMOS solid-state imaging device) 401a and the signal processing chip 402.

Figure 43:
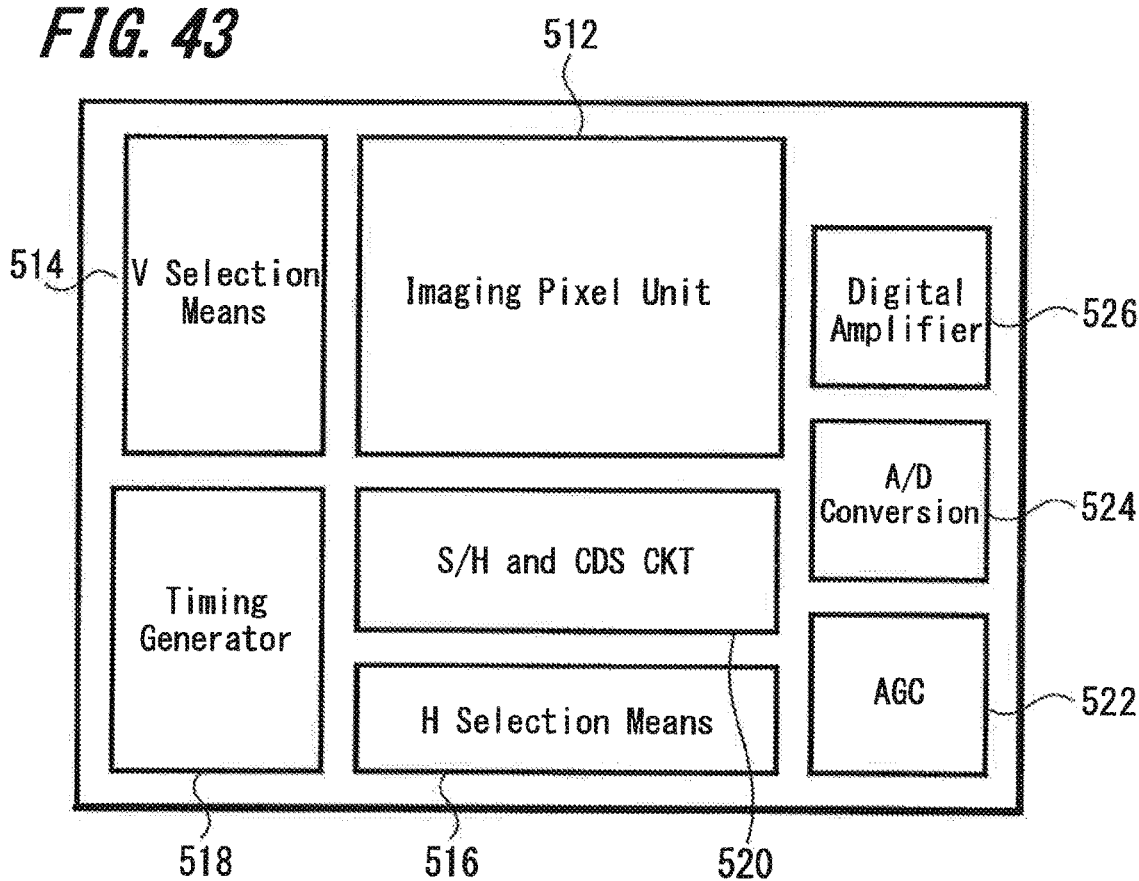
FIG. 43 is a timing chart used for explaining an operation of the semiconductor image sensor module according to the sixteenth exemplified embodiment of the present invention.
Figure 44:
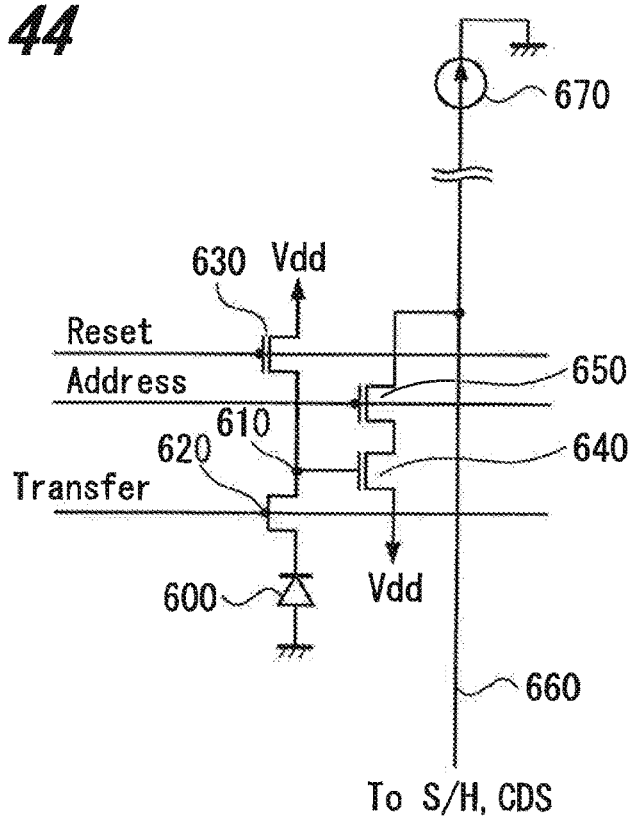
FIG. 44 is an equivalent circuit diagram showing a constitution of a pixel of a CMOS solid-state imaging device according to the sixteenth exemplified embodiment of the present invention.

FIG. 43 is a block diagram showing a constitution of an image sensor (corresponding to semiconductor image sensor module) installing a CMOS solid-state imaging device according to this exemplified embodiment. FIG. 44 is an equivalent circuit diagram showing a pixel constitution of a CMOS solid-state imaging device according to this exemplified embodiment. The image sensor according to this exemplified embodiment is constituted by an imaging pixel unit 512, a V selection means (vertical transfer register) 514, an H selection means (horizontal transfer register) 516, a timing generator (TG) 518, a S/H-CDS (sampling hold-correlated double sampling) circuit unit 520, an AGC unit 522, an A/D conversion unit 524, a digital amplifier unit 526 and the like. It is possible, for example, to take a configuration that the imaging pixel unit 512, the V selection means 514, the H selection means 516, and the S/H & CDS circuit unit 520 are assembled on 1 chip collectively to be the sensor chip 401a in FIG. 42 and the remaining circuit units are assembled collectively on the signal processing chip 402. Alternatively, it is also possible to configure such that only the imaging pixel unit 512 is formed in the sensor chip 401a.

In the imaging pixel unit 512, a large number of pixels are arranged two dimensionally in a matrix form, and in each pixel, as shown in FIG. 44, a photodiode (PD) 600 which is a photoelectric conversion element for generating and accumulating the signal charge corresponding to the amount of received light is provided, and further, there are provided four MOS transistors, i.e., a transfer transistor 620 for transferring the signal charge converted and accumulated by this photodiode 600 to a floating diffusion portion (FD portion) 610, a reset transistor 630 for resetting the voltage of the FD portion 610, an amplifier transistor 640 for outputting an output signal corresponding to the voltage of the FD portion 610, and a selection (address) transistor 650 for outputting the output signal of the this amplifier transistor 640 to a vertical signal line 660.

In the pixel having such a constitution, the signal charge converted photoelectrically in the photodiode 600 is transferred to the FD portion 610 by the transfer transistor 220. The FD portion 610 is connected with the gate of the amplifier transistor 640, and the amplifier transistor 640 constitutes a source follower with a constant current source 670 provided outside of the imaging pixel unit 512, so that when the address transistor 650 is turned ON, a voltage corresponding to the voltage of the FD portion 610 is outputted to the vertical signal line 660. Also, the reset transistor 630 resets the voltage of the FD portion 610 to a constant voltage not depending on the signal charge (to a drive voltage Vdd in FIG. 44). Also, in the imaging pixel unit 512, various kinds of driving wirings for driving and controlling respective MOS transistors are wired in the horizontal direction, respective pixels of the imaging pixel unit 512 are selected in horizontal line (pixel line) units sequentially in the vertical direction by means of the V selection means 514, and the MOS transistors of respective pixels are controlled by various kinds of pulse signals from the timing generator 518, thereby signals of respective pixels are read out to the S/H-CDS unit 520 for each pixel column by way of the vertical signal line 660.

The S/H-CDS unit 520 provides a S/H-CDS circuit for each pixel column of the imaging pixel unit 512 and carries out signal processing such as a CDS (correlated double sampling) or the like with respect to the pixel signal read out from each of the pixel columns of the imaging pixel unit 512. The H selection means 516 outputs the pixel signal from the S/H-CDS unit 520 to the AGC unit 522. The AGC unit 522 carries out a predetermined gain control with respect to the pixel signal from the S/H-CDS unit 520 selected by the H selection means 516 and outputs the pixel signal to the A/D conversion unit 524. The A/D conversion unit 524 converts the pixel signal from the AGC unit 522 from an analog signal to a digital signal and outputs it to the digital amplifier unit 526. The digital amplifier unit 526 carries out necessary amplification and/or buffering to the digital signal output from the A/D conversion unit 524 and outputs it from an external terminal which is not shown. The timing generator 518 supplies various kinds of timing signals also to respective portions other than the pixels of the imaging pixel unit 512 mentioned above.

It becomes possible for the semiconductor image sensor module (that is, CMOS image sensor) 400 according to the sixteenth exemplified embodiment mentioned above to input the signals outputted from the pixels of the CMOS image sensor to the signal process device directly through the micro bumps with respect to each pixel unit or each unit of a plurality of pixels, without inputting the output signals from the pad electrode in the chip periphery to the signal process device after outputting signals outputted from the pixels to the pixel peripheral circuit, as in the past. Thereby, it becomes possible to provide a highly functional device that is fast in the signal process speed between the devices and is highly advanced and in which the image sensor and the signal process device are made by 1 chip. Also, the aperture ratio of the photodiode is improved, chip utilization is improved, and simultaneous shuttering of all the pixels can be realized.

Figure 45A:
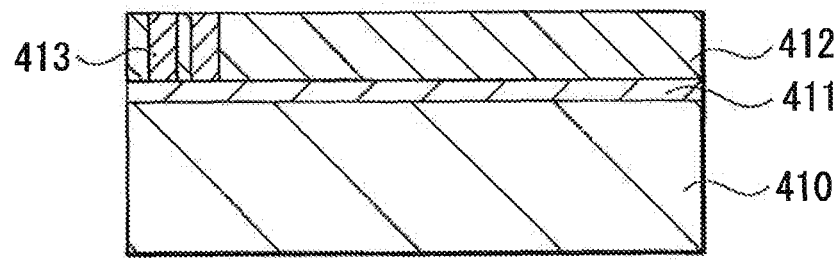
FIGS. 45A to 45C are cross-section diagrams showing a manufacturing process of a back-illuminated type CMOS solid-state imaging device according to the sixteenth exemplified embodiment of the present invention (No. 1 thereof).

It will be explained with respect to a manufacturing method of the back-illuminated type CMOS solid-state imaging device according to the sixteenth exemplified embodiment. First, as shown in FIG. 45A, for example, an insulation film 411 which is composed of oxide silicon or the like and which becomes a surface insulation film by post-process is formed on the front face of a semiconductor substrate 410 composed of silicon or the like by means of a thermal oxidation method, a CVD (chemical vapor deposition) method or the like. Further, for example, a semiconductor layer 412 of silicon or the like is formed for an upper layer of the insulation film 411, for example, by means of a bonding method, an epitaxial growth method or the like, and thereby a SOI (semiconductor on insulator) substrate is formed. Here, an electrode 413 for testing is formed in the semiconductor layer 412 beforehand.

Figure 45B:
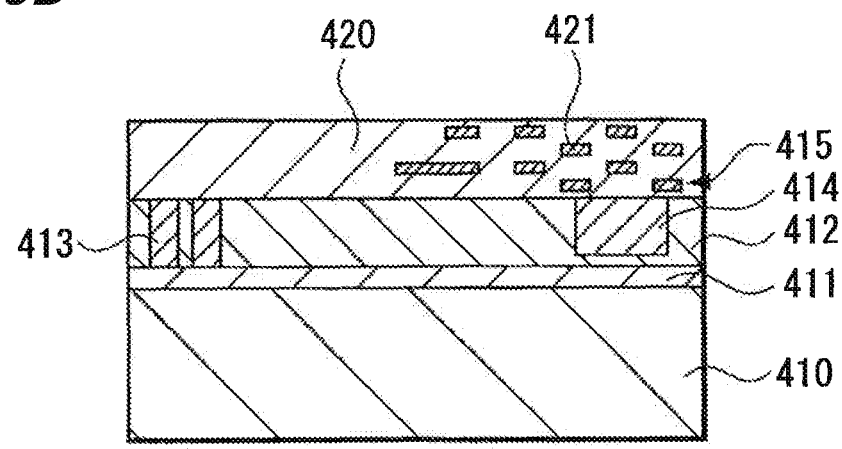

Next, as shown in FIG. 45B, for example, a pn junction is formed by ion-injecting p-type conductive impurity in the n-type semiconductor layer 412, thereby the photodiode 414 is formed in the semiconductor layer 412 as a photoelectric conversion element, further, a gate electrode is formed on the front face of the semiconductor layer 412 through a gate insulation film, the MOS transistor 415 is formed by connecting the gate electrode with the photodiode 414 and the like, and thereby a plurality of pixels having the constitution mentioned above are formed. Further, for example, the interlayer insulation layer 420 which covers the MOS transistor is formed. At that time, the buried wiring layers 421 are formed while being buried in the interlayer insulation layer 420 so as to be connected with the transistor, the semiconductor layer 412 and the like.

Figure 45C:
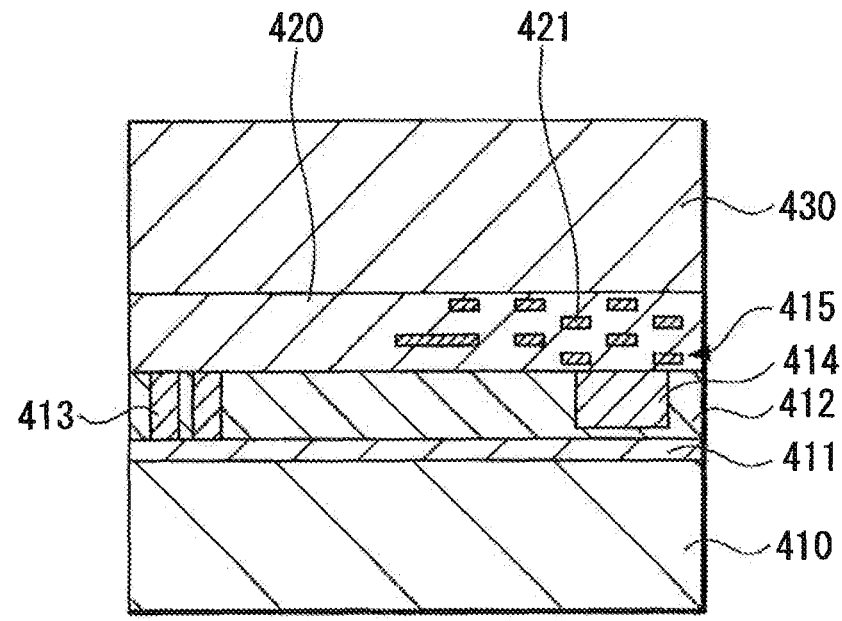

Next, as shown in FIG. 45C, the support substrate 430 composed of a silicon substrate, an insulating resin substrate or the like is bonded to the upper layer of the interlayer insulation layer 420 for example by thermal compression using heat-hardening resin as the adhesive agent or the like.

Figure 46A:
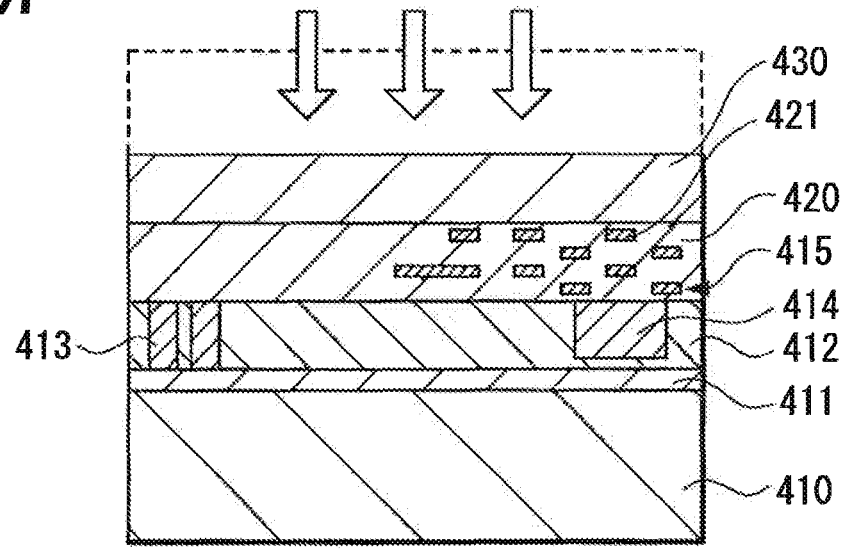
FIGS. 46A and 46B are cross-section diagrams showing a manufacturing process of a back-illuminated type CMOS solid-state imaging device according to the sixteenth exemplified embodiment of the present invention (No. 2 thereof).

Next, as shown in FIG. 46A, the support substrate 430 is thinned from the opposite side of the bonded surface for example by mechanical grinding or the like.

Figure 46B:
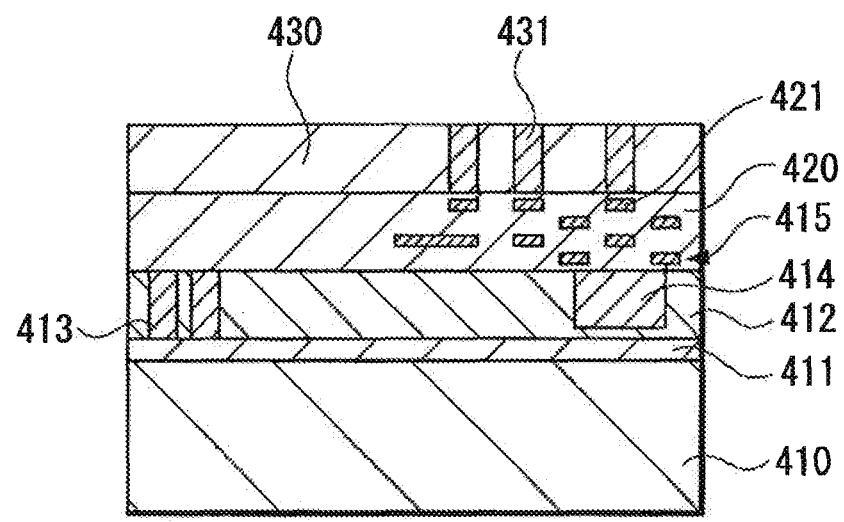

Next, as shown in FIG. 46B, the support substrate penetrating wirings 431 passing through the support substrate 430 are formed so as to be connected with the buried wiring layers 421.

It is possible to form this, for example, by pattern-forming a resist film by a photolithographic process and carrying out etching such as dry etching or the like to form an opening portion reaching the buried wiring layer 421 in the support substrate 430, and by burying a low resistance metal of copper or the like.

Figure 47A:
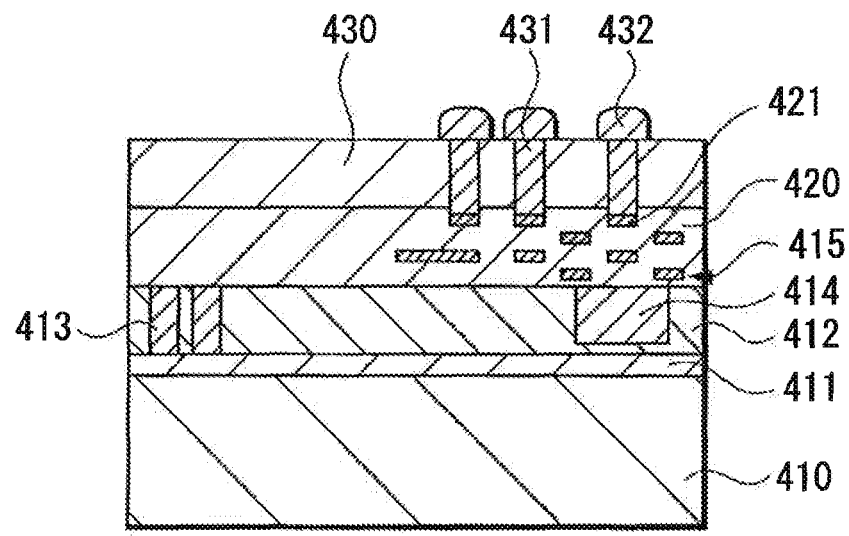
FIGS. 47A and 47B are cross-section diagrams showing a manufacturing process of a back-illuminated type CMOS solid-state imaging device according to the sixteenth exemplified embodiment of the present invention (No. 3 thereof).

Next, as shown in FIG. 47A, for example, the bumps 432 projecting from the front face of the support substrate 430 are formed on the front faces of the support substrate penetrating wirings 431 by means of a metal plating process or the like.

Figure 47B:
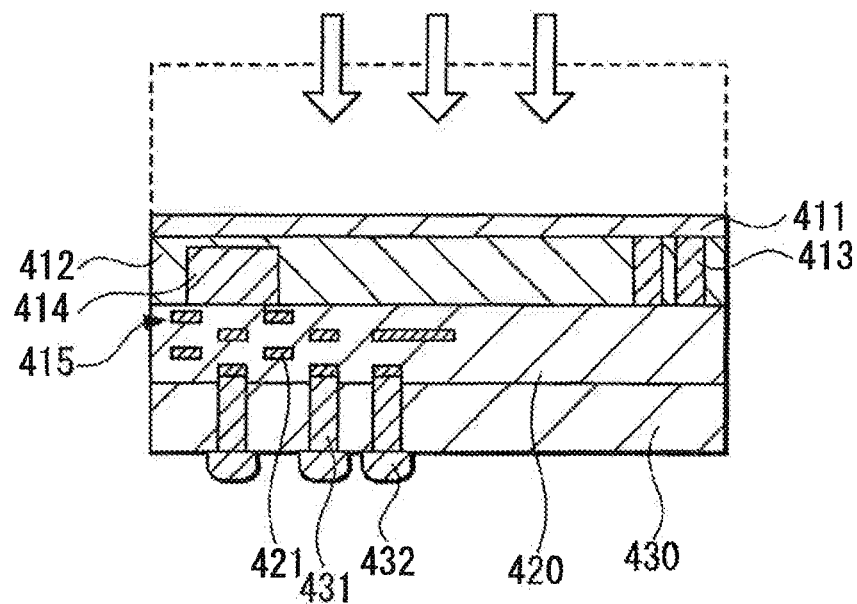

Next, as shown in FIG. 47B, for example, the semiconductor substrate 410 is thinned from the semiconductor substrate 410 side of the SOI substrate until it becomes possible for the photodiode 414 to receive light. For example, the insulation film 411 is made a stopper and it is carried out from the rear face side of the semiconductor substrate 410 by mechanical grinding, wet etching process or the like until the insulation film 411 is exposed. Thereby, it becomes a constitution that the semiconductor layer 412 of the SOI substrate is left. Here, the insulation film 412 exposed on the front face is referred to as a surface insulation film. It is shown for the drawing such that the up and down relation is opposite with respect to FIG. 47A.

As described above, the back-illuminated type CMOS solid-state imaging device (sensor chip) 401a according to this exemplified embodiment is formed. Further, it is preferable to form an insulation film, for example, by a CVD method on the rear face of the semiconductor substrate (semiconductor layer 412) which has been obtained by being thinned. It is possible that this insulation film realizes the object of protecting the silicon surface of the rear face and at the same time functions as an anti-reflection film with respect to the incident light.

The back-illuminated type CMOS solid-state imaging device (sensor chip) 401*a* formed as mentioned above is mounted on the interposer 403 by flip chip through the bumps 432 with the light receiving surface side directed upward. For example, the lands and the bumps on the wiring of the interposer 403 and the bumps on the support substrate of the sensor chip are pressure-bonded at a temperature lower than the melting point of the wiring used in the sensor chip 401*a* or the signal processing chip 402 and also at a temperature that the bumps are connected electrically stably. In addition, it is also possible, for example, to mount the sensor chip 401*a* directly on the signal processing chip 402 so as to be constituted as a module, and also in this case, the above-described method can be employed similarly.

On the other hand, the signal processing chip 402 in which the peripheral circuit unit has been formed is also similarly mounted on the interposer 403 by flip chip through the bumps. Thereby, the back-illuminated type CMOS solid-state imaging device (sensor chip) 401*a* and the signal processing chip 402 are connected through the wirings formed on the interposer 403.

It is possible to manufacture an image sensor installing a back-illuminated type CMOS solid-state imaging device according to this exemplified embodiment, in the manner described above. In addition, it is also possible to test the circuits of the sensor chip using the electrode 413 for testing after carrying out the mounting by flip chip As described above, according to the manufacturing method of the back-illuminated type CMOS solid-state imaging device of this exemplified embodiment, the semiconductor substrate is thinned after the support substrate is bonded to secure the strength, and also, the penetrating wiring is formed after the support substrate is thinned, so that it is possible to take out the electrode from the support substrate without taking out the electrode from the rear face of the semiconductor substrate and it is possible to manufacture a back-illuminated type CMOS solid-state imaging device having a constitution that the electrode is taken out from the surface on the opposite side of the illumination surface conveniently and easily. Also, based on that the electrode can be formed on the support substrate side which is the opposite side of the surface to which light enters, the degree of freedom of electrode arrangement rises, and it becomes possible to form a large number of micro bumps immediately below a pixel or immediately below the periphery of a pixel without spoiling the aperture ratio of the CMOS image sensor. In this manner, by thinning the rear face of the semiconductor substrate and by connecting a mounting substrate such as an interposer or the like and another semiconductor chip such as a signal processing chip or the like in which bumps are formed by means of respective bumps, it is possible to manufacture a device of high performance and a high function.

As the semiconductor substrate, for example, a substrate such as an SOI substrate in which an oxide film is formed in the substrate beforehand is preferable, because it is possible to use the oxide film in the SOI substrate as a stopper of wet etching for thinning the semiconductor substrate and it is possible to obtain a uniform and flat semiconductor substrate after the thinning process.

Figure 48:
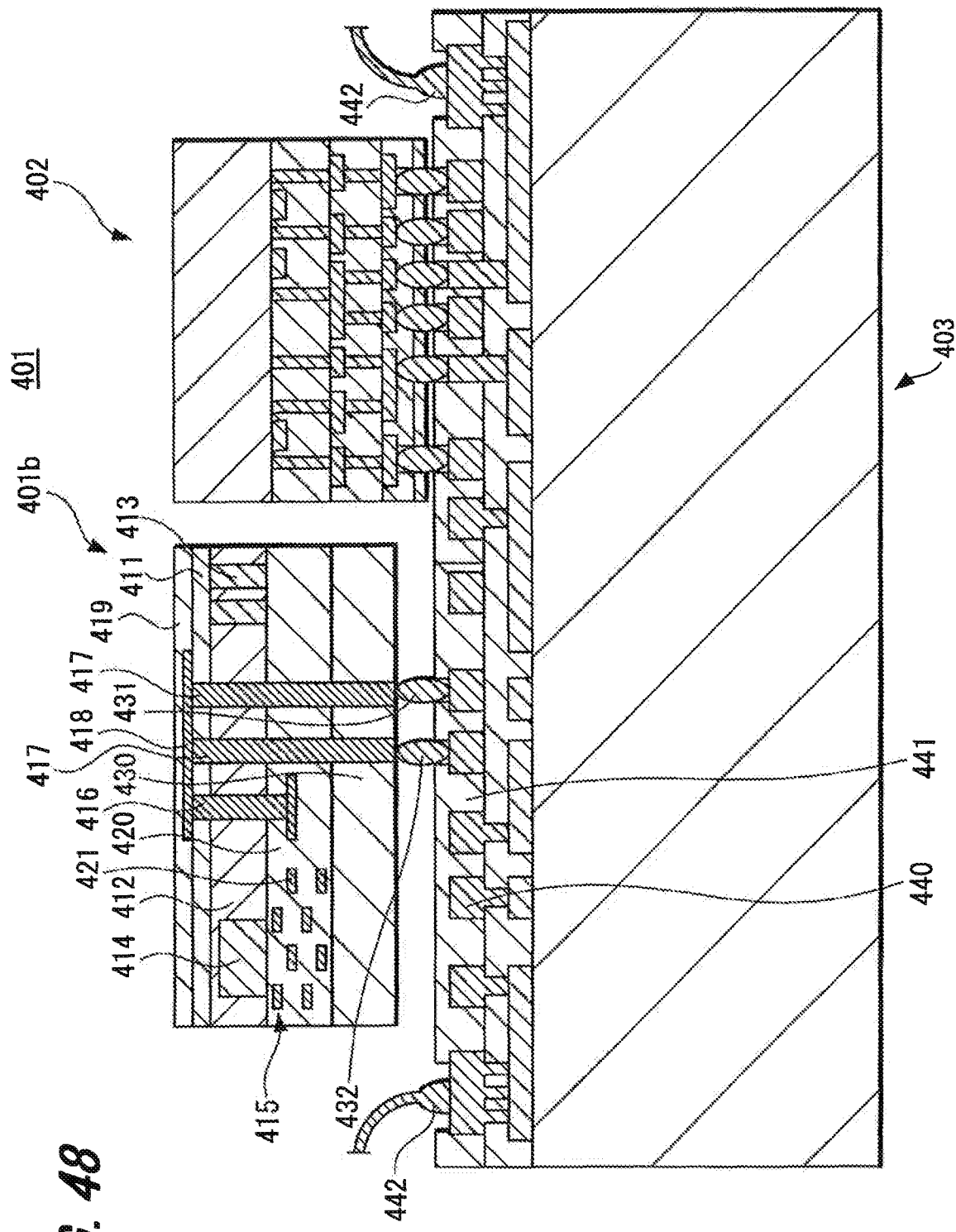
FIG. 48 is a schematic cross-section diagram showing a seventeenth exemplified embodiment of a semiconductor image sensor module according to the present invention.

There is shown, in FIG. 48, a seventeenth exemplified embodiment of a semiconductor image sensor module according to the present invention. FIG. 48 is a schematic cross-section diagram showing a constitution of a semiconductor image sensor module mounting a back-illuminated type CMOS solid-state imaging device. The semiconductor image sensor module 401 according to this exemplified embodiment is formed similarly as the sixteenth exemplified embodiment, for example, by mounting a sensor chip 401*b* which is a back-illuminated type CMOS solid-state imaging device provided with an imaging pixel unit and the signal processing chip 402 provided with the peripheral circuit unit for signal processing or the like on the interposer (intermediate substrate 403).

In the sensor chip 401*b*, the interlayer insulation layer 420 is formed on the support substrate 430, and the buried wiring layers 421 are buried therein. The semiconductor layer 412 is formed for the upper layer thereof and surface insulation films (411, 419) are formed on the front face thereof. There are formed in the semiconductor layer 412 the photodiode 414 and the electrode 413 for testing or the like. Also, a portion of the buried wiring layers 421 becomes a gate electrode formed with respect to the semiconductor layer 412 through a gate insulation film, and thereby the MOS transistor 415 is constituted. Also, there is formed the semiconductor layer penetrating wiring 416 connected with the buried wiring layer 421 through the semiconductor layer 412.

Further, the support substrate penetrating wiring 431 passing through the support substrate 430 is formed, and the protrusion electrode (bump) 432 projecting from the front face of the support substrate 430 is formed on the front face of the support substrate penetrating wiring 431. On the other hand, for example, a semiconductor layer and insulation layer penetrating wiring 417 connected with the support substrate penetrating wiring 431 through the semiconductor layer 412 and the interlayer insulation layer 420 is formed, and the semiconductor layer penetrating wiring 416 and the semiconductor layer and insulation layer penetrating wiring 417 are connected by means of a connection wiring 418 formed on the surface insulation film 411.

The support substrate penetrating wiring 431 has a constitution in this exemplified embodiment to be connected with the buried wiring layers 421 through the semiconductor layer and insulation layer penetrating wiring 417, the connection wiring 418 and the semiconductor layer penetrating wiring 416 as mentioned above, but it is not limited toy this, and it may be such a constitution that the support substrate penetrating wiring 431 is connected with the buried wiring layers 421 through a portion thereof or directly without any of them.

The sensor chip 401*b* having the constitution mentioned above is configured such that when light is illuminated from the surface insulation film (411, 419) side to the photodiode 414 formed in the semiconductor layer 412, signal charges are generated, which are then accumulated in the photodiode. Then, this sensor chip 401*b* is a back-illuminated type solid-state imaging device, in which there is formed a buried wiring which is connected with a plurality of pixels on one surface of the semiconductor layer in which a plurality of pixels including photoelectric conversion elements and field effect transistors have been formed, and the other surface of the semiconductor layer becomes a light receiving surface of the photoelectric conversion element.

The sensor chip 401*b* mentioned above is mounted by flip chip on the interposer 403 in which the wirings 440 and the insulation layer 441 insulating them have been formed on the front face thereof from the support substrate 430 side which is the opposite side of the light illumination side, such that the land formed by a portion of the front face of the wiring exposed from the opening portion of the insulation layer or the like and the bump are joined.

On the other hand, the signal processing chip 402 in which the peripheral circuit unit has been formed is mounted on the interposer by flip chip for example through bumps. The semiconductor image sensor module 401 having such a constitution is mounted on another mounting substrate together with the interposer 403, and is connected electrically, for example, by the wire bonding 442 or the like to be used. The constitution of the image sensor (corresponding to semiconductor image sensor module) installing a CMOS solid-state imaging device according to this exemplified embodiment and the constitution of the pixel are similar to those of the sixteenth exemplified embodiment.

The semiconductor image sensor module (that is, CMOS image sensor) 401 according to the above-mentioned seventeenth exemplified embodiment achieves similar effects as the sixteenth exemplified embodiment.

Figure 49A:
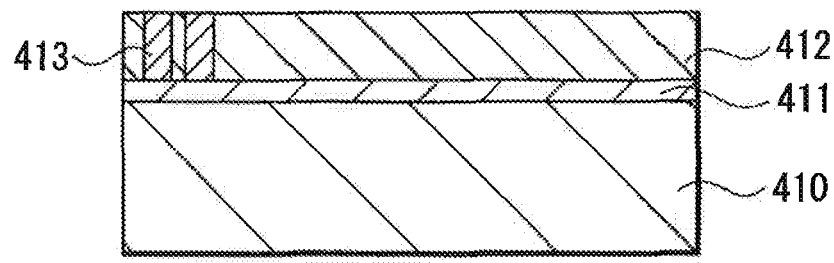
FIGS. 49A to 49C are cross-section diagrams showing a manufacturing process of a back-illuminated type CMOS solid-state imaging device according to the seventeenth exemplified embodiment of the present invention (No. 1 thereof).

It will be explained with respect to a manufacturing method of a back-illuminated type CMOS solid-state imaging device according to the seventeenth exemplified embodiment. First, as shown in FIG. 49A, for example, the insulation film 411 which is formed by oxide silicon or the like and which becomes a surface insulation film in the post-process is formed by a thermal oxidation method, a CVD (chemical vapor deposition) method or the like on the front face of the semiconductor substrate 410 composed of silicon or the like. Further, for example, the semiconductor layer 412 of silicon or the like is formed, for example, by a bonding method, an epitaxial growth method or the like in the upper layer of the insulation film 411 to make a SOI substrate. Here, an electrode 413 for testing is formed and prepared in the semiconductor layer 412.

Figure 49B:
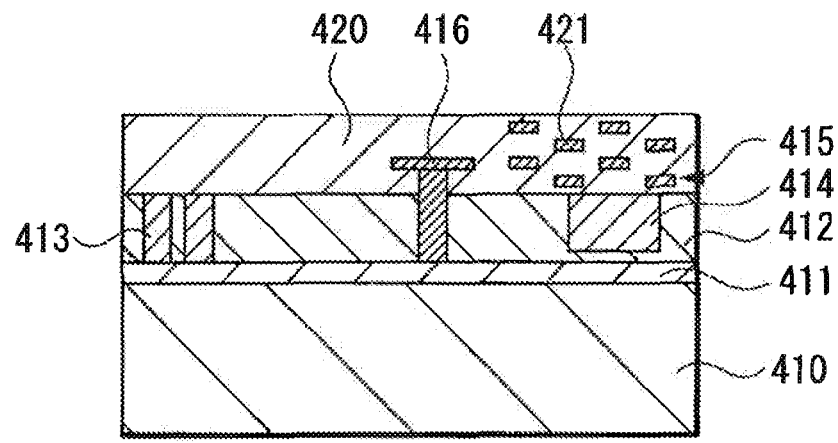

Next, as shown in FIG. 49B, the photodiode 414 is formed as a photoelectric conversion element in the semiconductor layer 412, for example, by ion-injecting conductive impurity, and further, gate electrodes are formed through a gate insulation film on the front face of the semiconductor layer 412 to be connected with the photodiode 414 or the like, thereby the MOS transistor 415 is formed, and thus a plurality of pixels each having the constitution mentioned above are formed. Further, for example, the interlayer insulation layer 420 covering the MOS transistor is formed. At that time, it is formed while burying the buried wiring layers 421 into the interlayer insulation layer 420 so as to be connected with the transistor, the semiconductor layer 412 and the like.

Figure 49C:
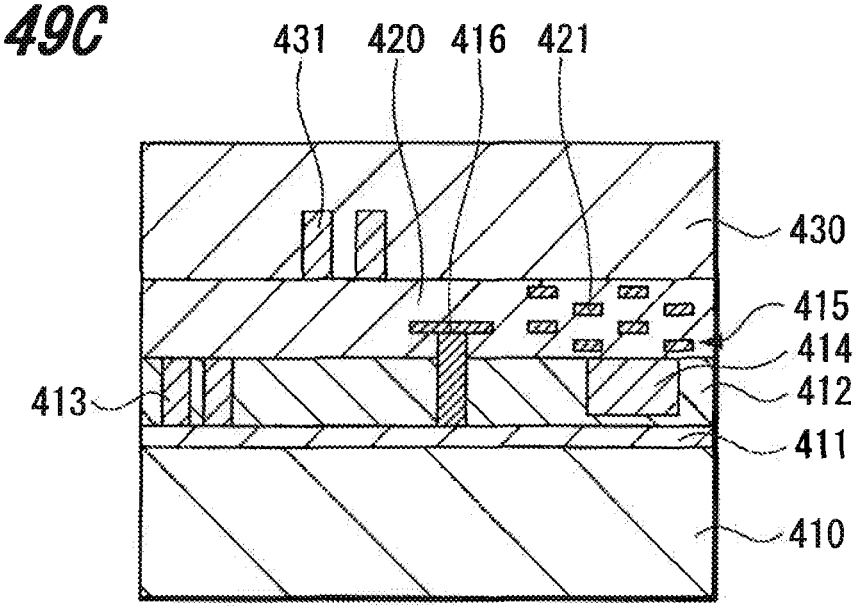

On the other hand, the support substrate wirings 431 becoming support substrate penetrating wirings which reach at least a predetermined depth from the front face of one main surface of the support substrate 430 composed of a silicon substrate, an insulating resin substrate or the like are formed. Next, as shown in FIG. 49C, the support substrate 430 is bonded to the upper layer of the interlayer insulation layer 420 from the side of the support substrate wiring 431 forming surface.

Figure 50A:
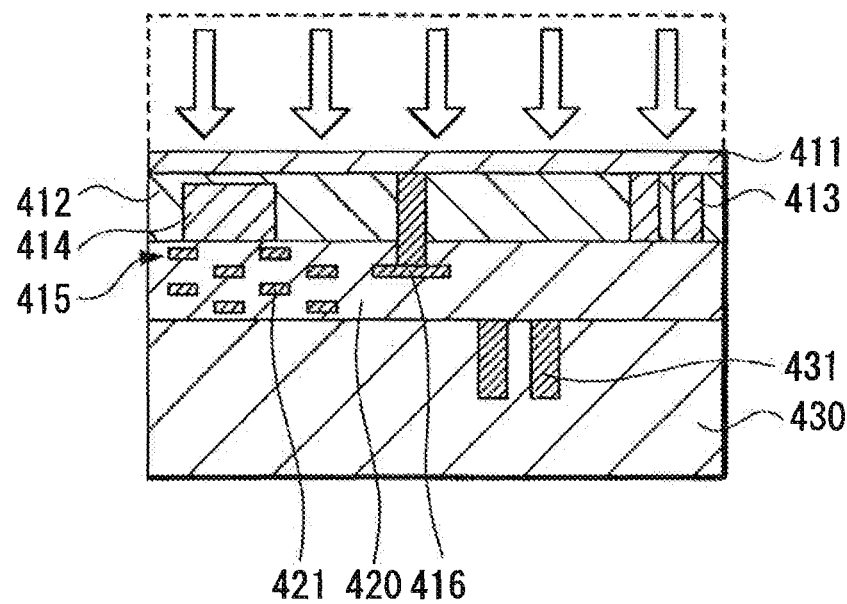
FIGS. 50A and 50B are cross-section diagrams showing a manufacturing process of a back-illuminated type CMOS solid-state imaging device according to the seventeenth exemplified embodiment of the present invention (No. 2 thereof).

Next, as shown in FIG. 50A, the semiconductor substrate 410 is thinned, for example, from the semiconductor substrate 410 side of the SOI substrate until it becomes possible for the photodiode 414 to receive light. For example, the insulation film 411 is made a stopper and it is carried out by mechanical grinding, wet etching or the like from the rear face side of the semiconductor substrate 410 until the insulation film 411 is exposed. Thereby, it becomes a constitution that the semiconductor layer 412 of the SOI substrate is left. It is shown for the drawing such that the up and down relation is made opposite with respect to FIG. 49C.

Figure 50B:
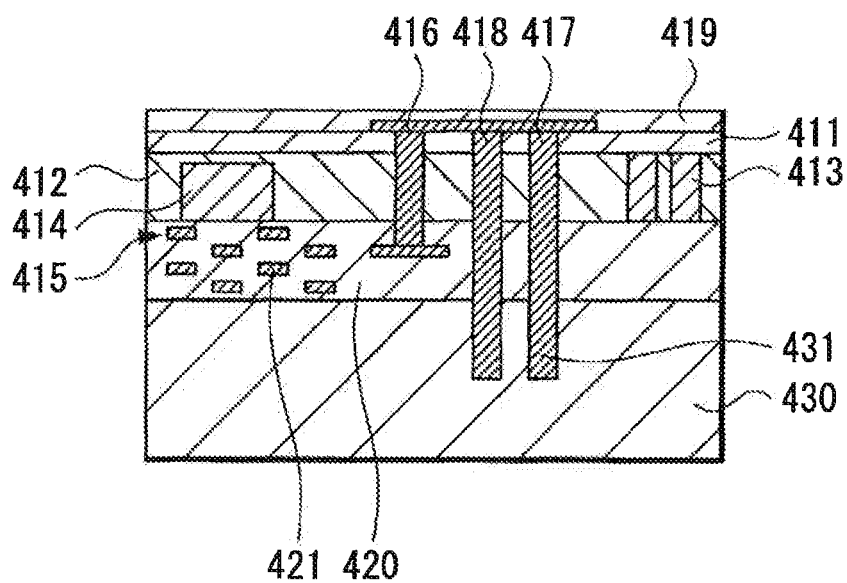

Next, as shown in FIG. 50B, a connection wiring for connecting the support substrate wiring 431 and the buried wiring layer 421 is formed. Specifically, for example, the semiconductor layer penetrating wiring 416 connected with the buried wiring layer 421 through the semiconductor layer 412 is formed. The semiconductor layer and insulation layer penetrating wiring 417 which is connected with the support substrate penetrating wiring 431 through the semiconductor layer 412 and the interlayer insulation layer 420 is formed. The connection wiring 418 for connecting the semiconductor layer penetrating wiring 416 and the semiconductor layer and insulation layer penetrating wiring 417 is formed. Thereafter, the surface insulation film 419 which becomes a protection film is formed.

Figure 51A:
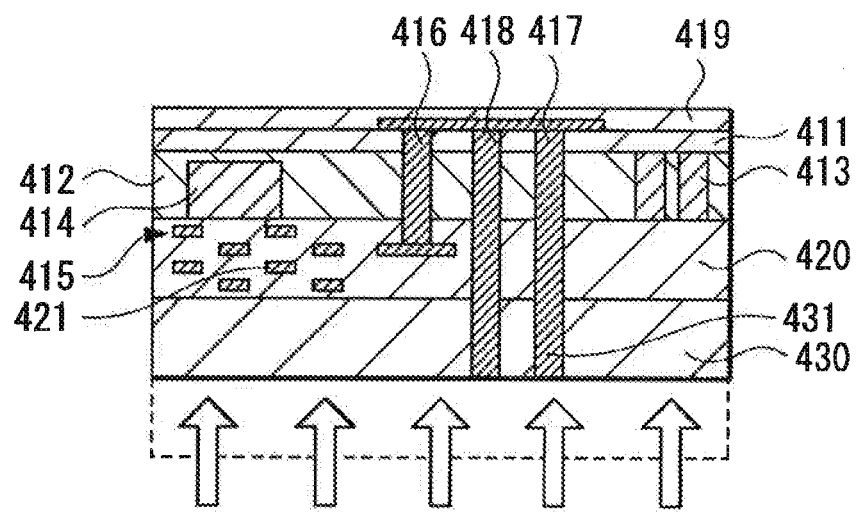
FIGS. 51A and 51B are cross-section diagrams showing a manufacturing process of a back-illuminated type CMOS solid-state imaging device according to the seventeenth exemplified embodiment of the present invention (No. 3 thereof).

Next, as shown in FIG. 51A, the support substrate 430 is thinned from the opposite side of the bonded surface, for example, by mechanical grinding or the like until the support substrate wiring 431 is exposed, and the support substrate wiring 431 is made a support substrate penetrating wiring which passes through the support substrate 430.

Figure 51B:
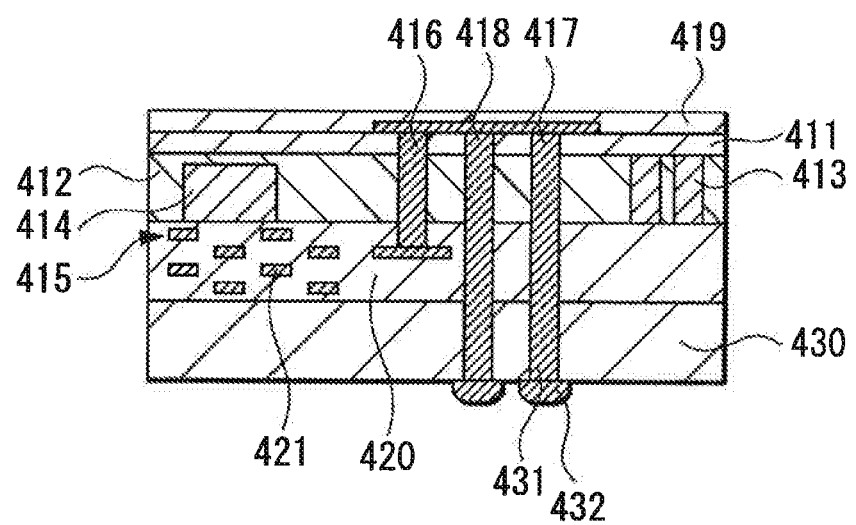
Figure 52:
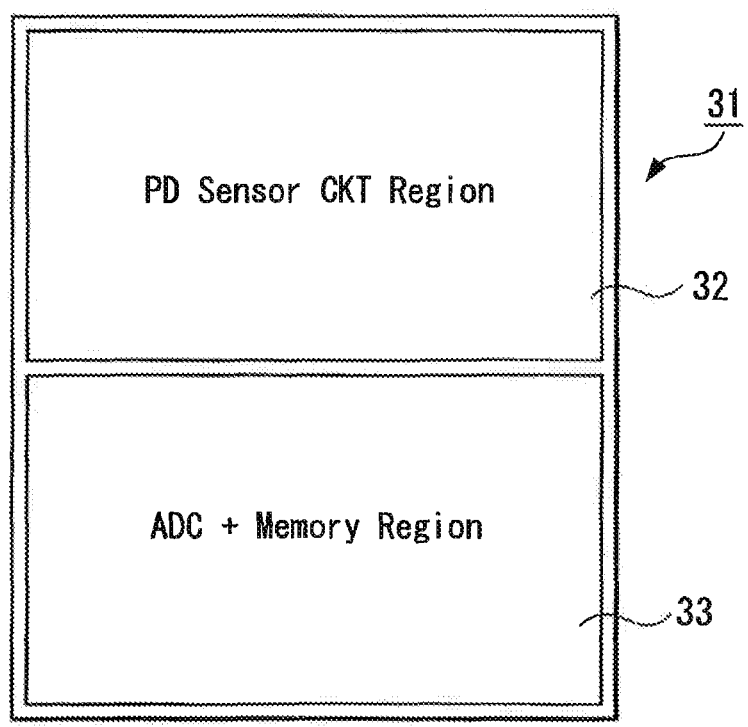
FIG. 52 is an outlined plane layout diagram of a semiconductor image sensor module according to related art.
Figure 53:
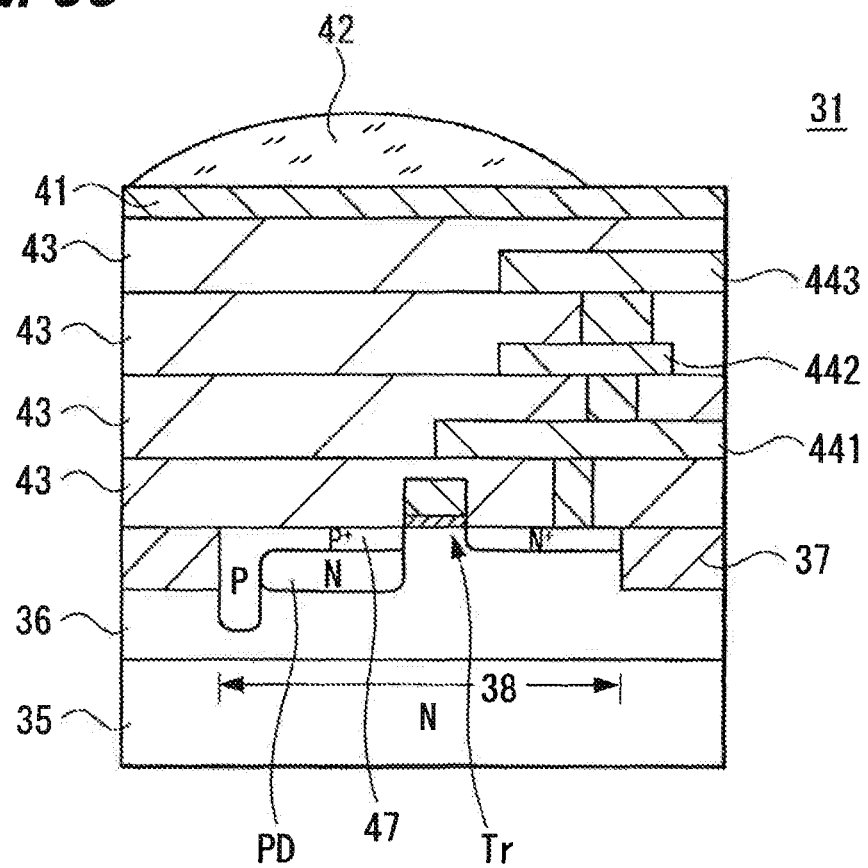
FIG. 53 is a cross-section diagram of a main portion of a front-illuminated type CMOS image sensor.
Figure 54:
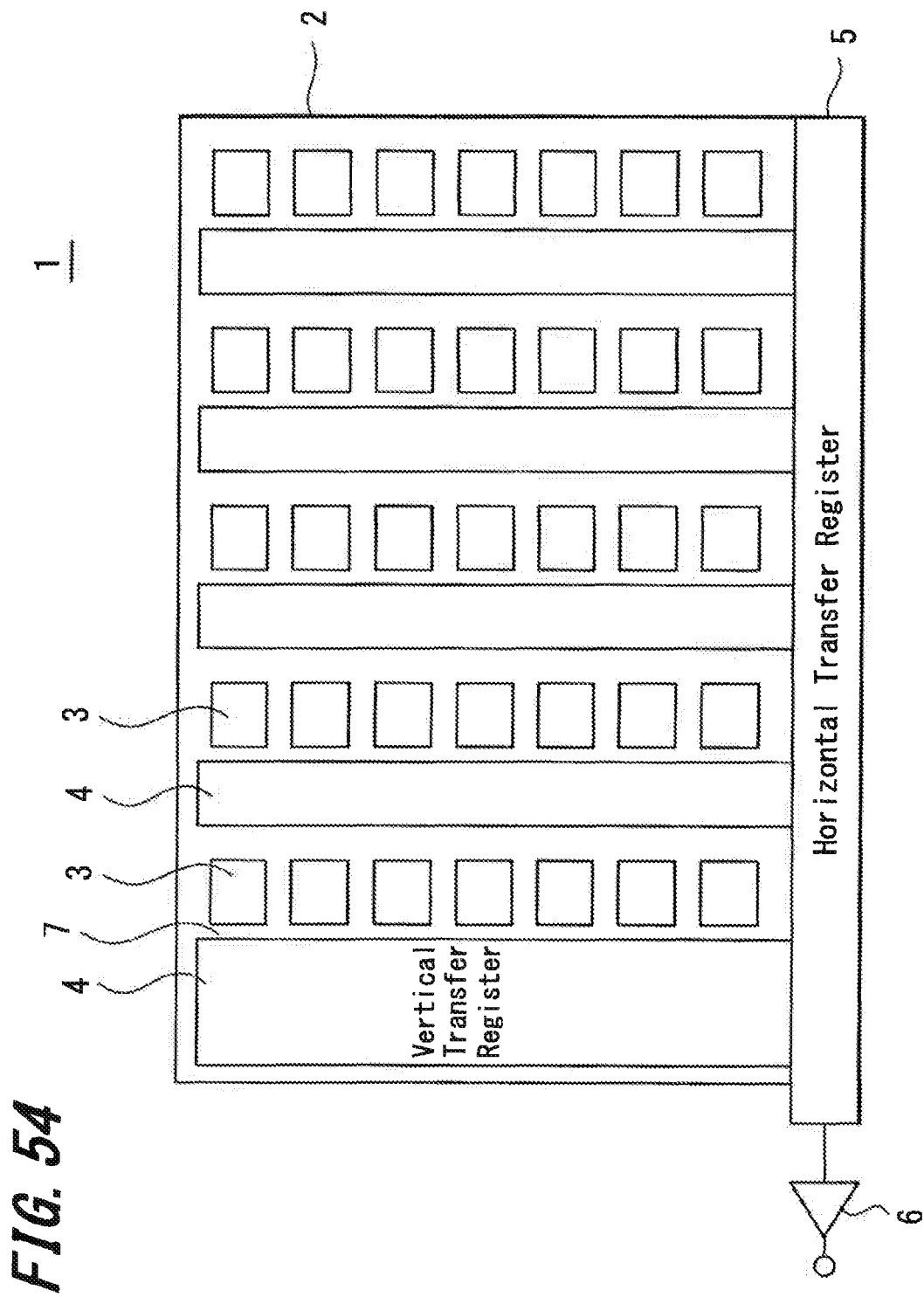
FIG. 54 is an outlined constitution diagram of a CCD image sensor.
Figure 55:
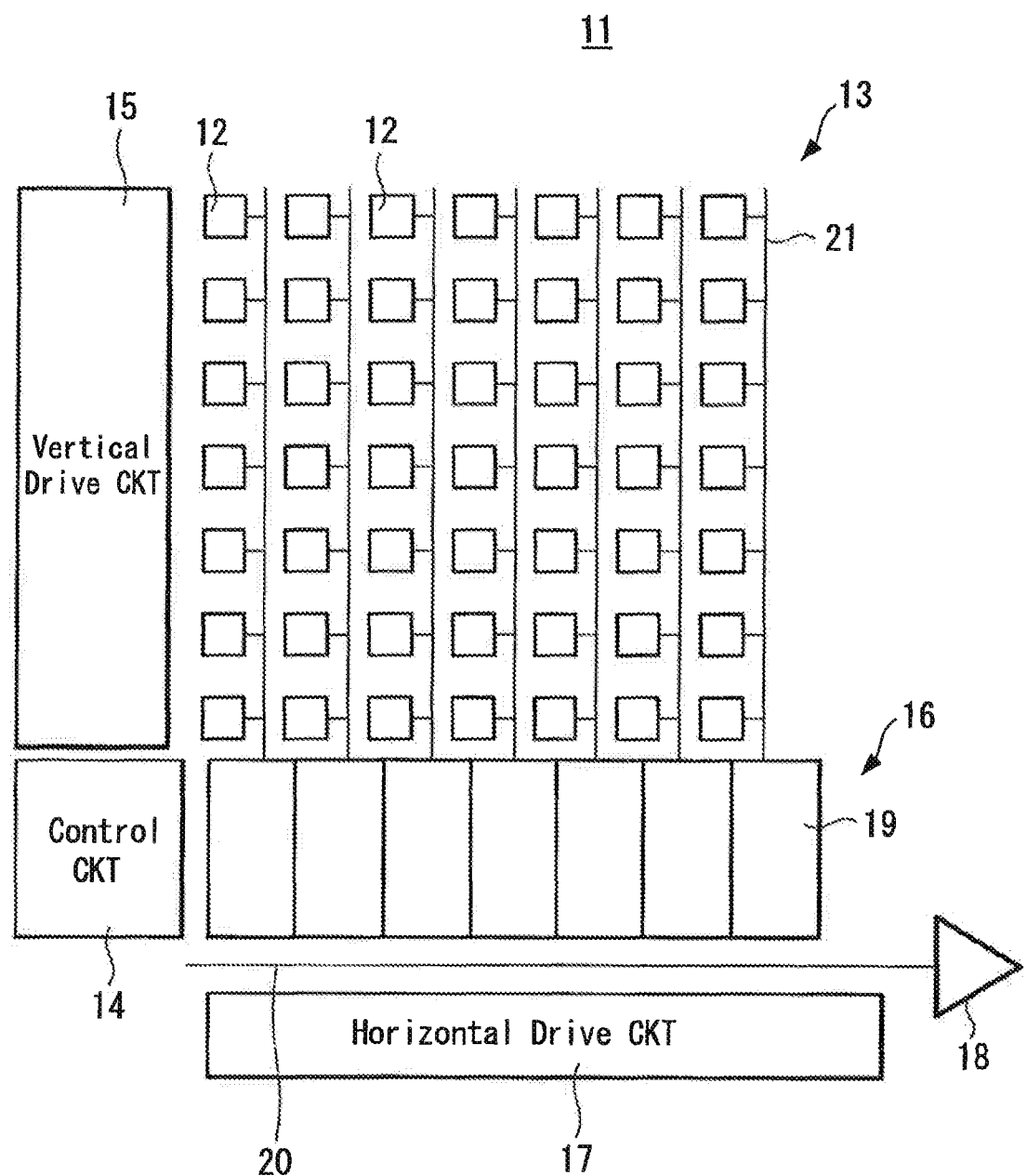
FIG. 55 is an outlined constitution diagram of a CMOS image sensor.
Figure 56A:
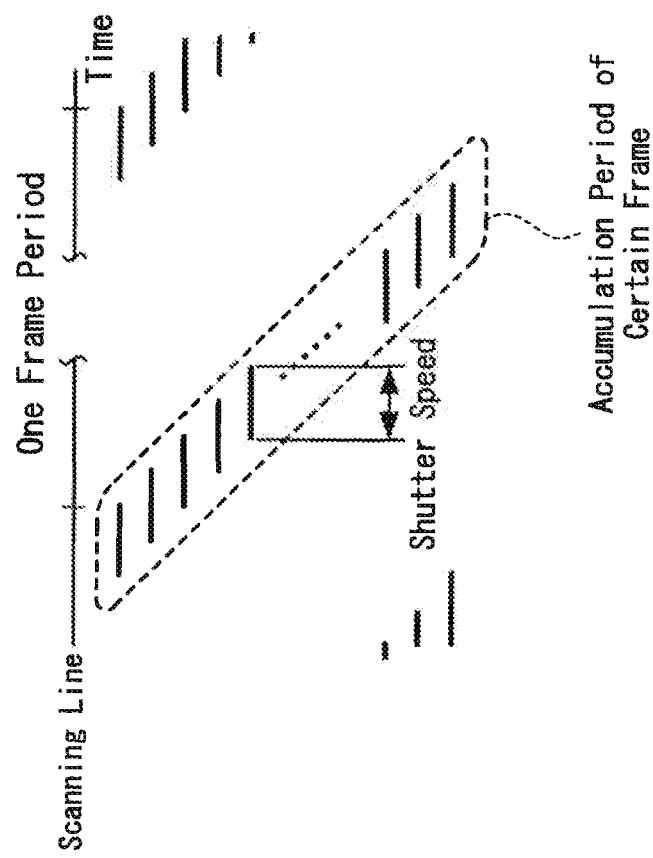
FIGS. 56A and 56B are accumulation timing charts of a CCD image sensor and a CMOS image sensor.
Figure 56B:
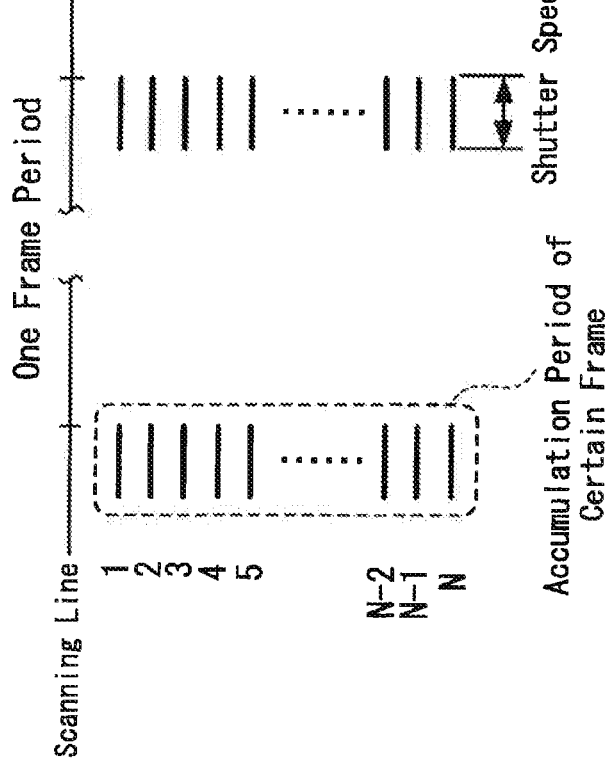
Figure 57A:
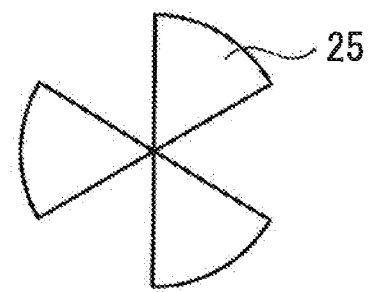
FIGS. 57A and 57B are explanatory diagrams showing recorded picture difference when high-speed imaging was carried out with a CCD image sensor and a CMOS image sensor.
Figure 57B:
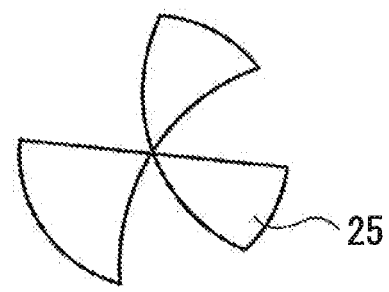

Next, as shown in FIG. 51B, the bumps 432 projecting from the front face of the support substrate 430 are formed on the front face of the support substrate penetrating wiring 431, for example, by a metal plating process or the like. In the manner described above, a back-illuminated type CMOS solid-state imaging device (sensor chip) 401b according to this exemplified embodiment is formed.

The back-illuminated type CMOS solid-state imaging device (sensor chip) 401b formed as mentioned above is mounted by flip chip on the interposer 403 through bumps 432 by facing the light receiving surface side upward. The signal processing chip 402 is similarly mounted by flip chip. Then, the back-illuminated type CMOS solid-state imaging device (sensor chip) 401b and the signal processing chip 402 are connected through the wiring formed in the interposer 403. In the manner described above, it is possible to manufacture an image sensor installing a back-illuminated type CMOS solid-state imaging device according to this exemplified embodiment.

In this exemplified embodiment, the buried wiring formed on the semiconductor substrate and the penetration electrode in the support substrate are not directly connected, but the penetration electrode and the buried wiring are connected by wiring after thinning the rear face of the semiconductor substrate. In this method, it is connected with the signal process device by micro bumps formed on the rear face of the support substrate, so that it is not necessary to carry out wire bonding, and it is possible to make the size small when it is made in one chip.

As described above, according to a manufacturing method of a back-illuminated type CMOS solid-state imaging device according to this exemplified embodiment, the semiconductor substrate is thinned after securing the strength by bonding the support substrate, and also, the penetrating wiring is formed after thinning the support substrate, so that it is possible to conveniently and easily manufacture a back-illuminated type CMOS solid-state imaging device having a constitution that the electrode is taken out from the surface on the opposite side of the illumination surface.

As described above, in the semiconductor image sensor module (that is, CMOS image sensor incorporating the CMOS solid-state imaging device) 401 according to the seventeenth exemplified embodiment, it is possible to input the signal outputted from the pixel to the signal process device directly through micro bumps for each pixel unit or unit of a plurality of pixels. Thereby, it is possible to provide a high functional device that is fast in the signal process speed between the devices and that shows high performance and in which the image sensor and the signal process device are made in one chip. Also, the aperture ratio of the photodiode is improved, the chip utilization is improved, and simultaneous shuttering of all the pixels can be realized. Also, because it is not necessary to be connected with the chip or the wafer by wire bonding, it is possible to reduce the chip size, the yield of the wafer rises, and it is possible to lower the chip cost.

It is possible to form the penetrating wiring in the sixteenth and seventeenth exemplified embodiments described above by Cu, Al, W, WSi, Ti, TiN, silicide or a combination thereof.

The present invention explained using FIG. 42 and FIG. 48 is not limited by the explanation of the aforesaid sixteenth and seventeenth exemplified embodiments. For example, in the aforesaid exemplified embodiments, an SOI substrate is used as a semiconductor substrate, but it is not limited to this, and it is also possible to carry out thinning from the surface of the opposite side of the photodiode or transistor forming surface using an ordinary semiconductor substrate. Also, the bumps formed to be projected from the support substrate can be formed on the whole chip area, and it is allowed to employ a constitution that, for example, independent bumps are formed for each pixel of the CMOS image sensor and are connected with the interposer or the like such that reading out becomes possible for each pixel. In addition, various changes are possible without departing from the scope of the present invention.

The semiconductor image sensor module according to each of the first to seventeenth exemplified embodiments mentioned above is applied to a camera module used, for example, in a digital still camera, a video camera, a mobile phone with a camera or the like. Further, it is applied to an electronic instrument module used in an electronic device or the like.

The above-mentioned semiconductor image sensor has been configured to include a back-illuminated type CMOS image sensor, however, it is also possible otherwise to employ a constitution including a front-illuminated type CMOS image sensor of FIG. 27.

DESCRIPTION OF REFERENCE NUMERALS

1 . . . CCD image sensor, 2 . . . imaging region, 3 . . . light receiving sensor, 4 . . . vertical transfer register, 5 . . . horizontal transfer register, 6 . . . output unit, 7 . . . readout gate unit, 11 . . . CMOS image sensor, 12 . . . pixel, 13 . . . imaging region, 14 . . . control unit, 15 . . . vertical drive circuit, 16 . . . column unit, 17 . . . horizontal drive circuit, 18 . . . output circuit, 19 . . . column signal processing circuit, 20 . . . horizontal signal line
21 . . . vertical signal line, 31 . . . CMOS image sensor, 32 . . . photodiode-sensor circuit region, 33 . . . ADC-memory region, 35 . . . n-type semiconductor substrate, 36 . . . p-type semiconductor well region
37 . . . pixel separation region, 38 . . . unit pixel, 41 . . . color filter, 42 . . . on chip microlens, 43 . . . interlayer insulation film,
441, 442, 443 . . . wiring, 47 . . . p+ semiconductor region, 51, 99, 100 . . . semiconductor image sensor module, 52 . . . first semiconductor chip including an image sensor, 53 . . . second semiconductor chip including an analog/digital converter array, 54 . . . third semiconductor chip including a memory element array, 55 . . . fourth semiconductor chip including an analog type nonvolatile memory array, 56 . . . transistor forming region, 57 . . . photodiode forming region, 61 . . . n-type silicon substrate, 62 . . . pixel separation region, 63 . . . p-type semiconductor well region, 64 . . . source-drain region, 65 . . . gate insulation film, 66 . . . gate electrode, 68a . . . n+ charge accumulation region, 68b . . . n-type semiconductor region, 69 . . . p+ semiconductor region, 71 . . . passivation film, 72 . . . color filter, 73 . . . on chip microlens, 76 . . . interlayer insulation film, 77 . . . multilayer wiring, 78 . . . multilayer wiring layer, 81, 82 . . . pad, 83 . . . micro bump, 84 . . . penetration contact portion, 84, 201 . . . contact portion, 86 . . . pixel array block, 86a . . . pixel, 87 . . . AD converter, 88 . . . memory element sub-array, 89 . . . bits for parity check, 90 . . . redundant bits, 93 . . . sense amplifier, 94X . . . X decoder, 94Y . . . Y decoder, 101 . . . floating gate type nonvolatile memory, 102 . . . semiconductor substrate, 103 . . . source region, 104 . . . drain region, 105 . . . floating gate, 106 . . . control gate, 111 . . . MONOS type nonvolatile memory, 112 . . . semiconductor substrate, 113 . . . source region, 114 . . . drain region, 115 . . . tunnel oxide film, 116 . . . Si3N4 charge trap layer, 117 . . . trap oxide film, 118 . . . gate polyelectrode, 121 . . . pixel array, 122 . . . A/D converter array
123 . . . memory array, 124 . . . digital signal processing device
125 . . . control circuit, 130 . . . memory cell circuit, 131 . . . memory capacitor, 132 . . . switch for writing, 133 . . . writing dummy switch, 134 . . . D-type flip flop for writing, 135 . . . switch for readout, 136 . . . D-type flip flop for readout, 141 . . . p-type semiconductor substrate, 142 . . . element separation region, 143 . . . n-type source region, 144 . . . n-type drain region, 145 . . . gate electrode, 146 . . . p-type region, 147 . . . n-type semiconductor well region, 148 . . . p-type source region, 149 . . . p-type drain region, 150 . . . gate electrode, 151 . . . n-type region,
153 . . . first electrode, 154 . . . dielectric film, 155 . . . second electrode
156 . . . interlayer insulation film, 157 . . . conductive plug, 158 . . . wiring, 161 . . . analog memory cell, 162 . . . writing control signal input line, 163 . . . readout control signal input line, 164 . . . pixel array block, 165 . . . A/D converter, 170 . . . wiring layer, 172 . . . silicon substrate, 173 . . . element separation region,
174, 175, 176 . . . source-drain region, 177, 178 . . . word line, 179 . . . conductive plug, 180 . . . bit line, 181 . . . sense line, 182, 183 . . . resistance-changing type multivalued memory element, 184 . . . memory material, 185, 186 . . . Pt electrode
166, 167, 168, 169, 187, 188, 189, 190 . . . semiconductor image sensor module, 193 . . . second semiconductor chip, 196 . . . first semiconductor chip, 197 . . . second semiconductor chip, 191, 192, 194, 198, 199 . . . semiconductor image sensor module, 200, 261, 300 . . . semiconductor image sensor module, 210 . . . photodiode, 212 . . . transfer transistor, 214 . . . amplifier transistor
220 . . . reset transistor, 262 . . . semiconductor chip
263 (263A, 263B) . . . pixel, 264 . . . imaging region, 265, 266 . . . peripheral circuit, 311 . . . unit pixel, 312 . . . pixel array unit, 313 . . . line or unit pixel scanning circuit, 314 . . . column or unit pixel processing unit, 315 . . . reference voltage supply unit, 316 . . . column or unit pixel scanning circuit, 317 . . . horizontal output line, 318 . . . timing control circuit, 319 . . . chip, 356 . . . transistor forming region, 400 . . . semiconductor image sensor module, 401a, 402b . . . sensor chip, 402 . . . signal processing chip, 403 . . . interposer, 410 . . . semiconductor substrate, 411 . . . (surface) insulation film, 412 . . . semiconductor layer, 413 . . . electrode for testing, 414 . . . photodiode (photoelectric conversion element), 415 . . . transistor, 416 . . . semiconductor layer penetrating electrode, 417 . . . semiconductor layer and insulation layer penetrating wiring, 418 . . . connection wiring, 419 . . . surface insulation film, 420 . . . interlayer insulation layer, 421 . . . buried wiring, 430 . . . support substrate, 431 . . . support substrate penetrating wiring (support substrate wiring), 432 . . . bump (protrusion electrode), 440 . . . wiring, 441 . . . insulation layer, 442 . . . wire bonding, 512 . . . imaging pixel unit, 514 . . . V selection means, 516 . . . H selection means, 518 . . . timing generator (TG), 520 . . . S/H & CDS circuit unit, 522 . . . AGC unit, 524 . . . A/D conversion unit, 526 . . . digital amplifier unit, 600 . . . photodiode (PD), 610 . . . floating diffusion portion (FD portion), 620 . . . transfer transistor, 630 . . . reset transistor, 640 . . . amplifier transistor, 650 . . . address transistor, 660 . . . vertical signal line, 660, 670 . . . constant current source

The invention claimed is:

1. An image sensor comprising:
a first semiconductor chip having an image sensor including pixels, each of the pixels including a photoelectric conversion element and transistors; and
a second semiconductor chip including analog/digital converters,
wherein the first semiconductor chip and the second semiconductor chip are stacked and electrically connected to each other.

2. The image sensor according to claim 1, further comprising a third semiconductor chip including memory elements, a decoder and a sense amplifier, the third semiconductor chip being stacked with the first and second semiconductor chips.

3. The image sensor according to claim 2, wherein the first, second and third semiconductor chips are arranged such that a plurality of the photoelectric conversion elements and a plurality of the memory elements share one of the analog/digital converters.

4. The image sensor module according to claim 3, wherein the memory elements are volatile memories.

5. The image sensor module according to claim 3, wherein the memory elements are floating gate type nonvolatile memories.

6. The image sensor module according to claim 3, wherein the memory elements are MONOS type nonvolatile memories.

7. The image sensor module according to claim 3, wherein the memory elements are multivalued nonvolatile memories.

8. The image sensor module according to claim 2, wherein a memory bit for parity check is included in a memory element array of the memory elements.

9. The semiconductor image sensor module according to claim 2, wherein a spare bit for relieving a defect is included in a memory element array of the memory elements.

* * * * *